US006929895B2

(12) United States Patent
Maemoto et al.

(10) Patent No.: US 6,929,895 B2
(45) Date of Patent: Aug. 16, 2005

(54) LITHOGRAPHIC PRINTING PLATE PRECURSOR

(75) Inventors: Kazuo Maemoto, Shizuoka (JP); Hisashi Hotta, Shizuoka (JP)

(73) Assignee: Fuji Photo Film Co., Ltd., Ashigara (JP)

( * ) Notice: Subject to any disclaimer, the term of this patent is extended or adjusted under 35 U.S.C. 154(b) by 144 days.

(21) Appl. No.: 10/200,447

(22) Filed: Jul. 23, 2002

(65) Prior Publication Data

US 2003/0148207 A1 Aug. 7, 2003

(30) Foreign Application Priority Data

Jul. 23, 2001 (JP) .................................... P.2001-221802
Jul. 23, 2001 (JP) .................................... P.2001-221803
Aug. 27, 2001 (JP) .................................... P.2001-256331

(51) Int. Cl.[7] ............................ G03F 7/004; G03F 7/09

(52) U.S. Cl. ................. 430/138; 430/270.1; 430/271.1; 430/273.1; 430/275.1; 430/276.1; 430/278.1; 430/281.1; 430/944; 430/945; 101/454; 101/457; 101/458

(58) Field of Search ............................. 430/138, 270.1, 430/271.1, 273.1, 275.1, 276.1, 278.1, 281.1, 944, 945, 964; 101/454, 457, 458

(56) References Cited

U.S. PATENT DOCUMENTS

| | | | | |
|---|---|---|---|---|
| 4,576,686 | A | 3/1986 | Hirokazu et al. | |
| 4,746,591 | A | 5/1988 | Sakaki et al. | |
| 5,074,976 | A | 12/1991 | Uesugi et al. | |
| 6,024,858 | A | 2/2000 | Nishino et al. | |
| 6,077,641 | A | 6/2000 | Parsons et al. | |
| 6,136,425 | A | 10/2000 | Akiyama et al. | |
| 6,207,348 | B1 | 3/2001 | Deboer et al. | |
| 2002/0039702 | A1 * | 4/2002 | Hotta | 430/273.1 |
| 2002/0136985 | A1 * | 9/2002 | Kitteridge | 430/276.1 |
| 2003/0031860 | A1 * | 2/2003 | Hotta et al. | 428/336 |
| 2003/0165768 | A1 * | 9/2003 | Hotta et al. | 430/146 |

FOREIGN PATENT DOCUMENTS

| | | | | |
|---|---|---|---|---|
| EP | 0 816 070 | A1 | 1/1998 | |
| EP | 1 078 736 | A1 | 2/2001 | |
| EP | 1 084 826 | A1 | 3/2001 | |
| EP | 1 110 719 | A2 | 6/2001 | |
| EP | 1 142 708 | A1 | 10/2001 | |
| EP | 1 216 831 | A1 | 6/2002 | |
| EP | 1 219 464 | A2 | 7/2002 | |
| EP | 1 247 644 | A2 | 10/2002 | |
| EP | 1 279 520 | A1 * | 1/2003 | B41N/3/03 |
| JP | 2938397 | B2 | 10/1996 | |
| WO | WO 98/51496 | A1 | 11/1998 | |

OTHER PUBLICATIONS

Yokoya, "Computer–to–Plate by Laser Ablation Technology", *Journal of Japan Printing Society*, 1999, pp. 148–163, vol. 36 (English abstract).

* cited by examiner

*Primary Examiner*—Barbara L. Gilliam
(74) *Attorney, Agent, or Firm*—Burns, Doane, Swecker & Mathis, L.L.P.

(57) ABSTRACT

A lithographic printing plate precursor comprising an aluminum substrate, an image-recording layer and a hydrophilic film, the aluminum substrate being subjected to an electrochemical surface-roughening treatment in an aqueous solution comprising hydrochloric acid and provided with the hydrophilic film having a heat conductivity of 0.05 to 0.5 W/mK and/or at least one of a density of 1,000 to 3,200 $kg/m^3$ and a porosity of 20 to 70%; and a lithographic printing plate precursor comprising an aluminum substrate, an image-recording layer and a hydrophilic film, the aluminum substrate having a surface-roughened shape comprising a small pit wherein an average opening size of the small pit is 0.01 to 3 $\mu m$ and a ratio of an average depth of the small pit to the average opening size is 0.1 to 0.5, and being provided with the hydrophilic film having a heat conductivity of 0.05 to 0.5 W/mK and/or at least one of a density of 1,000 to 3,200 $kg/m^3$ and a porosity of 20 to 70%.

23 Claims, 2 Drawing Sheets

LITHOGRAPHIC PRINTING PLATE PRECURSOR

FIELD OF THE INVENTION

The present invention relates to a lithographic printing plate precursor for computer-to-plate (CTP) system, which can dispense with development. More specifically, the present invention relates to a heat-sensitive lithographic printing plate precursor which can record an image by scan exposure with infrared ray based on digital signals and after the image recording, can be fixed on a press as it is and used for printing without passing through a development step using a liquid as in conventional techniques.

BACKGROUND OF THE INVENTION

Conventionally, a lithographic printing plate has been manufactured in a system of exposing the printing plate precursor through a lith film as an intermediate material. However, with recent rapid progress of digitization in the printing field, the system for the manufacture of a printing plate is changing into a CTP system where digital data input and edited in a computer is directly output on a printing plate precursor. Among these techniques, with an attempt to more streamline the process, a lithographic printing plate precursor which can be fixed on a press as it is after exposure without passing through a development processing and used for printing is being studied and developed. Various methods for obtaining a CTP printing plate capable of dispensing with development are described, for example, in *Nippon Insatsu Gakkai Shi* (*Journal of Japan Printing Society*), Vol. 36, pp. 148–163 (1999).

As one of the methods for dispensing with the processing step, a method called on-press development is known, where an exposed printing plate precursor is fixed on a plate cylinder of a press, and a fountain solution and an ink are supplied while rotating the plate cylinder, thereby removing the non-image area of the image-recording layer of the printing plate precursor. Namely, this is a system of fixing a printing plate precursor as it is on a press after exposure and completing the development processing during the normal operation of initiating the printing. The lithographic printing plate precursor suitable for such on-press development is required to have an image-recording layer soluble in a fountain solution or an ink solvent and moreover, to have a bright room handling aptitude of not causing fogging due to visible light even if developed on a press installed in a bright room.

For example, Japanese Patent 2,938,397 describes a lithographic printing plate precursor where a photosensitive layer comprising a hydrophilic resin having dispersed therein thermoplastic hydrophobic polymer fine particles is provided on a hydrophilic support. In this patent publication, it is stated that the on-press development can be performed by exposing the lithographic printing plate precursor with an infrared laser to cause combination (fusion) of the thermoplastic hydrophobic polymer fine particles due to heat and thereby form an image, then fixing the plate on a plate cylinder of a press, and supplying a fountain solution and/or an ink. This lithographic printing plate precursor also has bright room handling aptitude because the photosensitive region thereof is in the infrared region. However, such a lithographic printing plate precursor having an image-recording layer comprising a hydrophilic binder resin having dispersed therein hydrophobic polymer fine particles has a problem in that when exposed with an infrared laser having high energy, in addition to the image formation by the combination of fine particles, the image-recording layer partially undergoes ablation and the quality as a printing plate deteriorates.

To solve this problem, EP-816070 describes a technique where an image-recording layer comprising a hydrophilic binder having dispersed therein a hydrophobic thermoplastic polymer particle and a light-to-heat (photothermal) converting agent is provided on a hydrophilic support and further thereon, a water-soluble or water-swellable protective layer comprising a hydrophilic resin is provided to prevent the ablation.

Also, WO98/51496 describes a lithographic printing plate precursor which is exposed, developed with an aqueous alkali solution or the like and then fixed on a press, where the ablation can be effectively prevented by providing two image-recording layers each comprising an aqueous solution-soluble or swellable binder having dispersed therein fine particles, and setting the optical density of the upper layer at the exposure wavelength to be lower than that of the lower layer.

The lithographic printing plate precursor according to Japanese Patent 2,938,397 has a problem in that at the time of coating and drying the image-recording layer, the resin fine particles are fused to cause fogging. If the drying is performed at a low temperature over a long time so as to prevent the fusion of resin fine particles at the coating and drying, the production efficiency decreases and this means is not practicable. Also, means of using a particle adhesion inhibitor such as water-soluble resin disadvantageously causes deterioration in the inking property. JP-A-2000-141933 (the term “JP-A” as used herein means an “unexamined published Japanese patent application”) describes an image-forming material capable of on-press development, which has a layer containing high molecular polymer fine particles having two or more peaks in the particle size distribution, and states that those problems can be solved by this material.

JP-A-2000-221667 describes an image-forming material capable of on-press development, which has an image-recording layer containing two or more kinds of polymer fine particles different in the minimum film formation temperature, and states that the problems in the image strength, deterioration of impression capability and stable supply of fountain solution, encountered in conventional on-press lithographic printing plate precursors, can be overcome, as a result, a stable printing quality can be obtained.

JP-A-9-127683 describes a printing plate which can be produced by the on-press development using a self water-dispersible resin particle. This printing plate is advantageous in that since the non-fused resin particle has high hydrophilicity, the resin particle in the non-image area readily releases from the substrate surface and the non-image area is reduced in the ink staining.

SUMMARY OF THE INVENTION

In a lithographic printing plate precursors having an image-recording layer, if a metal substrate preferred in view of dimensional stability is used, the sensitivity is low due to escape of heat to the metal substrate, the image strength is weak due to insufficient fusion of fine particles and therefore, a high printing durability cannot be obtained. For preventing the diffusion of heat to the metal substrate, a method of providing an organic resin on the metal substrate is proposed. According to this method, high sensitivity may be attained, however, printing staining is disadvantageously caused.

The object of the present invention is to provide a lithographic printing plate precursor succeeded in overcoming the above-described defects of conventional techniques. More specifically, the object of the present invention is to provide a heat-sensitive lithographic printing plate precursor having good on-press developability, high sensitivity, high printing durability and good difficulty of staining at printing, such as ink cleaning property.

(1) The image-recording layer containing at least two kinds of fine polymers selected from (a) a heat-fusible polymer fine particle, (b) a polymer fine particle having a heat-reactive functional group and (c) a microcapsule containing therein a heat-reactive compound, and (2) an image-recording layer containing a self water-dispersible resin fine particle of undergoing combination by heat are effective, but not perfectly sufficient.

As a result of extensive investigations, the present inventors have found that when a substrate obtained by surface-roughening an aluminum plate and providing thereon a hydrophilic film having a physical property such as heat conductivity or density in a specific range is used, the aluminum substrate can be improved in the heat insulating property while maintaining good difficulty of staining at printing. This provides an effect that the diffusion of heat to the aluminum substrate is inhibited, the sensitivity and the efficiency in combination of fine particles by heat are elevated, the image strength and the printing durability are enhanced, and good on-press developability and good difficulty of staining at printing are maintained. Thus, the above-described object of the present invention can be attained. That is, the present invention provides the following items 1 to 45 wherein items 5 to 16 relate to a first embodiment of the invention, items 17 to 31 relate to a second embodiment of the invention, and items 32 to 45 relate to a third embodiment of the invention.

1. A lithographic printing plate precursor comprising an aluminum substrate, an image-recording layer and a hydrophilic film, the aluminum substrate being subjected to an electrochemical surface-roughening treatment in an aqueous solution comprising hydrochloric acid and provided with the hydrophilic film having a heat conductivity of 0.05 to 0.5 W/mK.

2. A lithographic printing plate precursor comprising an aluminum substrate, an image-recording layer and a hydrophilic film, the aluminum substrate being subjected to an electrochemical surface-roughening treatment in an aqueous solution comprising hydrochloric acid and provided with the hydrophilic film having at least one of a density of 1,000 to 3,200 $kg/m^3$ and a porosity of 20 to 70%.

3. A lithographic printing plate precursor comprising an aluminum substrate, an image-recording layer and a hydrophilic film, the aluminum substrate having a surface-roughened shape comprising a small pit wherein an average opening size of the small pit is 0.01 to 3 $\mu$m and a ratio of an average depth of the small pit to the average opening size is 0.1 to 0.5, and being provided with the hydrophilic film having a heat conductivity of 0.05 to 0.5 W/mK.

4. A lithographic printing plate precursor comprising an aluminum substrate, an image-recording layer and a hydrophilic film, the aluminum substrate having a surface-roughened shape comprising a small pit wherein an average opening size of the small pit is 0.01 to 3 $\mu$m and a ratio of an average depth of the small pit to the average opening size is 0.1 to 0.5, and being provided with the hydrophilic film having at least one of a density of 1,000 to 3,200 $kg/m^3$ and a porosity of 20 to 70%.

5. A lithographic printing plate precursor comprising an aluminum substrate having thereon a lipophilic image-recording layer and further thereon an overcoat layer, the aluminum substrate being subjected to a surface-roughening treatment and having a hydrophilic film, the lipophilic image-recording layer containing no hydrophilic binder resin and containing a hydrophobic polymer fine particle undergoing combination by heat, a light-to-heat converting agent and a water-insoluble compound having fluidity at 50° C., and the overcoat layer containing a water-soluble resin.

6. The lithographic printing plate precursor as described in 5 above, wherein the overcoat layer contains at least one fine particle selected from a hydrophobic polymer fine particle of undergoing combination by heat and a microcapsule.

7. The lithographic printing plate precursor as described in 5 or 6 above, wherein the overcoat layer contains a light-to-heat converting agent and the optical density of the overcoat layer at the exposure wavelength is lower than the optical density of the image-recording layer at the exposure wavelength.

8. The lithographic printing plate precursor as described in any one of 5 to 7 above, wherein the substrate is subjected to an electrochemical surface-roughening treatment in an aqueous solution containing hydrochloric acid and has a hydrophilic film having a heat conductivity of 0.05 to 0.5 W/mK.

9. The lithographic printing plate precursor as described in any one of 5 to 7 above, wherein the substrate is subjected to an electrochemical surface-roughening treatment in an aqueous solution containing hydrochloric acid and has a hydrophilic film having a density of 1,000 to 3,200 $kg/m^2$ or a porosity of 20 to 70%.

10. The lithographic printing plate precursor as described in any one of 5 to 7 above, wherein the substrate has a surface-roughened shape such that the average opening size of small pits is 0.01 to 3 $\mu$m and the ratio of the average depth of small pits to the average opening size is 0.1 to 0.5, and has a hydrophilic film having a heat conductivity of 0.05 to 0.5 W/mK.

11. The lithographic printing plate precursor as described in any one of 5 to 7 above, wherein the substrate has a surface-roughened shape such that the average opening size of small pits is 0.01 to 3 $\mu$m and the ratio of the average depth of small pits to the average opening size is 0.1 to 0.5, and has a hydrophilic film having a density of 1,000 to 3,200 $kg/m^2$ or a porosity of 20 to 70%.

12. The lithographic printing plate precursor as described in any one of 5 to 7 above, wherein the average opening size of large waves of the substrate is from 3 to 20 $\mu$m.

13. The lithographic printing plate precursor as described in any one of 5 to 12 above, wherein the hydrophilic film is an anodic oxide film.

14. The lithographic printing plate precursor as described in 13 above, wherein the amount of the anodic oxide film is 3.2 $g/m^2$ or more.

15. The lithographic printing plate precursor as described in 13 or 14 above, wherein the pore size in the surface layer of the anodic oxide film is 40 nm or less.

16. The lithographic printing plate precursor as described in any one of 13 to 15 above, wherein the anodic oxide film is subjected to a sealing treatment.

17. A lithographic printing plate precursor comprising an aluminum substrate having thereon an image-recording layer containing at least two kinds of fine particles selected from (a) a heat-fusible polymer fine particle, (b) a polymer fine particle having a heat-reactive functional group and (c) a microcapsule containing therein a heat-reactive compound, the aluminum substrate being subjected to an electrochemical surface-roughening treatment in an aqueous solution containing hydrochloric acid and provided with a hydrophilic film having a heat conductivity of 0.05 to 0.5 W/mK, wherein at least one kind of the fine particle undergoes combination by heat to form an image.

18. A lithographic printing plate precursor comprising an aluminum substrate having thereon an image-recording layer containing at least two kinds of fine particles selected from (a) a heat-fusible polymer fine particle, (b) a polymer fine particle having a heat-reactive functional group and (c) a microcapsule containing therein a heat-reactive compound, the aluminum substrate being subjected to an electrochemical surface-roughening treatment in an aqueous solution containing hydrochloric acid and provided with a hydrophilic film having a density of 1,000 to 3,200 $kg/m^3$ and/or a porosity of 20 to 70%, wherein at least one kind of the fine particle undergoes combination by heat to form an image.

19. A lithographic printing plate precursor comprising an aluminum substrate having thereon an image-recording layer containing at least two kinds of fine particles selected from (a) a heat-fusible polymer fine particle, (b) a polymer fine particle having a heat-reactive functional group and (c) a microcapsule containing therein a heat-reactive compound, the aluminum substrate having a surface-roughened shape such that the average opening size of small pits is 0.01 to 3 $\mu$m and the ratio of the average depth of small pits to the average opening size is 0.1 to 0.5, and being provided with a hydrophilic film having a heat conductivity of 0.05 to 0.5 W/mK, wherein at least one kind of the fine particle undergoes combination by heat to form an image.

20. A lithographic printing plate precursor comprising an aluminum substrate having thereon an image-recording layer containing at least two kinds of fine particles selected from (a) a heat-fusible polymer fine particle, (b) a polymer fine particle having a heat-reactive functional group and (c) a microcapsule containing therein a heat-reactive compound, the aluminum substrate having a surface-roughened shape such that the average opening size of small pits is 0.01 to 3 $\mu$m and the ratio of the average depth of small pits to the average opening size is 0.1 to 0.5, and being provided with a hydrophilic film having a density of 1,000 to 3,200 $kg/m^2$ and/or a porosity of 20 to 70%, wherein at least one kind of the fine particle undergoes combination by heat to form an image.

21. The lithographic printing plate precursor as described in any one of 17 to 20 above, wherein the average opening size of large waves of the aluminum substrate is from 3 to 20 $\mu$m.

22. The lithographic printing plate precursor as described in any one of 17 to 21 above, wherein the hydrophilic film is an anodic oxide film.

23. The lithographic printing plate precursor as described in 22 above, wherein the amount of the anodic oxide film is 3.2 $g/m^2$ or more.

24. The lithographic printing plate precursor as described in 22 or 23 above, wherein the pore size in the surface layer of the anodic oxide film is 40 nm or less.

25. The lithographic printing plate precursor as described in any one of 22 to 24 above, wherein the anodic oxide film is subjected to a sealing treatment.

26. The lithographic printing plate precursor as described in any one of 22 to 25 above, wherein a layer comprising particles having an average particle size of 8 to 800 nm is provided on the anodic oxide film.

27. The lithographic printing plate precursor as described in any one of 22 to 26 above, wherein the anodic oxide film is formed by an anodization treatment in two or more stages.

28. The lithographic printing plate precursor as described in 27 above, wherein the anodization in the first stage is performed in an electrolytic solution containing sulfuric acid and the anodization in the second or subsequent stage is performed in an electrolytic solution containing phosphoric acid.

29. The lithographic printing plate precursor as described in any one of 17 to 28 above, wherein the image-recording layer contains a light-to-heat converting agent.

30. The lithographic printing plate precursor as described in 29 above, wherein the light-to-heat converting agent is contained in at least one fine particle selected from (a) a heat-fusible polymer fine particle, (b) a polymer fine particle having a heat-reactive functional group and (c) a microcapsule containing therein a heat-reactive compound.

31. The lithographic printing plate precursor as described in any one of 17 to 30 above, wherein the fine particle contained in the image-recording layer is a fine particle selected from a polymer fine particle having a heat-reactive functional group and a microcapsule containing therein a heat-reactive compound.

32. A lithographic printing plate precursor comprising an aluminum substrate having thereon an image-recording layer containing a self water-dispersible resin fine particle of undergoing combination by heat and being writable by infrared laser exposure, the aluminum substrate being subjected to an electrochemical surface-roughening treatment in an aqueous solution containing hydrochloric acid and provided with a hydrophilic film having a heat conductivity of 0.05 to 0.5 W/mK.

33. A lithographic printing plate precursor comprising an aluminum substrate having thereon an image-recording layer containing a self water-dispersible resin fine particle of undergoing combination by heat and being writable by infrared laser exposure, the aluminum substrate being subjected to an electrochemical surface-roughening treatment in an aqueous solution containing hydrochloric acid and provided with a hydrophilic film having a density of 1,000 to 3,200 $kg/m^3$ and/or a porosity of 20 to 70%.

34. A lithographic printing plate precursor comprising an aluminum substrate having thereon an image-recording layer containing a self water-dispersible resin fine particle of undergoing combination by heat and being writable by infrared laser exposure, the aluminum substrate having a surface-roughened shape such that the average opening size of small pits is 0.01 to 3 $\mu$m and the ratio of the average depth of small pits to the average opening size is 0.1 to 0.5, and being provided with a hydrophilic film having a heat conductivity of 0.05 to 0.5 W/mK.

35. A lithographic printing plate precursor comprising an aluminum substrate having thereon an image-recording layer containing a self water-dispersible resin fine particle undergoing combination by heat and being writable by infrared laser exposure, the aluminum substrate having a surface-roughened shape such that the average opening size of small pits is 0.01 to 3 $\mu$m and the ratio of the average depth of small pits to the average opening size is 0.1 to 0.5, and being provided with a hydrophilic film having a density of 1,000 to 3,200 $kg/m^2$ and/or a porosity of 20 to 70%.

36. The lithographic printing plate precursor as described in any one of 32 to 35 above, wherein the average opening size of large waves of the aluminum substrate is from 3 to 20 $\mu$m.

37. The lithographic printing plate precursor as described in any one of 32 to 36 above, wherein the hydrophilic film is an anodic oxide film.

38. The lithographic printing plate precursor as described in 37 above, wherein the amount of the anodic oxide film is 3.2 $g/m^2$ or more.

39. The lithographic printing plate precursor as described in 37 or 38 above, wherein the pore size in the surface layer of the anodic oxide film is 40 nm or less.

40. The lithographic printing plate precursor as described in any one of 37 to 39 above, wherein the anodic oxide film is subjected to a sealing treatment.

41. The lithographic printing plate precursor as described in any one of 37 to 40 above, wherein a layer comprising particles having an average particle size of 8 to 800 nm is provided on the anodic oxide film.

42. The lithographic printing plate precursor as described in any one of 37 to 41 above, wherein the anodic oxide film is formed by an anodization treatment in two or more stages.

43. The lithographic printing plate precursor as described in 42 above, wherein the anodization in the first stage is performed in an electrolytic solution containing sulfuric acid and the anodization in the second or subsequent stage is performed in an electrolytic solution containing phosphoric acid.

44. The lithographic printing plate precursor as described in any one of 32 to 43 above, wherein the image-recording layer contains a light-to-heat converting agent.

45. The lithographic printing plate precursor as described in 44 above, wherein the light-to-heat converting agent is contained in the self water-dispersible resin fine particle undergoing combination by heat.

DESCRIPTION OF NUMERICAL REFERENCES

Figure 1:
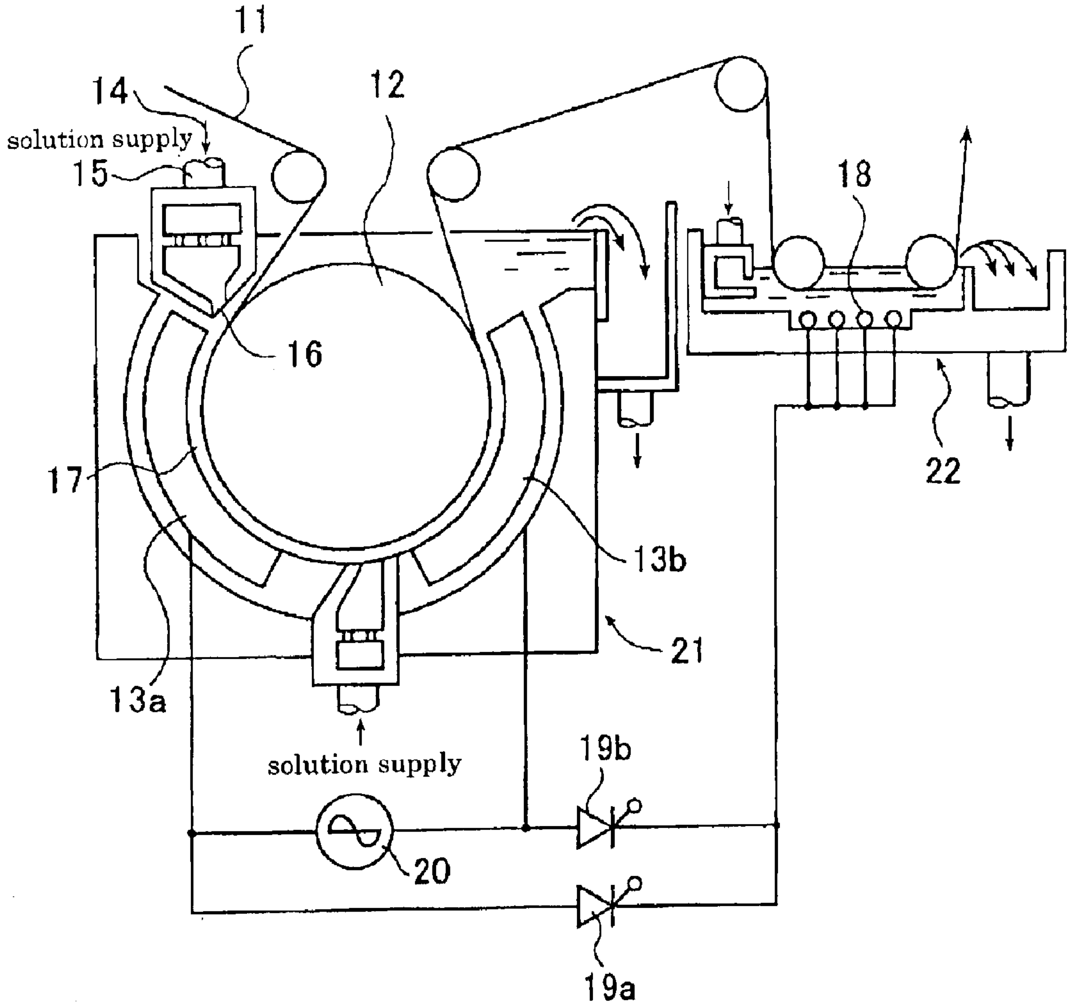
FIG. 1 is a side view showing one example of a radial cell for electrochemical surface-roughening treatment which is suitably used for the production of an aluminum substrate of the lithographic printing plate precursor of the present invention.

11 aluminum plate
12 radial drum roller
13*a*, 13*b* main poles
14 acidic aqueous solution
15 solution supply port
16 slit
17 solution path
18 auxiliary anode
19*a*, 19*b* thyristors
20 a.c. power source
21 main electrolytic cell
22 auxiliary anode cell
30 thermocomparator
31 tip
32 reservoir
33 electric heater
34 heating jacket
35 thermocouple
36 heat sink
37 film
38 metal substrate
39 contact thermometer
40 tip distal end temperature recording meter
41 heat sink temperature recording meter
42 reservoir temperature recording meter

DETAILED DESCRIPTION OF THE INVENTION

The present invention is described in detail below. In the following, unless otherwise indicated, "%" means "mass % (% by weight)".

[Aluminum Substrate]

The aluminum substrate for use in the present invention is an aluminum substrate subjected to an electrochemical surface-roughening treatment using an aqueous solution containing hydrochloric acid and provided with a hydrophilic film having a heat conductivity in a specific range. Also, the aluminum substrate for use in the present invention is an aluminum substrate subjected to an electrochemical surface-roughening treatment using an aqueous solution containing hydrochloric acid and provided with a hydrophilic film having a density or a porosity in a specific range. Furthermore, the aluminum substrate for use in the present invention is an aluminum substrate surface having a surface-roughened shape such that the average opening size of small pits and the ratio of the average depth of small pits to the average opening size each is in a specific range. These aluminum plates are described in detail below.

The surface roughened structure of the aluminum substrate suitably used for lithographic printing plate precursor in general is a superimposed structure of a large wave structure having an average opening size (average diameter) of several $\mu$m to tens of $\mu$m with pits having an average opening size of 0.01 to several $\mu$m. In the present invention, the large wave structure is called a large wave and a pit not allowing the presence of a small pit in the inside thereof is called a small pit. Also, the micropore of anodic oxide film is simply called a pore.

The aluminum plate used as a raw material of the aluminum substrate for use in the present invention is a dimensionally stable metal mainly comprising aluminum and comprises aluminum or an aluminum alloy. In addition to pure aluminum plate, an alloy plate mainly comprising aluminum and containing trace heteroelements, and a plastic film or paper having laminated or deposited thereon aluminum or an aluminum alloy may also be used. Furthermore, a composite sheet comprising a polyethylene terephthalate film having bonded thereon an aluminum sheet described in JP-B-48-18327 (the term "JP-B" as used herein means an "examined Japanese patent publication") may also be used.

Examples of the production method for the aluminum plate include a DC casting method, a DC casting method from which a soaking treatment and/or an annealing treatment are omitted, and a continuous casting method. In the following, the substrate comprising aluminum and the substrate comprising an aluminum alloy are collectively called an aluminum substrate.

Examples of the heteroelement contained in the aluminum alloy include silicon, iron, nickel, manganese, copper, magnesium, chromium, zinc, bismuth, nickel and titanium. The content of heteroelement in the alloy is 10% or less. In the present invention, a pure aluminum plate is preferably used, however, since a perfectly pure aluminum is difficult to produce in view of refining technique, an aluminum containing slight heteroelements may be used. As such, the aluminum plate for use in the present invention is not specified in its composition and conventionally known and commonly employed materials described in *Aluminum Handbook,* 4th ed. Keikinzoku Kyokai (1990), for example, JIS A 1050, JIS A 1100, JIS A 3103 and JIS A 3005, may be appropriately used.

The thickness of the aluminum plate for use in the present invention is on the order of 0.1 to 0.6 mm. This thickness can be appropriately changed according to the size of press, the size of printing plate and the demand by users. The aluminum plate is appropriately subjected to the following surface statements.

In general, the aluminum substrate for lithographic printing plates is produced through a degreasing step of removing rolling oil adhered to the aluminum plate, a surface roughening pretreatment such as desmutting treatment of dissolving smuts on the surface of aluminum plate, and a surface-roughening treatment step of roughening the surface of aluminum plate.

Subsequently to those treatments, the aluminum substrate of the present invention is further provided with a hydrophilic film having a specific heat conductivity. If desired, an acid or alkali treatment, a sealing treatment and a hydrophilization treatment are applied to form a substrate for use in a lithographic printing plate precursor. After the formation of substrate, an undercoat layer may also be provided, if desired.

The production method including a surface-roughening treatment of the present invention may be a continuous method or an intermittent method but in industrial use, a continuous method is preferred. Respective surface treatment steps are described in detail below.

<Surface Roughening Pretreatment>

The aluminum plate is subjected to a dissolution treatment using an alkali aqueous solution such as caustic soda so as to remove sticking stains or natural oxide film and to a neutralization treatment of dipping the aluminum plate in an acid such as phosphoric acid, nitric acid, sulfuric acid, hydrochloric acid or chromic acid, or a mixed acid thereof to neutralize the residual alkali component after the dissolution treatment. If desired, a solvent degreasing treatment using trichlene, thinner or the like or an emulsion degreasing treatment using an emulsion such as kerosene or triethanol may be performed to remove oil and fat, rust, dust or the like on the surface of the aluminum plate. The kind and composition of acid for use in the neutralization treatment are preferably agreed with those of an acid used for the electrochemical surface-roughening treatment in the next step.

<Surface-Roughening Treatment>

The surface-roughening treatment of the aluminum plate surface can be performed by various methods. Examples thereof include a method of mechanically roughening the surface, a method of electrochemically dissolving and roughening the surface, a method of chemically and selectively dissolving the surface, and a combination of two or more of these methods.

Examples of the mechanical method which can be used include known methods such as ball polishing, brush polishing, blast polishing and buff polishing. Suitable examples of the chemical method include a method of dipping the aluminum plate in a saturated aqueous solution of aluminum salt of a mineral acid described in JP-A-54-31187. Examples of the electrochemical surface-roughing method include a method of performing the surface roughening in an electrolytic solution containing an acid such as hydrochloric acid or nitric acid, by passing an alternating current or a direct current. An electrolytic surface-roughening method using a mixed acid disclosed in JP-A-54-63902 may also be used. Among these, preferred is the electrochemical surface-roughening treatment using an aqueous solution containing hydrochloric acid as the electrolytic solution.

In the case of the electrochemical surface-roughening treatment using an electrolytic solution mainly containing hydrochloric acid, a double structure is readily formed, where small pits having an average opening size of 0.01 to several μm and a depth/average opening size ratio of 0.1 to 0.5 are produced and at the same time, large waves having an average opening size of several μm to tens of μm are produced. This is a preferred surface-roughened shape in view of difficulty of staining and printing durability. If desired, the electrolytic solution may contain a nitrate, a chloride, an amine, an aldehyde, a phosphoric acid, a chromic acid, a boric acid, an acetic acid, an oxalic acid or the like. Among these, an acetic acid is preferred.

In the electrochemical surface-roughening treatment, the voltage applied is preferably from 1 to 50 V, more preferably from 5 to 30 V. The current density (peak value) is preferably from 5 to 200 A/dm$^2$, more preferably from 20 to 150 A/dm$^2$. The quantity of electricity in total of all treatment steps is preferably from 10 to 2,000 C/dm$^2$, more preferably from 200 to 1,000 C/dm$^2$. The temperature is preferably from 10 to 60° C., more preferably from 15 to 45° C. The frequency is preferably from 10 to 200 Hz, more preferably from 40 to 150 Hz.

The hydrochloric acid concentration is preferably from 0.1 to 5%. The current wave form used in the electrolysis may be appropriately selected according to the desired surface-roughened form, such as sine wave, rectangular wave, trapezoidal wave or saw-tooth wave. Among these, rectangular wave is preferred.

The aluminum plate subjected to the electrochemical surface-roughening treatment is then subjected to a surface-etching treatment by dipping the aluminum plate in an acid or alkali aqueous solution so as to remove smuts or the like on the surface or to control the surface-roughened pit shape. Examples of the acid include sulfuric acid, persulfuric acid, hydrofluoric acid, phosphoric acid, nitric acid and hydrochloric acid. Examples of the alkali include sodium hydroxide and potassium hydroxide. Among these, an alkali aqueous solution is preferred. The treatment is preferably performed using an aqueous solution having an alkali concentration of 0.05 to 40% at a liquid temperature of 20 to 90° C. for 5 seconds to 5 minutes. After the surface-etching using the alkali aqueous solution, a neutralization treatment is performed by dipping the aluminum plate in an acid such as phosphoric acid, nitric acid, sulfuric acid or chromic acid, or a mixed acid thereof.

The electrolysis apparatus used in the surface-roughening treatment step may be a known electrolysis apparatus such as vertical type, flat type and radial type. Among these, a radial-type electrolysis apparatus described in JP-A-5-195300 is preferred.

FIG. 1 is a schematic view of a radial-type electrolysis apparatus which is suitably used in the present invention. In the radial-type electrolysis apparatus of FIG. 1, the aluminum plate 11 is transported while winding around a radial drum roller 12 disposed in a main electrolytic cell 21 and in the transportation process, electrolyzed by main poles 13*a* and 13*b* connected to an a.c. power source 20. An acidic aqueous solution 14 is supplied from a solution supply port 15 through a slit 16 to a solution path 17 between the radial drum roller 12 and the main poles 13*a* and 13*b*.

The aluminum plate 11 treated in the main electrolytic cell 21 is then electrolyzed in an auxiliary anodic cell 22. In this auxiliary anodic cell 22, an auxiliary anode 18 is disposed to face the aluminum plate 11 and the acidic aqueous solution 14 is supplied to flow between the auxiliary anode 18 and the aluminum plate 11. The current passed to the auxiliary electrode is controlled by thyristors 19*a* and 19*b*.

The main poles 13*a* and 13*b* each may be selected from, for example, carbon, platinum, titanium, niobium, zirconium, stainless steel and an electrode used for the cathode of a fuel cell. Among these, carbon is preferred. The carbon may be an impermeable graphite for chemical apparatuses, an impregnated graphite or the like, which are generally available on the market. The auxiliary anode 18 can be selected from known oxygen-generating electrodes such as ferrite, iridium oxide, platinum and valve metal (e.g., titanium, niobium or zirconium) cladded or plated with platinum.

The direction of supplying a hydrochloric acid-containing aqueous solution passed in the main electrolytic cell 21 and the auxiliary anodic cell 22 may be parallel or counter to the progress of the aluminum plate 11. The flow rate of the hydrochloric acid-containing aqueous solution relative to the aluminum plate is preferably from 10 to 1,000 cm/sec.

In one electrolysis apparatus, one or more a.c. power sources can be connected. Also, two or more electrolysis apparatuses may be used and the electrolysis conditions in respective apparatuses may be the same or different. After the completion of electrolysis treatment, the aluminum plate is preferably subjected to liquid cutting by nip rollers and washing by spray so as not to carry over the treating solution to the next step.

In the surface-roughening treatment, hydrochloric acid and water are preferably added by controlling each added amount based on the hydrochloric acid and aluminum ion concentrations determined from, for example, (i) the electric conductivity of the hydrochloric acid-containing aqueous solution, (ii) the propagation rate of ultrasonic wave and (iii) the temperature, in proportion to the quantity of electricity passed through the hydrochloric acid-containing aqueous solution with which the aluminum plate in the electrolytic cell undertakes an anode reaction, and the hydrochloric acid-containing aqueous solution in an amount equal to the volume of hydrochloric acid and water added is preferably discharged by the sequential overflow from the electrolysis apparatus, so that the concentration of the hydrochloric acid-containing aqueous solution can be kept constant.

In the present invention, a quiescent time of 0.2 to 10 seconds is preferably provided in the process of electrochemical surface-roughening treatment in the hydrochloric acid-containing electrolytic solution and the quantity of electricity in one electrochemical surface-roughening treatment is preferably 100 C/dm$^2$ or less. In the case of performing the electrochemical surface-roughening treatment in parts, if the quiescent time is less than 0.2 second and the quantity of electricity in the electrochemical surface-roughening treatment exceeds 100 C/dm$^2$, production of coarse pits having an opening size in excess of 20 $\mu$m cannot be prevented, whereas if the quiescent time exceeds 10 seconds, the production of aluminum plate takes a too long time and the productivity decreases.

The electrochemical surface-roughening treatment using the hydrochloric acid-containing aqueous solution as the electrolytic solution can be used in combination with a mechanical surface-roughening treatment or an electrochemical surface-roughening treatment under different conditions.

The mechanical surface-roughening treatment is preferably performed before the electrochemical surface-roughening treatment, in advance of the dissolution solution using an alkali aqueous solution. The mechanical surface-roughening treatment method is not particularly limited but is preferably brush polishing or horning polishing. In the brush polishing, for example, a cylindrical brush prepared by implanting brush bristles having a bristle size of 0.2 to 1 mm is rotated and while supplying a slurry obtained by dispersing an abrasive in water to the contact surface, pressed to the aluminum plate surface, thereby performing the surface-roughening treatment. In the horning polishing, a slurry obtained by dispersing an abrasive in water is jetted from nozzles under pressure to obliquely collide against the aluminum plate surface, thereby performing the surface-roughening treatment. Also, the mechanical surface-roughening treatment may be performed by attaching a previously surface-roughened sheet to the aluminum plate surface and transferring the surface-roughening pattern under pressure.

In the case of performing the mechanical surface-roughening treatment, the solvent degreasing treatment or the emulsion degreasing treatment can be omitted.

Examples of the electrochemical surface-roughening treatment under different conditions include an electrochemical surface-roughening treatment mainly using a nitric acid.

The acidic aqueous solution mainly comprising a nitric acid may be an aqueous solution usually used in the electrochemical surface-roughening treatment using a d.c. or a.c. current. For example, an aqueous solution obtained by adding one or more nitric acid compound such as aluminum nitrate, sodium nitrate and ammonium nitrate to an aqueous nitric acid solution having a nitric acid concentration of 5 to 15 g/liter, to a concentration of 0.01 g/liter to the saturation, may be used. In the acidic aqueous solution mainly comprising a nitric acid, a metal or the like contained in the aluminum alloy, such as iron, copper, manganese, nickel, titanium, magnesium and silicon, may be dissolved.

The acidic aqueous solution mainly comprising a nitric acid is preferably an aqueous solution containing a nitric acid, an aluminum salt and a nitrate and obtained by adding an aluminum nitrate and an ammonium nitrate to an aqueous nitric acid solution having a nitric acid concentration of 5 to 15 g/liter such that the aluminum ion concentration is 1 to 15 g/liter, preferably from 1 to 10 g/liter, and the ammonium ion concentration is from 10 to 300 ppm. The aluminum ion and the ammonium ion each abiogenetically increases during the electrochemical surface-roughening treatment. At this time, the liquid temperature is preferably from 10 to 95° C., more preferably from 40 to 80° C.

In the lithographic printing plate precursor of the present invention subjected to the surface-roughening treatment, the small pits of the surface-roughened shape preferably has an average opening size of 0.01 to 3 $\mu$m, more preferably from 0.05 to 2 $\mu$m, still more preferably from 0.05 to 1.0 $\mu$m. If the average opening size is less than 0.01 $\mu$m, satisfactory difficulty of staining at printing or high printing durability cannot be ensured, whereas if it exceeds 3 $\mu$m, the printing durability deteriorates.

The ratio o the average depth of small pits to the average opening size is preferably from 0.1 to 0.5, more preferably from 0.1 to 0.3, still more preferably from 0.15 to 0.2. If the ratio is less than 0.1, the difficulty of staining at printing or the printing durability deteriorates, whereas if it exceeds 0.5, the difficulty of staining disadvantageously deteriorates.

The large waves of the surface-roughened shape preferably have an average opening size of 3 to 20 m, more preferably from 3 to 17 $\mu$m, still more preferably from 4 to 10 $\mu$m. If the average opening size is less than 3 $\mu$m, the difficulty of staining at printing or the printing durability deteriorates, whereas if it exceeds 20 $\mu$m, the difficulty of staining disadvantageously deteriorates.

<Formation of Hydrophilic Film>

The aluminum substrate of the present invention is characterized in that a hydrophilic film having a heat conductivity of 0.05 to 0.5 W/mK is provided on the aluminum plate subjected to the surface-roughening treatment and if desired, to other treatments.

The hydrophilic film has a heat conductivity in the film thickness direction of 0.05 W/(m·K) or more, preferably 0.08 W/(m·K) or more, and of 0.5 W/(m·K) or less, preferably 0.3 W/(m·K) or less, more preferably 0.2 W/(m·K) or less. When the heat conductivity in the film thickness direction is from 0.05 to 0.5 W/(m·K), the heat generated in the recording layer upon exposure by laser light can be prevented from diffusing into the substrate, as a result, the sensitivity can be high, the efficiency in the combination of fine particles due to heat can be elevated, the image strength can be increased and the printing durability can be improved.

The heat conductivity in the film thickness direction prescribed in the present invention is described below.

As for the method for measuring the heat conductivity of a thin film, various methods have been heretofore reported. In 1986, ONO et al. reported a heat conductivity in the plane direction of a thin film measured using a thermograph. Also, an attempt to apply an a.c. heating method to the measurement of thermal properties of a thin film has been reported. The a.c. heating method has its origin in the report of 1863. In recent years, various measuring methods have been proposed as a result of development of a heating method by a laser or using a combination with Fourier transformation. An apparatus using a laser angstrom method is actually available on the market. These methods all are to determine the heat conductivity in the plane direction (in-plane direction) of a thin film.

In considering the heat conduction of a thin film, the heat diffusion in the depth direction is rather an important factor. As has been reported in various papers, the heat conductivity of a thin film is said not isotropic and particularly in the case of the present invention, it is very important to directly measure the heat conductivity in the film thickness direction. From this viewpoint, an attempt to measure the thermal properties in the film thickness direction of a thin film has been reported, namely, a method using a thermocomparator has been reported by Lambropoulos et al. (*J. Appl. Phys.*, 66 (9) (Nov. 1, 1989)) and by Henager et al. (*APPLIED OPTICS*, Vol. 32, No. 1 (Jan. 1, 1993)). Furthermore, in recent years, a method of measuring the heat diffusion ratio of a polymer thin film by a temperature wave thermal analysis using the Fourier analysis has been reported by Hashimoto et al. (*Netsu Sokutei* (*Measurement of Heat*), 27 (3) (2000)).

The heat conductivity in the film thickness direction of a hydrophilic film prescribed in the present invention is measured by the method using a thermocomparator. This method is described below, however, the basic principle of this method is described in detail in those reports by Lambropoulos et al. and by Henager et al. The apparatus for use in this method is not limited to the following apparatus.

Figure 2:
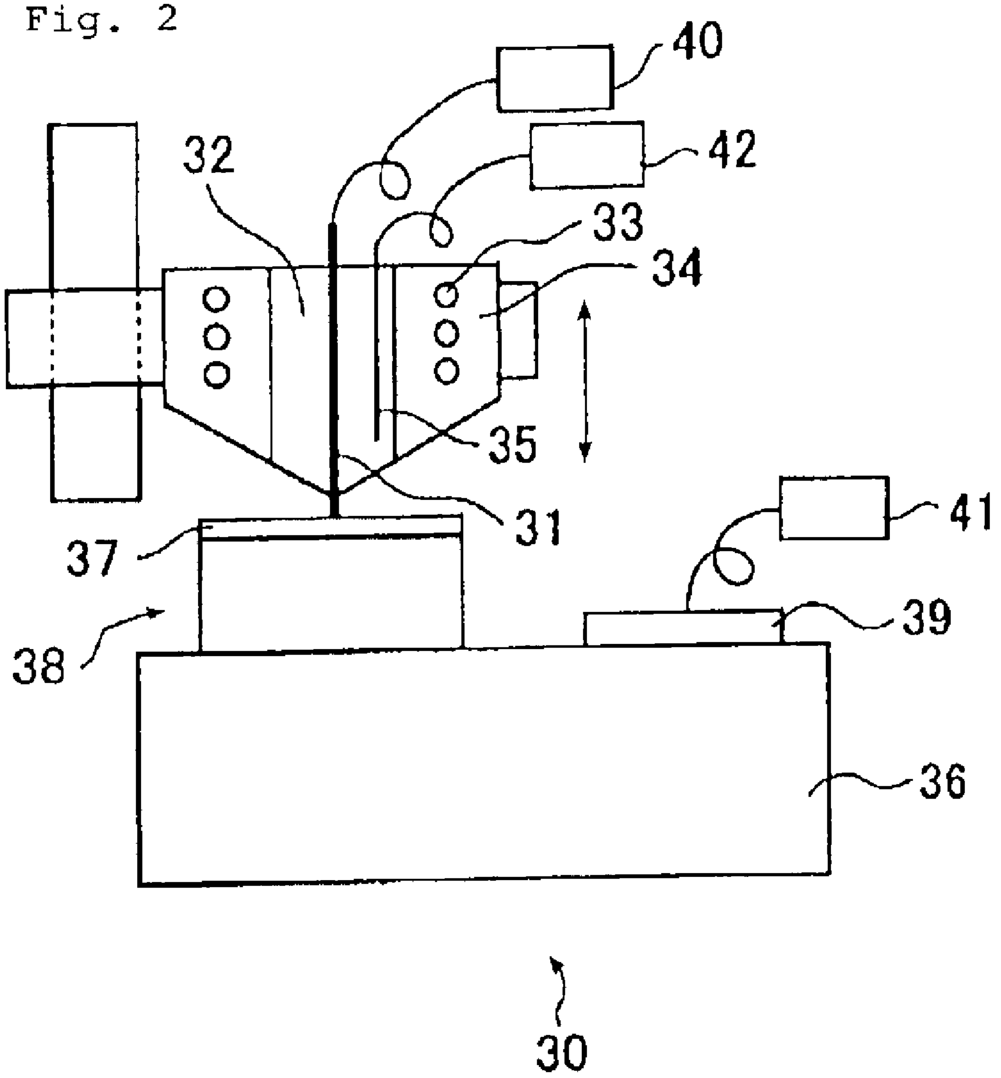
FIG. 2 is a schematic view showing a thermocomparator which can be used for the measurement of a heat conductivity in the film thickness direction of the hydrophilic film of the lithographic printing plate precursor of the present invention.

FIG. 2 is a schematic view of a thermocomparator 30 which can be used in the measurement of the heat conductivity in the film thickness direction of a hydrophilic film of the lithographic printing plate precursor of the present invention. The method using a thermocomparator is greatly affected by the contact area with the thin film and the state (roughness) on the contact surface. Accordingly, it is important that the distal end where the thermocomparator 30 comes into contact with the thin film is as fine as possible. For example, an oxygen-free copper-made tip (wire material) 31 having a fine distal end of a radius $r_1$=0.2 mm is used.

This tip 31 is fixed to the center of a constantan-made reservoir 32 and an oxygen-free copper-made heating jacket 34 having an electric heater 33 is fixed in the periphery of the reservoir 32. The heating jacket 34 is heated by the electric heater 33 and the reservoir 32 is controlled to 60±1° C. while feeding back the output of a thermocouple 35 fixed inside the reservoir 32, whereby the tip 31 is heated to 60±1° C. On the other hand, an oxygen-free copper-made heat sink 36 having a radius of 10 cm and a thickness of 10 mm is prepared and a metal substrate 38 having a film 37 as an objective of the measurement is placed on the heat sink 36. The temperature on the surface of the heat sink 36 is measured using a contact thermometer 39.

After setting the thermocomparator 30 as such, the distal end of the heated tip 31 is tightly contacted with the surface of the film 37. The thermocomparator 30 is made vertically movable by fixing it to the distal end of a dynamic ultrafine hardness meter in place of the indenter, so that the tip 31 can be pressed on the surface of the film 37 until a load of 0.5 mN is imposed. By this, the dispersion in the contact area between the film 37 as an object of the measurement and the tip 31 can be made minimal.

When the heated tip 31 is contacted with the film 37, the distal end temperature of the tip 31 decreases but reaches a stationary state at a certain constant temperature. This is because the quantity of heat given to the tip 31 from the electric heater 33 through the heating jacket 34 and the reservoir 32 equilibrates with the quantity of heat diffused to the heat sink 36 from the tip 31 through the metal substrate 38. At this time, the tip distal end temperature, the heat sink temperature and the reservoir temperature are recorded using a tip distal end temperature recording meter 40, a heat sink temperature recording meter 41 and a reservoir temperature recording meter 42, respectively.

The relationship between respective temperatures and the heat conductivity of film can be shown by the following formula (1):

$$\frac{(T_r - T_b)}{(T_r - T_t)} = \left(\frac{4K_1 r_1}{K_{tf} A_3}\right)t + \left(1 + \left(\frac{4K_1 r_1}{K_2 A_2}\right)t_2 + \left(\frac{K_1 r_1}{K_4 r_1}\right)\right) \tag{1}$$

wherein $T_t$: tip distal end temperature $T_b$: heat sink temperature $T_r$: reservoir temperature $K_{tf}$: heat conductivity of film $K_1$: heat conductivity of reservoir $K_2$: heat conductivity of tip (in the case of oxygen-free copper, 400 W/(m·K))

$K_4$: heat conductivity of metal substrate (when not provided with a film)

$r_1$: radius of curvature of tip distal end

-continued $A_2$: contact area between reservoir and tip $A_3$: contact area between tip and film $t$: film thickness $t_2$: contact thickness (about 0)

Respective temperatures ($T_t$, $T_b$ and $T_r$) are measured by changing the film thickness (t) and plotted to determine the gradient of formula (1) and from the gradient, the heat conductivity of film ($K_{tf}$) can be determined. In other words, as apparent from formula (1), this gradient is a value determined from the heat conductivity of reservoir ($K_1$), the radius of curvature of tip distal end ($r_1$), heat conductivity of film ($K_{tf}$) and the contact area ($A_3$) between tip and film, and $K_1$, $r_1$ and $A_3$ are each a known value, therefore, $K_{tf}$ can be determined from the gradient.

The present inventors determined the heat conductivity of an anodic oxide film ($Al_2O_3$) provided on an aluminum substrate using the above-described measuring method. The heat conductivity of $Al_2O_3$ determined from the gradient on the graph obtained after the temperature was measured by changing the film thickness was 0.69 W/(m·K). This well agrees with the results in the above-described report by Lambropoulos et al. This result also reveals that the heat physical property value of a thin film differs from the heat physical property value of a bulk (the heat conductivity of bulk $Al_2O_3$ is 28 W/(m·K)).

When the above-described method is used for the measurement of the heat conductivity in the film thickness direction of the hydrophilic film of the lithographic printing plate precursor of the present invention, by making fine the tip distal end and keeping constant the press load, the results obtained on the roughened surface of a lithographic printing plate can be advantageously free from dispersion. The heat conductivity is preferably measured at two or more different points on a sample, for example, at 5 points, and determined as an average value thereof.

The film thickness of the hydrophilic film is, in view of difficulty to scratch and printing durability, preferably 0.1 μm or more, more preferably 0.3 μm or more, still more preferably 0.6 μm or more. On the other hand, in view of production cost, since a large energy is necessary for providing a thick film, the film thickness is preferably 5 μm or less, more preferably 3 μm or less, still more preferably 2 μm or less.

On taking account of the effect on heat insulating property, the film strength and the difficulty of staining at printing, the hydrophilic film for use in the present invention preferably has a density of 1,000 to 3,200 kg/m$^3$.

The density can be calculated according to the following formula from the weight measured, for example, by the Maison method (anodic oxide film weight method by the dissolution in chromic acid/phosphoric acid mixed solution) and the film thickness obtained by observing the cross section through SEM:

Density (kg/m$^3$)=(weight of hydrophilic film per unit area/film thickness)

If the density of the hydrophilic film formed is less than 1,000 kg/m$^3$, the film strength decreases and may adversely affect the image-forming property, the printing durability or the like and also, the difficulty of staining at printing deteriorates, whereas if it exceeds 3,200 kg/m$^2$, a sufficiently high heat insulating property cannot be obtained and the effect of improving the sensitivity decreases.

In the present invention, the porosity of the hydrophilic film is preferably from 20 to 70%, more preferably from 30 to 60%, still more preferably from 40 to 50%. If the porosity of the hydrophilic film is less than 20%, the heat diffusion to the aluminum substrate cannot be satisfactorily prevented and the effect of obtaining high sensitivity and improving the printing durability is insufficient, whereas if the porosity exceeds 70%, generation of staining on the non-image area is liable to occur.

The method for providing the hydrophilic film is not particularly limited and an anodization method, a vapor deposition method, a CVD method, a sol-gel method, a sputtering method, an ion plating method, a diffusion method or the like may be appropriately used. Also, a method of coating a solution obtained by mixing hollow particles in a hydrophilic resin or a sol-gel solution may be used.

Among these, a treatment of forming an oxide by anodic oxidation, namely, an anodization treatment, is most preferred. The anodization treatment can be performed by the method conventionally used in this field. To speak specifically, a d.c. or a.c. current is passed to the aluminum plate in an aqueous or non-aqueous solution containing sulfuric acid, phosphoric acid, chromic acid, oxalic acid, sulfamic acid and benzenesulfonic acid individually or in combination of two or more thereof, whereby an anodic oxide film as a hydrophilic film can be formed on the surface of the aluminum plate.

The conditions for the anodization treatment vary depending on the electrolytic solution used and cannot be indiscriminately determined, however, the conditions in general are suitably such that the electrolytic solution concentration is from 1 to 80 mass %, the liquid temperature is from 5 to 70° C., the current density is from 0.5 to 60 A/dm$^2$, the voltage is from 1 to 200 V and the electrolysis time is from 1 to 1,000 seconds.

Among these anodization treatments, a method of performing the anodization treatment at a high current density in a sulfuric acid electrolytic solution described in British Patent 1,412,768, and a method of performing an anodization treatment using a phosphoric acid as an electrolysis bath described in U.S. Pat. No. 3,511,661 are preferred. Also, a multi-stage anodization treatment of performing an anodization treatment in sulfuric acid and further performing an anodization treatment in phosphoric acid may be used.

In the present invention, the coverage of the anodic oxide film is, in view of sensitivity and printing durability, preferably 3.2 g/m$^2$ or more, more preferably 4.0 g/m$^2$ or more, still more preferably 5 g/m$^2$ or more. On the other hand, since a large energy is necessary for providing a thick film, the coverage is preferably 50 g/m$^2$ or less, more preferably 30 g/m$^2$ or less, still more preferably 20 g/m$^2$ or less.

On the surface of the anodic oxide film, fine asperities called micropores are formed in a uniform dispersion. The size density of micropores present on the anodic oxide film can be controlled by appropriately selecting the treatment conditions. By increasing the size density of micropores, the heat conductivity in the film thickness direction of the anodic oxide film can be made to 0.05 to 0.5 W/(m·K).

Furthermore, by increasing the size density of micropores on the anodic oxide film, the density can be made to 1,000 to 3,200 kg/m$^3$.

In the present invention, for the purpose of decreasing the heat conductivity or density or increasing the porosity, a pore wide treatment of enlarging the pore size of micropores is preferably performed after the anodization treatment. In this pore wide treatment, the aluminum substrate having formed thereon an anodic oxide film is dipped in an acid aqueous solution or an alkali aqueous solution to dissolve the anodic oxide film and thereby enlarge the pore size of micropores. The pore wide treatment is preferably performed to dissolve the anodic oxide film in an amount of 0.01 to 20 $g/m^2$, more preferably from 0.1 to 5 $g/m^2$, still more preferably from 0.2 to 4 $g/m^2$.

The pore size of micropores is, in view of staining at printing and on-press developability, preferably from 0 to 40 nm, more preferably 15 nm or less, still more preferably 7 nm or less. Within this range, good inhibition of staining at printing and good on-press developability can be obtained. Also, in view of sensitivity and printing durability, the pore size in the region from the surface to the depth of 0.4 $\mu$m is preferably from 7 to 200 nm, more preferably from 15 to 100 nm, still more preferably from 30 to 100 nm. Within this range, good heat insulating property can be obtained and an effect of improving the sensitivity and printing durability can be provided.

In the case of using an acid aqueous solution for the pore wide treatment, an aqueous solution of an inorganic acid such as sulfuric acid, phosphoric acid, nitric acid or hydrochloric aid, or a mixture thereof is preferably used. The concentration of the acid aqueous solution is preferably from 10 to 1,000 g/liter, more preferably from 20 to 500 g/liter. The temperature of the acid aqueous solution is preferably from 10 to 90° C., more preferably from 30 to 70° C. The dipping time in the acid aqueous solution is preferably from 1 to 300 seconds, more preferably from 2 to 100 seconds.

On the other hand, in the case of using an alkali aqueous solution for the pore wide treatment, an aqueous solution of at least one alkali selected from the group consisting of sodium hydroxide, potassium hydroxide and lithium hydroxide is preferably used. The pH of the alkali aqueous solution is preferably from 10 to 13, more preferably from 11.5 to 13.0. The temperature of the alkali aqueous solution is preferably from 10 to 90° C., more preferably from 30 to 50° C. The dipping time in the alkali aqueous solution is preferably from 1 to 500 seconds, more preferably from 2 to 100 seconds.

The hydrophilic film may be, other than the anodic oxide film, an inorganic film provided by a sputtering method, a CVD method or the like. Examples of the compound constituting the inorganic film include an oxide, a nitride, a silicide, a boride and a carbide. Also, the inorganic film may be constituted only by a simple substance of the compound or by a mixture of the compounds.

Specific examples of the compound constituting the inorganic film include aluminum oxide, silicon oxide, titanium oxide, zirconium oxide, hafnium oxide, vanadium oxide, niobium oxide, tantalum oxide, molybdenum oxide, tungsten oxide, chromium oxide, aluminum nitride, silicon nitride, titanium nitride, zirconium nitride, hafnium nitride, vanadium nitride, niobium nitride, tantalum nitride, molybdenum nitride, tungsten nitride, chromium nitride, boron nitride, titanium silicide, zirconium silicide, hafnium silicide, vanadium silicide, niobium silicide, tantalum silicide, molybdenum silicide, tungsten silicide, chromium silicide, boron silicide, titanium boride, zirconium boride, hafnium boride, vanadium boride, niobium boride, tantalum boride, molybdenum boride, tungsten boride, chromium boride, boron boride, aluminum carbide, silicon carbide, titanium carbide, zirconium carbide, hafnium carbide, vanadium carbide, niobium carbide, tantalum carbide, molybdenum carbide, tungsten carbide and chromium carbide.

<Sealing Treatment>

In the present invention, the thus-obtained substrate having provided thereon a hydrophilic film for the lithographic printing plate of the present invention may be subjected to a sealing treatment so as to improve the difficulty of staining and the on-press developability. The sealing treatment for use in the present invention may be a conventionally known method. However, in order to obtain both the improvement of sensitivity, printing durability and difficulty of staining and the on-press developability, the fine pore of the film after the sealing treatment preferably has a pore size of 0 to 40 nm in the surface layer and from 7 to 200 nm in the region from the surface layer to the depth of 0.4 $\mu$m.

Examples of the sealing treatment for use in the present invention include a sealing treatment of an anodic oxide film using water vapor or hot water under pressure described in JP-A-4-176690 and Japanese Patent Application No. 10-106819 (JP-A-11-301135). Also, known methods such as a silicate treatment, an aqueous bichromate solution treatment, a nitrite treatment, an ammonium acetate treatment, an electrodeposition sealing treatment, a triethanolamine treatment, a barium carbonate treatment and a treatment with hot water containing trace phosphate can be used. In particular, a sealing treatment using particles having an average particle size of 8 to 800 nm described in Japanese Patent Application No. 2001-9871 is preferred.

The sealing treatment using particles is performed by using particles having an average particle size of 8 to 800 nm, preferably from 10 to 500 nm, more preferably from 10 to 150 nm. Within this range, mingling of particles into the inside of micropores present in the hydrophilic film can be avoided, a sufficiently high effect of elevating the sensitivity can be obtained, and satisfactory adhesion to the image-recording layer and excellent printing durability can be attained. The thickness of the particle layer is preferably from 8 to 800 nm, more preferably from 10 to 500 nm.

The particle for use in the present invention preferably has a heat conductivity of 60 W/(m·K) or less, more preferably 40 W/(m·K) or less, still more preferably from 0.3 to 10 W/(m·K). With a heat conductivity of 60 W/(m·K) or less, heat diffusion to the aluminum substrate can be satisfactorily prevented and a sufficiently high effect of elevating the sensitivity can be obtained.

Examples of the method for providing a particle layer include a dipping treatment in a solution, a spray treatment, a coating treatment, an electrolysis treatment, a vapor deposition treatment, sputtering, ion plating, flame spray coating and plating, however, the method for providing a particle layer is not particularly limited.

In the electrolysis treatment, a direct current or an alternating current can be used. Examples of the waveform of the a.c. current for use in the electrolysis treatment include a sine wave, a rectangular wave, a triangular wave and a trapezoidal wave. The frequency of the a.c. current is, in view of the cost for the manufacture of a power source unit, preferably from 30 to 200 Hz, more preferably from 40 to 120 Hz. In the case of using a trapezoidal wave as the waveform of the a.c. current, the time tp until the current reaches the peak from 0 is preferably from 0.1 to 2 msec, more preferably from 0.3 to 1.5 msec. If the tp is less than 0.1 msec, this affects the impedance of the power source current and in some cases, a large power source voltage is necessary at the rising of the current waveform and the cost for power source equipment increases.

As for the hydrophilic particle, $Al_2O_3$, $TiO_2$, $SiO_2$ and $ZrO_2$ are preferably used individually or in combination of two or more thereof. The electrolytic solution is obtained, for example, by suspending the hydrophilic particles in water or the like to have a content of 0.01 to 20% based on the suspension as a whole. The electrolytic solution is charged to a plus or minus charge and therefore, the pH can be adjusted, for example, by adding a sulfuric acid. The electrolysis treatment is performed, for example, using the aluminum plate as a cathode and using the above-described electrolytic solution by passing a direct current at a voltage of 10 to 200 V for 1 to 600 seconds. According to this method, the opening of micropores present in the anodic oxide film can be easily closed while allowing a void to remain in the inside thereof.

Another example of the sealing treatment is a method of providing a layer of a compound selected from carboxymethylcellulose; dextrin; gum arabic; phosphonic acids having an amino group, such as 2-aminoethylphosphonic acid; organic phosphonic acids such as phenylphosphonic acid, naphthylphosphonic acid, alkylphosphonic acid, glycerophosphonic acid, methylenediphosphonic acid and ethylenediphosphonic acid, which may have a substituent; organic phosphoric acid ester such as phenylphosphoric acid, naphthylphosphoric acid, alkylphosphoric acid and glycerophosphoric acid, which may have a substituent; organic phosphinic acids such as phenylphosphinic acid, naphthylphosphinic acid, alkylphosphinic acid and glycerophosphinic acid, which may have a substituent; amino acids such as glycine and β-alanine; and hydrochlorides of amine having a hydroxy group, such as hydrochloride of triethanolamine.

Still another example of the sealing treatment is a treatment of applying a silane coupling agent having an unsaturated group. Examples of the silane coupling agent include N-3-(acryloxy-2-hydroxypropyl)-3-aminopropyltriethoxysilane, (3-acryloxypropyl)dimethylmethoxysilane, (3-acryloxypropyl)methyldimethoxysilane, (3-acryloxypropyl)trimethoxysilane, 3-(N-allylamino)propyltrimethoxysilane, allyldimethoxysilane, allyltriethoxysilane, allyltrimethoxysilane, 3-butenyltriethoxysilane, 2-(chloromethyl)allyltrimethoxysilane, methacrylamidopropyltriethoxysilane, N-(3-methacryloxy-2-hydroxypropyl)-3-aminopropyltriethoxysilane, (methacryloxymethyl)dimethylethoxysilane, methacryloxymethyltriethoxysilane, methacryloxymethyltrimethoxysilane, methacryloxypropyldimethylethoxysilane, methacryloxypropyldimethylmethoxysilane, methacryloxypropylmethyldiethoxysilane, methacryloxypropylmethyldimethoxysilane, methacryloxypropylmethyltriethoxysilane, methacryloxypropylmethyltrimethoxysilane, methacryloxypropyltris(methoxyethoxy)silane, methoxydimethylvinylsilane, 1-methoxy-3-(trimethylsiloxy)butadiene, styrylethyltrimethoxysilane, 3-(N-styrylmethyl-2-aminoethylamino) propyltrimethoxysilane hydrochloride, vinyldimethylethoxysilane, vinyldiphenylethoxysilane, vinylmethyldiethoxysilane, vinylmethyldimethoxysilane, O-(vinyloxyethyl)-N-(triethoxysilylpropyl)urethane, vinyltriethoxysilane, vinyltrimethoxysilane, vinyltri-t-butoxysilane, vinyltriisopropoxysilane, vinyltriphenoxysilane, vinyltris(2-methoxyethoxy)silane, diallylaminopropylmethoxysilane. Among these, silane coupling agents having a methacryloyl group or an acryloyl group are preferred because the unsaturated group has high reactivity.

Other examples include a sold-gel coating treatment described in JP-A-5-50779, a treatment of coating phosphonic acids described in JP-A-5-246171, a method of treating a backcoat material by coating described in JP-A-6-234284, JP-A-6-191173 and JP-A-6-230563, a treatment with phosphonic acids described in JP-A-6-262872, a coating treatment described in JP-A-6-297875, a method of performing an anodization treatment described in JP-A-10-109480, and a dipping treatment method described in Japanese Patent Application Nos. 10-252078 (JP-A-2000-81704) and 10-253411 (JP-A-2000-89466). Any of these methods may be used.

<Hydrophilic Surface Treatment>

In the present invention, the thus-obtained substrate for the lithographic printing plate of the present invention, on which a hydrophilic film is provided as described above, is preferably subjected to a hydrophilic surface treatment by dipping the substrate in an aqueous solution containing one or more hydrophilic compound.

Examples of the hydrophilic surface treatment include a method of treating the substrate with an alkali metal silicate described in U.S. Pat. Nos. 2,714,066 and 3,181,461, a method of treating the substrate with a potassium fluorozirconate described in JP-B-36-22063, a method of treating the substrate with polyvinylphosphonic acid described in U.S. Pat. No. 4,153,461, a method of treating the substrate with an aqueous solution containing a phosphate and an inorganic fluorine compound described in JP-A-9-244227, and a method of treating the substrate with an aqueous solution containing titanium and fluorine described in JP-A-10-252078 and JP-A-10-263411. Among these, a method of treating the substrate with an alkali metal silicate and a method of treating the substrate with a polyvinylphosphonic acid are preferred.

Examples of the alkali metal silicate for use in the method of treating the substrate with an alkali metal silicate include sodium silicate, potassium silicate and lithium silicate.

Examples of the method of treating the substrate with an alkali metal silicate include a method of dipping the aluminum substrate having provided thereon the above-described particle layer in an aqueous alkali metal silicate solution having an alkali metal silicate concentration of 0.01 to 30 mass %, preferably from 0.01 to 10 mass %, more preferably from 0.05 to 3 mass %, and a pH at 25° C. of 10 to 13, at 4 to 80° C. for preferably from 0.5 to 120 seconds, more preferably from 2 to 30 seconds. The treating conditions such as alkali metal silicate concentration, pH, temperature and treatment time can be appropriately selected. If the pH of the aqueous alkali metal silicate solution is less than 10, the solution is readily gelled, whereas if the pH exceeds 13, the particle layer and the anodic oxide film may dissolve and it is necessary to take care on this point.

In the hydrophilization treatment, if desired, a hydroxide may be blended so as to adjust the aqueous alkali metal silicate solution to a high pH. Examples of the hydroxide include sodium hydroxide, potassium hydroxide and lithium hydroxide.

Furthermore, if desired, an alkaline earth metal salt and/or a Group 4 (Group IVA) metal salt may be blended in the aqueous alkali metal silicate solution. Examples of the alkaline earth metal salt include water-soluble salts of alkaline earth metal, such as nitrate (e.g., calcium nitrate, strontium nitrate, magnesium nitrate, barium nitrate), sulfate, hydrochloride, phosphate, acetate, oxalate and borate. Examples of the Group 4 (Group IVA) metal salt include titanium tetrachloride, titanium trichloride, potassium titanium fluoride, potassium titanium oxalate, titanium sulfate, titanium tetraiodide, zirconium chloride oxide, zirconium dioxide, zirconium oxychloride and zirconium tetrachloride. The alkaline earth metal salts or the group 4 (Group IVA) metal salts may be used individually or in combination of two or more thereof. The amount of the metal salt used is preferably from 0.01 to 10 mass %, more preferably from 0.05 to 5.0 mass %.

The aqueous solution for use in the method of treating the substrate with a polyvinylphosphonic acid has, for example, a polyvinylphosphonic acid concentration of 0.01 to 10 mass %, preferably from 0.1 to 5 mass %, more preferably from 0.2 to 2.5 mass %, and a temperature of 10 to 70° C., preferably from 30 to 60° C. The hydrophilization treatment can be performed by dipping the aluminum substrate in this aqueous solution, for example, for 0.5 seconds to 10 minutes, preferably from 1 to 30 seconds.

The treatment with an aqueous potassium fluorozirconate is performed by dipping the substrate in an aqueous potassium fluorozirconate solution having a concentration of preferably from 0.1 to 10 mass %, more preferably from 0.5 to 2 mass %, at preferably 30 to 80° C. for preferably 60 to 180 seconds.

The treatment with a phosphate/inorganic fluorine compound is performed by dipping the aluminum substrate in an aqueous solution preferably having a phosphate compound concentration of from 5 to 20 mass % or an inorganic fluorine compound concentration of 0.01 to 1 mass % and having a pH of preferably from 3 to 5, at preferably 20 to 100° C., more preferably from 40 to 80° C., for preferably from 2 to 300 seconds, more preferably from 5 to 30 seconds.

Examples of the phosphate for use in the present invention include phosphates of a metal such as alkali metal and alkaline earth metal. Specific examples thereof include zinc phosphate, aluminum phosphate, ammonium phosphate, diammonium hydrogenphosphate, ammonium dihydrogenphosphate, monoammonium phosphate, monopotassium phosphate, monosodium phosphate, potassium dihydrogenphosphate, dipotassium hydrogenphosphate, calcium phosphate, sodium ammonium hydrogenphosphate, magnesium hydrogenphosphate, magnesium phosphate, ferrous phosphate, ferric phosphate, sodium dihydrogenphosphate, sodium phosphate, disodium hydrogenphosphate, lead phosphate, diammonium phosphate, calcium dihydrogenphosphate, phosphotungstate, ammonium phosphotungstate, sodium phosphotungstate, ammonium phosphomolybdate, sodium phosphomolybdate, sodium phosphite, sodium tripolyphosphate and sodium pyrophosphate. Among these, sodium dihydrogenphosphate, disodium hydrogenphosphate, potassium dihydrogenphosphate and dipotassium hydrogenphosphate are preferred.

The inorganic fluorine compound for use in the present invention is suitably a metal fluoride. Specific examples thereof include sodium fluoride, potassium fluoride, calcium fluoride, magnesium fluoride, sodium hexafluorozirconate, potassium hexafluorozirconate, sodium hexafluorotitanate, potassium hexafluorotitanate, hydroacid hexafluorozirconate, hydroacid hexafluorotitanate, ammonium hexafluorozirconate, ammonium hexafluorotitanate, hexafluorosilicate, nickel fluoride, iron fluoride, fluorophosphoric acid and ammonium fluorophosphate.

The aqueous solution for use in the treatment with phosphate/inorganic fluorine compound may contain one or more phosphate and one or more inorganic fluorine compound.

In the present invention, other than those aqueous solutions, a compound having a sulfonic acid group and a saccharide compound may be suitably used.

The compound having a sulfonic acid group includes aromatic sulfonic acids and formaldehyde condensates, derivatives and salts thereof.

Examples of the aromatic sulfonic acid include phenolsulfonic acid, catecholsulfonic acid, benzenesulfonic acid, toluenesulfonic acid, ligninsulfonic acid, naphthalenesulfonic acid, acenaphthene-5-sulfonic acid, phenanthrene-2-sulfonic acid, benzaldehyde-2(or 3)-sulfonic acid, benzaldehyde-2,4(or 3,5)-disulfonic acid, oxybenzylsulfonic acids, sulfobenzoic acid, sulfanilic acid, naphthionic acid and taurine. Among these, benzenesulfonic acid, naphthalenesulfonic acid and ligninsulfonic acid are preferred. Also, formaldehyde condensates of benzenesulfonic acid, naphthalenesulfonic acid and ligninsulfonic acid are preferred. Furthermore, these may be also used as a sulfonate. Examples of the salt include sodium salt, potassium salt, lithium salt, calcium salt and magnesium salt. Among these, sodium salt and potassium salt are preferred.

The aqueous solution containing a compound having a sulfonic acid group preferably has a pH of 4 to 6.5 and can be adjusted to this pH range using sulfuric acid, sodium hydroxide, ammonia or the like.

The saccharide compound includes monosaccharides and sugar alcohols thereof, oligosaccharides, polysaccharides and glycosides.

Examples of the monosaccharide and sugar alcohol thereof include trioses such as glycerol, and sugar alcohols thereof; tetroses such as threose and erythritol, and sugar alcohols thereof; pentoses such as arabinose and arabitol, and sugar alcohols thereof; hexoses such as glucose and sorbitol, and sugar alcohols thereof; heptoses such as D-glycero-D-galactoheptose and D-glycero-D-galactoheptitol, and sugar alcohols thereof; octoses such as D-erythro-D-galactooctitol, and sugar alcohols thereof; and nonoses such as D-erythro-L-glycononulose, and sugar alcohols thereof.

Examples of the oligosaccharide include disaccharides such as saccharose, trehalose and lactose; and trisaccharides such as raffinose.

Examples of the polysaccharide include amylose, arabinose, cyclodextrin and alginic acid cellulose.

In the present invention, the "glycoside" means a compound where a sugar moiety and a non-sugar moiety are bonded through an ether bond or the like. The glycoside can be classified by the non-sugar moiety. Examples thereof include alkyl glycoside, phenol glycoside, coumarin glycoside, oxycoumarin glycoside, flavonoid glycoside, anthraquinone glycoside, triterpene glycoside, steroid glycoside and mustard oil glycoside.

Examples of the sugar moiety include the above-described monosaccharides and sugar alcohols thereof; oligosaccharides; and polysaccharides. Among these, monosaccharides and oligosaccharides are preferred, and monosaccharides and disaccharides are more preferred.

Examples of preferred glycosides include the compound represented by the following formula (I):

(I)

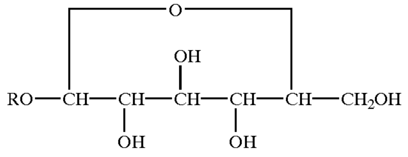

wherein R represents a linear or branched alkyl, alkenyl or alkynyl group having from 1 to 20 carbon atoms.

Examples of the alkyl group having from 1 to 20 carbon atoms include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group and an eicosyl group. The alkyl group may be linear or branched or may be a cyclic alkyl group.

Examples of the alkenyl group having from 1 to 20 carbon atoms include an allyl group and a 2-butenyl group. The alkenyl group may be linear or branched or may be a cyclic alkenyl group.

Examples of the alkynyl group having from 1 to 20 carbon atoms include a 1-pentynyl group. The alkynyl group may be linear or branched or may be a cyclic alkynyl group.

Specific examples of the compound represented by formula (I) include methyl glycoside, ethyl glucoside, propyl glucoside, isopropyl glucoside, butyl glucoside, isobutyl glucoside, n-hexyl glucoside, octyl glucoside, capryl glucoside, decyl glucoside, 2-ethylhexyl glucoside, 2-pentylnonyl glucoside, 2-hexyldecyl glucoside, lauryl glucoside, myristyl glucoside, stearyl glucoside, cyclohexyl glucoside and 2-butynyl glucoside. These compounds are glucoside which is one kind of glycosides, where the hemiacetalhydroxyl group of a glucose is bonded to other compound like an ether. These compounds can be obtained by a known method, for example, by reacting a glucose with an alcohol. These alkyl glucosides are partially available under the trade name of GLUCOPON from German Henkel and in the present invention, this product can be used.

Other examples of preferred glycosides include saponins, rutin trihydrate, hesperidin methylchalcone, hesperidin, naringin hydrate, phenol-β-d-glucopyranoside, salicin and 3',5,7-methoxy-7-rutinoside.

The aqueous solution containing a saccharide compound preferably has a pH of 8 to 11 and can be adjusted to this pH range by using potassium hydroxide, sulfuric acid, carbonic acid, sodium carbonate, phosphoric acid, sodium phosphate or the like.

The concentration of the aqueous solution of the compound having a sulfonic acid group is preferably from 0.02 to 0.2 mass %. The dipping temperature is preferably from 60 to 100° C. and the dipping time is preferably from 1 to 300 seconds, more preferably from 10 to 100 seconds.

The concentration of the aqueous solution of the saccharide compound is preferably from 0.5 to 10 mass %. The dipping temperature is preferably from 40 to 70° C. and the dipping time is preferably from 2 to 300 seconds, more preferably from 5 to 30 seconds.

After the dipping in the aqueous solution containing such a hydrophilic compound, the substrate is washed with water or the like, and then dried.

By this hydrophilic surface treatment, a problem of printing staining such as deterioration of ink cleaning property, which is generated as a trade-off for the improvement of sensitivity (in the case of a negative photosensitive layer, improvement of printing durability) attained by the pore wide treatment after the anodization treatment, can be solved. More specifically, due to enlargement of the pore size, a phenomenon such that ink is difficult to remove (deterioration of ink cleaning property) occurs at printing, particularly at the time of restarting the printing after the press is stopped and the lithographic printing plate is left standing on the press. However, when the hydrophilic surface treatment is applied, this problem is reduced.

<Undercoat Layer>

In the present invention, a recording layer capable of being written by infrared laser exposure is provided on the thus-obtained substrate for the lithographic printing plate of the present invention, however, if desired, in advance thereof, an inorganic undercoat layer such as a water-soluble metal salt (e.g., zinc borate) or a phosphate described in JP-A-62-19494, or an organic undercoat layer described below may be provided.

Examples of the organic undercoat layer include a layer comprising a compound having at least one amino group and at least one group selected from the group consisting of a carboxyl group and salts thereof and a sulfo group and salt thereof described in JP-A-60-149491, a layer comprising a compound having at least one amino group and at least one hydroxy group and a compound selected from the salts thereof described in JP-A-60-232998, and a layer comprising a polymer compound having at least one monomer unit having a sulfo group as a repeating unit within the molecule described in JP-A-59-101651.

Specific examples of the organic compound for use in the organic undercoat layer include amino acids such as glycine, p-hydroxyphenylglycine, dihydroxyethylglycine, β-alanine, lysin and aspartic acid, and salts thereof such as sodium salt, potassium salt and ammonium salt; aliphatic aminosulfonic acids such as sulfamic acid and cyclohexylsulfamic acid, and salts thereof such as sodium salt, potassium salt and ammonium salt; amines having a hydroxyl group, such as monoethanolamine, diethanolamine, triethanolamine and tripropanolamine, and salts thereof such as hydrochloride, oxalate and phosphate; polymers and copolymers containing a p-styrenesulfonic acid, a 2-acrylamide-2-methylpropanesulfonic acid, an allylsulfonic acid, a methallylsulfonic acid, an ethylenesulfonic acid or a salt thereof as a monomer unit; carboxymethyl cellulose; dextrin; gum arabi; polyacrylic acid; phosphonic acids having an amino group, such as 2-aminoethylphosphonic acid; organic phosphonic acids such as phenylphosphonic acid, naphthylphosphonic acid, alkylphosphonic acid, glycerophosphonic acid, methylenediphosphonic acid and ethylenediphosphonic acid, which may have a substituent; organic phosphoric acids such as phenylphosphoric acid, naphthylphosphoric acid, alkylphosphoric acid and glycerophosphoric acid, which may have a substituent; and organic phosphinic acids such as phenylphosphinic acid, naphthylphosphinic acid, alkylphosphinic acid and glycerophosphinic acid, which may have a substituent. These compounds may be used individually or in combination of two or more thereof.

The organic undercoat layer is provided by dissolving the above-described organic compound in water, an organic solvent such as methanol, ethanol and methyl ethyl ketone, or a mixed solvent thereof, coating the solution on the aluminum plate and then drying the solution. The concentration of the solution having dissolved therein the organic compound is preferably from 0.005 to 10 mass %. The coating method is not particularly limited and any of bar coater coating, rotary coating, spray coating, curtain coating and the like can be used.

The dry coverage of the organic undercoat layer is preferably from 2 to 200 $mg/m^2$, more preferably from 5 to 100 $mg/m^2$. Within this range, the printing durability is more improved.

<Backcoat Layer>

On the back surface (surface in the side where the recording layer is not provided) of the thus-obtained aluminum substrate, a coating layer (hereinafter also called a "backcoat layer") comprising an organic polymer compound may be provided, if desired, so that even when lithographic printing plate precursors obtained are stacked, the recording layer can be prevented from scratching.

The main component of the backcoat layer is preferably at least one resin having a glass transition point of 20° C. or more selected from the group consisting of saturated copolymer polyester resin, phenoxy resin, polyvinyl acetal resin and vinylidene chloride copolymer resin.

The saturated copolymer polyester resin comprises a dicarboxylic acid unit and a diol unit. Examples of the dicarboxylic acid unit include aromatic dicarboxylic acids such as phthalic acid, terephthalic acid, isophthalic acid, tetrabromophthalic acid and tetrachlorophthalic acid; and saturated aliphatic dicarboxylic acids such as adipic acid, azelaic acid, succinic acid, oxalic acid, suberic acid, sebacic acid, malonic acid and 1,4-cyclohexanedicarboxylic acid.

The backcoat layer may further appropriately contain a dye or a pigment for the coloration, and a silane coupling agent, a diazo resin comprising a diazonium salt, an organic phosphonic acid, an organic phosphoric acid, a cationic polymer, a wax usually used as a slipping agent, a higher fatty acid, a higher fatty acid amide, a silicone compound comprising dimethylsiloxane, a modified dimethylsiloxane, a polyethylene powder or the like for improving the adhesion to the substrate.

The thickness of the backcoat layer is fundamentally sufficient if it is large enough not to cause scratching of the recording layer described later even without an interleaf. The thickness is preferably from 0.01 to 8 μm. If the thickness is less than 0.01 μm, when lithographic printing plate precursors are stacked on handling, the recording layer can be hardly prevented from scratching, whereas if the thickness exceeds 8 μm, the backcoat layer swells by the chemicals used during the printing or in the periphery of the lithographic printing plate to cause fluctuation in the thickness and this may give rise to change in the printing pressure and in turn deterioration in the printing properties.

For providing the backcoat layer on the back surface of the aluminum substrate, various methods may be used. Examples thereof include a method of coating a solution or dispersion obtained by dissolving or emulsion-dispersing the components for the backcoat layer in an appropriate solvent and drying the solution or dispersion; a method of attaching a previously formed film material to the substrate using an adhesive or heat; and a method of attaching a melt film formed by a melt extruder to the substrate. From the standpoint of ensuring a suitable thickness, the method of dissolving the components for the backcoat layer in an appropriate solvent, and coating and then drying the solution is most preferred. In this method, the organic solvents described in JP-A-62-251739 may be used as the solvent, individually or in combination.

In the manufacture of the lithographic printing plate precursor, whichever the backcoat layer on the back surface or the recording layer on the front surface may be provided earlier on the substrate, or both layers may be provided at the same time.

[Image-Recording Layer]

1. Image-Recording Layer of the First Embodiment

The image-recording layer for use in the present invention is characterized by not containing a hydrophilic binder resin and containing a hydrophobic polymer fine particle of undergoing combination by heat, a light-to-heat converting agent and a water-insoluble compound having fluidity at 50° C.

The hydrophobic polymer fine particle is a thermoplastic hydrophobic polymer fine particle preferably having a coagulation temperature of 35° C. or more, more preferably 50° C. or more. The coagulation temperature of the thermoplastic hydrophobic polymer fine particle has no particular upper limit but this temperature must be sufficiently lower than the decomposition point of the polymer fine particle. When the polymer fine particle is heated to a temperature higher than the coagulation temperature, these polymers are fused and combined to form a hydrophobic agglomerate in the image-recording layer and this part becomes insoluble in water or an aqueous liquid and becomes ink-receptive.

Specific examples of the hydrophobic polymer for forming the hydrophobic polymer fine particle for use in the present invention include homopolymers and copolymers containing a monomer such as ethylene, styrene, vinyl chloride, methyl (meth)acrylate, ethyl (meth)acrylate, vinylidene chloride, acrylonitrile and vinyl carbazole, and a mixture thereof. Among these, particularly preferred are polystyrene and polymethyl methacrylate.

The weight average molecular weight of the polymer constituting the hydrophobic polymer fine particle for use in the present invention is preferably from 5,000 to 1,000,000 and the particle size of the fine particle is preferably from 0.01 to 50 μm, more preferably from 0.05 to 10 μm, most preferably from 0.05 to 2 μm.

The hydrophobic polymer fine particle for use in the present invention may have a heat-reactive functional group. Examples of the heat-reactive functional group include an ethylenic unsaturated group of undergoing a polymerization reaction, such as acryloyl group, methacryloyl group, vinyl group and allyl group; a functional group having an isocyanate group of undergoing an addition reaction or a block form thereof and its reaction partner active hydrogen atom, such as amino group, hydroxyl group and carboxyl group; an epoxy group of undergoing an addition reaction and its reaction partner amino group, carboxy group or hydroxyl group; a carboxyl group of undergoing a condensation reaction and a hydroxyl group or an amino group; an acid anhydride of undergoing a ring-opening addition reaction and an amino group or a hydroxyl group; and a diazonium group of undergoing heat decomposition and reacting with a hydroxyl group. However, insofar as a chemical bond is formed, the functional group may undergo any reaction.

Examples of the polymer fine particle having a heat-reactive functional group for use in the image-recording layer of the present invention include polymer fine particles having an acryloyl group, a methacryloyl group, a vinyl group, an allyl group, an epoxy group, an amino group, a hydroxyl group, a carboxyl group, an isocyanate group, an acid anhydride or a group resulting from protecting these groups. The introduction of this functional group into the polymer fine particle may be performed at the polymerization or may be performed using a polymer reaction after the polymerization.

In the case of performing the introduction at the polymerization, a monomer having such a heat-reactive functional group is preferably emulsion-polymerized or suspension-polymerized. If desired, a monomer not having a heat-reactive functional group may be added as a copolymerization component.

Examples of the monomer having such a functional group include allyl methacrylate, allyl acrylate, vinyl methacrylate, vinyl acrylate, glycidyl methacrylate, glycidyl acrylate, 2-isocyanatoethyl methacrylate or a block isocyanate thereof with an alcohol or the like, 2-isocyanatoethyl acrylate or a block isocyanate thereof with an alcohol or the like, 2-aminoethyl methacrylate, 2-aminoethyl acrylate, 2-hydroxyethyl methacrylate, 2-hydroxyethyl acrylate, acrylic acid, methacrylic acid, maleic anhydride, bifunctional acrylate and bifunctional methacrylate, however, the monomer is not limited thereto.

Examples of the monomer not having a heat-reactive functional group, which can be copolymerized with the above-described monomer, include styrene, alkyl acrylate, alkyl methacrylate, acrylonitrile and vinyl acetate, however, the monomer is not limited thereto insofar as it is a monomer not having a heat-reactive functional group.

Examples of the polymer reaction for use in the case of introducing the heat-reactive functional group after the polymerization include the polymer reaction described in WO96-34316.

The coagulation temperature of the polymer fine particle having a heat-reactive functional group is preferably 70° C. or more and in view of aging stability, more preferably 100° C. or more.

The amount of the hydrophobic polymer fine particle added to the image-recording layer is, in terms of solid content, preferably 50% or more, more preferably 60% or more, based on the solid content in the image-recording layer. Within this range, good image formation can be attained and good printing durability can be obtained.

In order to elevate the sensitivity, the image-recording layer for use in the present invention may contain a light-to-heat converting agent of converting light into heat. The light-to-heat converting agent may be sufficient if it is a substance capable of absorbing infrared light, particularly near infrared light (wavelength: from 700 to 2,000 nm). Various pigments, dyes and metal fine particles can be used.

For example, pigments, dyes and metal fine particles described in JP-A-2001-162960, JP-A-11-235883, *Nippon Insatsu Gakkai Shi* (*Journal of Japan Printing Society*), Vol. 38, pp. 35–40 (2001), and JP-A-2001-213062 may be suitably used.

The pigment is preferably carbon black. Examples of the metal fine particle include fine particles of Si, Al, Ti, V, Cr, Mn, Fe, Co, Ni, Cu, Zn, Y, Zr, Mo, Ag, Au, Pt, Pd, Rh, In, Sn, W, Te, Pb, Ge, Re, Sb, which are a simple substance or an alloy, and an oxide or sulfide thereof. Among these, preferred are Re, Sb, Te, Au, Ag, Cu, Ge, Pb and Sn, more preferred are Ag, Au, Cu, Sb, Ge and Pb. Preferred examples of the dye include the following dyes, however, the present invention is not limited thereto.

(IR-1)

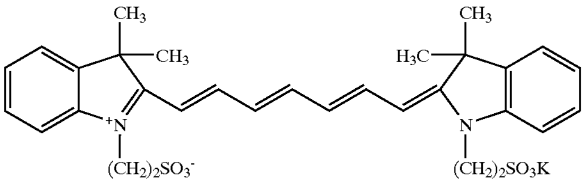

(IR-2)

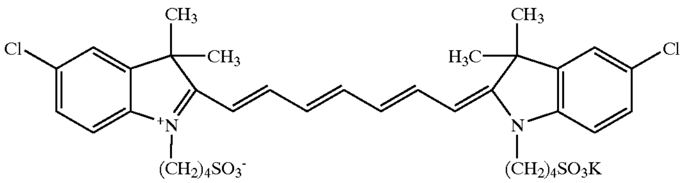

(IR-3)

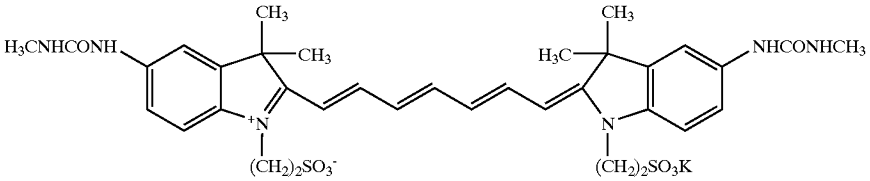

(IR-4)

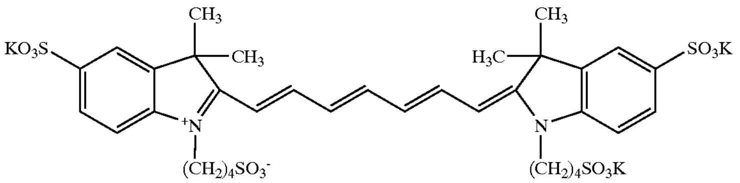

(IR-5)

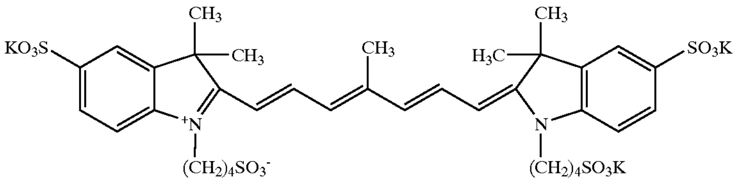

-continued
(IR-6)
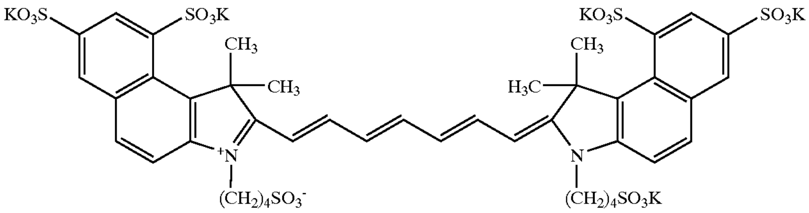
(IR-7)
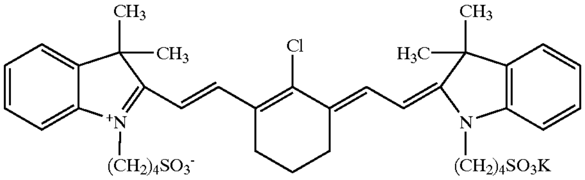
(IR-8)
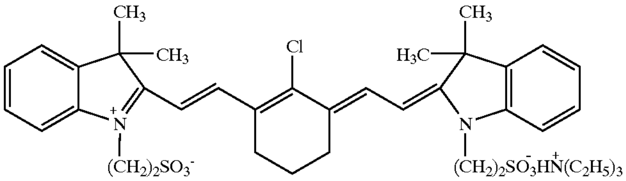
(IR-9)
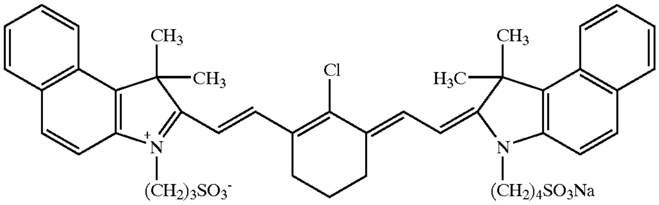
(IR-10)
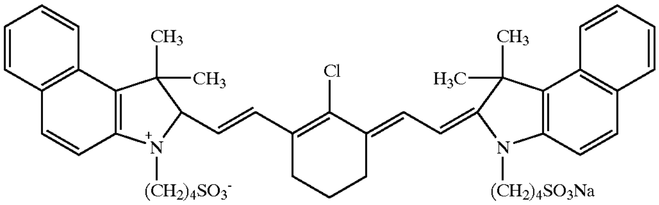
(IR-11)
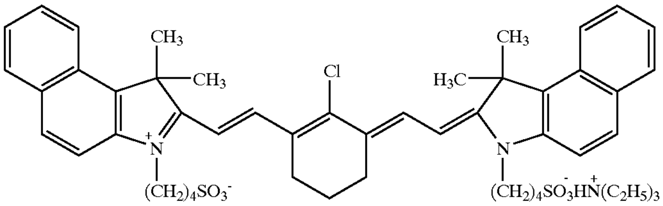
(IR-21)
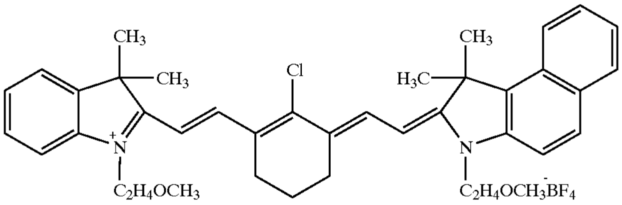

-continued
(IR-22)
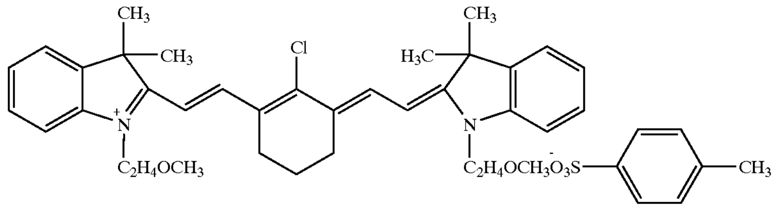
(IR-23)
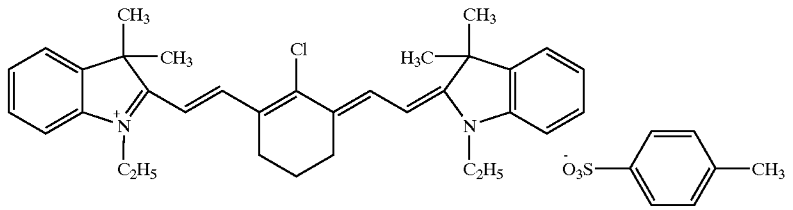
(IR-24)
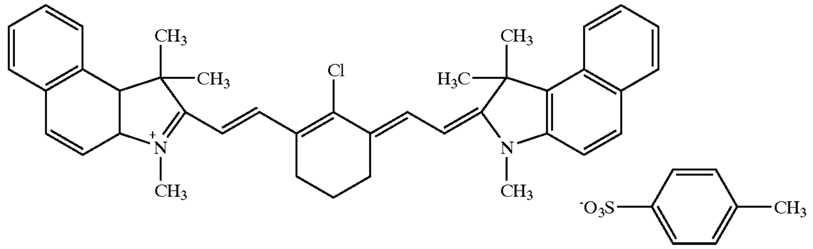
(IR-25)
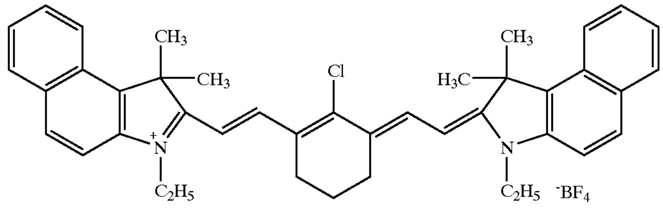
(IR-26)
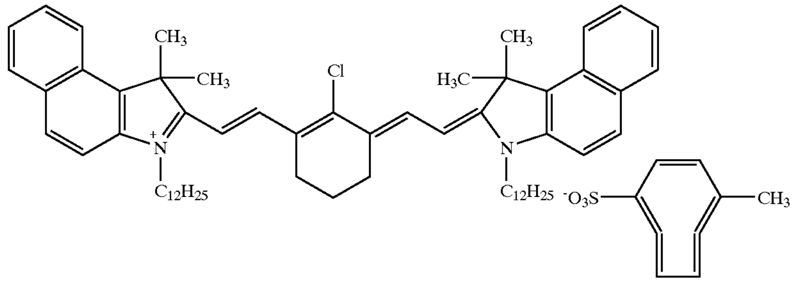

-continued (IR-27)

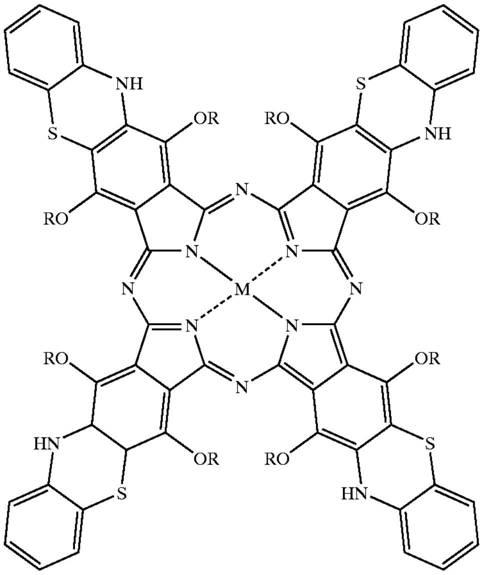

M = VO, R = i-$C_5H_{11}$ (IR-28)

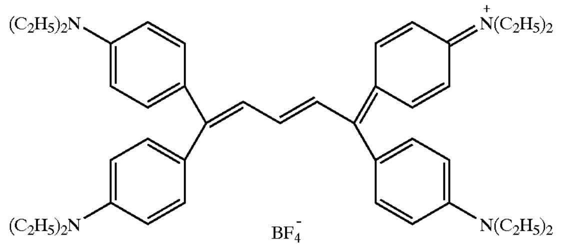

In the case of adding a pigment or a dye as the light-to-heat converting agent to the image-recording layer, the ratio added thereof is preferably from 0.1 to 50%, more preferably from 3 to 25%, to the solid content of the image-recording layer. In the case of using a metal fine particle as the light-to-heat converting agent, the ratio added thereof is preferably 5% or more, more preferably 10% or more, to the solid content of the image-recording layer. Within this range, good sensitivity can be obtained.

Examples of the water-insoluble compound having fluidity at 50° C. contained in the image-recording layer for use in the present invention include esters of an acid and a polyhydric alcohol, or a polybasic acid and an alcohol or a phenol. The compound preferably has a molecular weight of 1,000 or less. Specific examples of the compound include 1,3-butanediol diacrylate, tetramethylene glycol diacrylate, propylene glycol diacrylate, neopentyl glycol diacrylate, trimethylolpropane triacrylate, trimethylolpropane tris (acryloyloxypropyl) ether, trimethylolethane triacrylate, hexanediol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, tris(acryloyloxyethyl) isocyanurate, neopentyl glycol dimethacrylate, trimethylolpropane trimethacrylate, trimethylolethane trimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, bis[p-(3-methacryloyloxy-2-hydroxypropoxy)phenyl]dimethylmethane, bis-[p-(methacryloyloxyethoxy)phenyl]dimethylmethane, ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, tributyl phosphate, trioctyl phosphate and tricresyl phosphate.

In the conventional image-recording layer employing a system of combining hydrophobic polymer fine particles by heat, a hydrophilic binder resin such as gum arabic, casein, gelatin, a starch derivative, carboxymethyl cellulose or a sodium salt thereof, cellulose acetate, sodium alginate, a vinyl acetate-maleic acid copolymer, a styrene-maleic acid copolymer, a polyacrylic acid or a salt thereof, a polymethacrylic acid or a salt thereof, a homopolymer or a copolymer of hydroxyethyl methacrylate, a homopolymer or a copolymer of hydroxyethyl acrylate, a homopolymer or a copolymer of hydroxypropyl methacrylate, a homopolymer or a copolymer of hydroxypropyl acrylate, a homopolymer or a copolymer of hydroxybutyl methacrylate, a homopolymer or a copolymer of hydroxybutyl acrylate, a polyethylene glycol, a hydroxypropylene polymer, a polyvinyl alcohol, a hydrolyzed polyvinyl acetate having a hydrolysis degree of at least 60%, preferably at least 80%, polyvinylformal, polyvinylbutyral, polyvinylpyrrolidone, a homopolymer or a copolymer of acrylamide, a homopolymer or a copolymer of methacrylamide, or a homopolymer or a copolymer of N-methylolacrylamide, is used, however, in the present invention, a lipophilic image-recording layer is formed by using a water-insoluble compound having fluidity at 50° C.

in place of the hydrophilic binder resin. It is presumed that this lipophilic image-recording layer exhibits good inking property even at the imprinting and therefore, high printing durability can be obtained. The lipophilic image-recording layer is prevented from the deterioration of lipophilicity due to mixing of the image-recording layer and an overcoat layer at the coating of the overcoat layer.

The amount of the water-insoluble fluid compound added is preferably from 3 to 30%, more preferably from 5 to 20%, based on the solid content of the image-recording layer. Within this range, good on-press developability and good printing durability can be obtained.

The image-recording layer for use in the present invention may further contain various compounds. For example, a compound which generates an acid or a radical by heat, and a dye which discolors by an acid or a radical may be added, so that after image exposure, the image area and the non-image area can be distinguished from each other.

Examples of the compound which generates an acid or a radical by heat include diallyl iodonium salts and triallyl phosphonium salts described in U.S. Pat. Nos. 3,729,313, 4,058,400, 4,058,401, 4,460,154 and 4,921,827, and halomethyl-1,3,5-triazine compounds and halomethyl-oxadiazole compounds described in U.S. Pat. Nos. 3,987,037, 4,476,215, 4,826,753, 4,619,998, 4,696,888, 4,772,534, 4,189,323, 4,837,128, 5,364,734 and 4,212,970.

As for the dye which discolors by an acid or a radical, various dyes of, for example, diphenylmethane type, triphenylmethane type, thiazine type, oxazine type, xanthene type, anthraquinone type, iminoquinone type, azo type and azomethine type may be effectively used.

Specific examples thereof include dyes such as Brilliant Green, Ethyl Violet, Methyl Green, Crystal Violet, Basic Fuchsine, Methyl Violet 2B, Quinaldine Red, Rose Bengale, Methanyl Yellow, Thymolsulfophthalein, Xylenol Blue, Methyl Orange, Para Methyl Red, Congo Red, Benzopurpurine 4B, α-Naphthyl Red, Nile Blue 2B, Nile Blue A, Methyl Violet, Malachite Green, Para Fuchsine, Victoria Pure Blue BOH [produced by Hodogaya Chemical Co., Ltd.], Oil Blue #603 [produced by Orient Chemical Industry Co., Ltd.], Oil Pink #312 [produced by Orient Chemical Industry Co., Ltd.], Oil Red 5B [produced by Orient Chemical Industry Co., Ltd.], Oil Scarlet #308 [produced by Orient Chemical Industry Co., Ltd.], Oil Red OG [produced by Orient Chemical Industry Co., Ltd.], Oil Red RR [produced by Orient Chemical Industry Co., Ltd.], Oil Green #502 [produced by Orient Chemical Industry Co., Ltd.], Spiron Red BEH Special [produced by Hodogaya Chemical Co., Ltd.], m-Cresol Purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carbostearylamino-4-p-dihydroxyethylaminophenyliminonaphthoquinone, 1-phenyl-3-methyl-4-p-diethylaminophenylimino-5-pyrazolone and 1-β-naphthyl-4-p-diethylaminophenylimino-5-pyrazolone, and leuco dyes such as p,p',p"-hexamethyltriaminotriphenylmethane (Leuco Crystal Violet) and Pergascript Blue SRB [produced by Ciba Geigy].

The amounts added of the compound which generates an acid or a radical, and the dye which discolors by an acid or a radical each is suitably from 0.01 to 10% based on the solid content of the image-recording layer.

In the image-recording layer for use in the present invention, a slight amount of a thermopolymerization inhibitor may be added so as to inhibit unnecessary thermopolymerization during preparation or storage of the coating solution for the image-recording layer. Suitable examples of the thermopolymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol) and N-nitroso-N-phenylhydroxylamine aluminum salt. The amount of the thermopolymerization inhibitor added is preferably from about 0.01% to 5% based on the weight of the entire composition.

If desired, a higher fatty acid or a derivative thereof, such as behenic acid or behenic acid amide, may be added and allowed to localize on the surface of the image-recording layer in the process of drying after the coating so as to prevent polymerization inhibition by oxygen. The amount added of the higher fatty acid or a derivative thereof is preferably from about 0.1% to about 10% based on the solid content of the image-recording layer.

The image-recording layer of the present invention may contain an inorganic fine particle and suitable examples of the inorganic fine particle include silica, alumina, magnesium oxide, titanium oxide, magnesium carbonate, calcium alginate and a mixture thereof. This inorganic fine particle may be used for strengthening the film or for strengthening the interface adhesion by surface roughening, even if it does not have light-to-heat converting property.

The average particle size of the inorganic fine particle is preferably from 5 nm to 10 μm, more preferably from 10 nm to 1 μm. With the particle size in this range, the inorganic particle can be stably dispersed in the hydrophilic resin together with the resin fine particle or the metal fine particle as a light-to-heat converting agent, so that the image-recording layer can maintain sufficiently high film strength and the non-image area formed can be difficult of staining at printing and have excellent hydrophilicity.

Such an inorganic fine particle is easily available on the market as a colloidal silica dispersion or the like. The amount of the inorganic fine particle contained in the image-recording layer is preferably from 1.0 to 70%, more preferably from 5.0 to 50%, based on the entire solid content of the image-recording layer.

In the case of using the polymer fine particle having a heat-reactive group, a compound capable of initiating or accelerating the reaction thereof may be added, if desired, to the image-recording layer of the present invention. The compound capable of initiating or accelerating the reaction includes a compound which generates a radical or a cation by heat. Examples thereof include a lophine dimer, a trihalomethyl compound, a peroxide, an azo compound, an onium salt including diazonium salt and diphenyl iodonium salt, an acyl phosphine and an imidosulfonate.

This compound is added in the range from 1 to 20%, preferably from 3 to 10%, based on the solid content of the image-recording layer. Within this range, good reaction initiating or accelerating effect can be obtained without impairing the on-press developability.

For forming the image-recording layer of the present invention, necessary components described above are dissolved in a solvent to prepare a coating solution and the coating solution is coated on the image-recording layer. Examples of the solvent which can be used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water, however, the present invention is not limited thereto. These solvents are used individually or in combination. The solid content concentration of the coating solution is preferably from 1 to 50%.

In the coating solution for the image-recording layer for use in the present invention, a surfactant such as fluorine-containing surfactant described in JP-A-62-170950 may be added so as to attain good coatability. The amount of the surfactant added is preferably from 0.01 to 1%, more preferably from 0.05 to 0.5%, based on the entire solid content of the image-recording layer.

The dry coated amount of the image-recording layer for use in the present invention varies depending on use end but in general, is preferably from 0.5 to 5.0 $g/m^2$. If the coated amount is less than this range, high apparent sensitivity may be obtained but the image-recording layer of performing the image-recording function is decreased in the film properties. For coating the coating solution, various methods may be used. Examples thereof include bar coater coating, rotary coating, spray coating, curtain coating, dip coating, air knife coating, blade coating and roll coating.

2. Image-Recording Layer of the Second Embodiment

The image-recording layer for use in the present invention contains at least two kinds of fine polymers selected from (a) a heat-fusible polymer fine particle, (b) a polymer fine particle having a heat-reactive functional group and (c) a microcapsule containing therein a heat-reactive compound. At least one kind of polymers undergo the combination by heat to render the hydrophilic image-recording layer hydrophobic and thereby, an image is formed. The combination of fine particles by heat takes place upon application of heat or by either one or both of the softening or melting of fine particles and the reaction of heat-reactive functional group.

The at least two kinds of fine particles contained in the image-recording layer for use in the present invention may be at least two kinds of fine particles selected from different categories out of those categories (a), (b) and (c), or may be at least two kinds of fine particles belonging to the same category.

The heat-fusible polymer fine particle for use in the image-recording layer of the present invention is preferably a heat-fusible polymer fine particle having a coagulation temperature of 35° C. or more, more preferably 50° C. or more. The coagulation temperature of the heat-fusible polymer fine particle has no particular upper limit, however, this temperature must be sufficiently lower than the decomposition point of the polymer fine particle. When the polymer fine particle is heated to a temperature higher than the coagulation temperature, the particles are fused and combined to form a hydrophobic agglomerate in the image-recording layer and this part becomes insoluble in water or an aqueous liquid and becomes ink-receptive.

Specific examples of the hydrophobic polymer for forming the heat-fusible polymer fine particle for use in the image-recording layer of the present invention include homopolymers and copolymers from a monomer such as ethylene, styrene, vinyl chloride, methyl (meth)acrylate, ethyl (meth)acrylate, vinylidene chloride, acrylonitrile and vinyl carbazole, and a mixture thereof. Among these, particularly preferred are polystyrene and polymethyl methacrylate.

The weight average molecular weight of the polymer constituting the heat-fusible polymer fine particle for use in the present invention is preferably from 5,000 to 1,000,000 and the particle size of the heat-fusible polymer fine particle is preferably from 0.01 to 50 μm, more preferably from 0.05 to 10 μm, most preferably from 0.05 to 2 μm.

Examples of the heat-reactive functional group in the polymer fine particle having a heat-reactive functional group or in the microcapsule containing therein a compound having a heat-reactive functional group for use in the present invention include an ethylenic unsaturated group of undergoing a polymerization reaction, such as acryloyl group, methacryloyl group, vinyl group and allyl group; a functional group having an isocyanate group of undergoing an addition reaction or a block form thereof and its reaction partner active hydrogen atom, such as amino group, hydroxyl group and carboxyl group; an epoxy group of undergoing an addition reaction and its reaction partner amino group, carboxy group or hydroxyl group; a carboxyl group of undergoing a condensation reaction and a hydroxyl group or an amino group; an acid anhydride of undergoing a ring-opening addition reaction and an amino group or a hydroxyl group; and a diazonium group of undergoing heat decomposition and reacting with a hydroxyl group. However, insofar as a chemical bond is formed, the functional group may undergo any reaction.

Examples of the polymer fine particle having a heat-reactive functional group for use in the image-recording layer of the present invention include polymer fine particles having an acryloyl group, a methacryloyl group, a vinyl group, an allyl group, an epoxy group, an amino group, a hydroxyl group, a carboxyl group, an isocyanate group, an acid anhydride or a group resulting from protecting these groups. The introduction of this functional group into the polymer fine particle may be performed at the polymerization or may be performed using a polymer reaction after the polymerization.

In the case of performing the introduction at the polymerization, a monomer having such a heat-reactive functional group is preferably emulsion-polymerized or suspension-polymerized. If desired, a monomer not having a heat-reactive functional group may be added as a copolymerization component.

Examples of the monomer having such a functional group include allyl methacrylate, allyl acrylate, vinyl methacrylate, vinyl acrylate, glycidyl methacrylate, glycidyl acrylate, 2-isocyanatoethyl methacrylate or a block isocyanate thereof with an alcohol or the like, 2-isocyanatoethyl acrylate or a block isocyanate thereof with an alcohol or the like, 2-aminoethyl methacrylate, 2-aminoethyl acrylate, 2-hydroxyethyl methacrylate, 2-hydroxyethyl acrylate, acrylic acid, methacrylic acid, maleic anhydride, bifunctional acrylate and bifunctional methacrylate, however, the monomer is not limited thereto.

Examples of the monomer not having a heat-reactive functional group, which can be copolymerized with the above-described monomer, include styrene, alkyl acrylate, alkyl methacrylate, acrylonitrile and vinyl acetate, however, the monomer is not limited thereto insofar as it is a monomer not having a heat-reactive functional group.

Examples of the polymer reaction for use in the case of introducing the heat-reactive functional group after the polymerization include the polymer reaction described in WO96-34316.

Among polymer fine particles having the heat-reactive functional group, those of undergoing the combination of polymer fine particles with each other by heat are preferred, and those having a hydrophilic surface and being dispersible in water are more preferred. The contact angle (water droplet in air) of a film manufactured by coating only a polymer fine particle and drying it at a temperature lower than the coagulation temperature is preferably lower than the contact angle (water droplet in air) of a film manufactured by drying it at a temperature higher than the coagulation temperature. The polymer fine particle surface may be rendered hydrophilic by allowing a hydrophilic polymer or oligomer such as polyvinyl alcohol or polyethylene glycol, or a hydrophilic low molecular compound to be adsorbed to the polymer fine particle surface, however, the method is not limited thereto.

The coagulation temperature of the polymer fine particle having a heat-reactive functional group is preferably 70° C. or more and in view of aging stability, more preferably 100° C. or more. The average particle size of the polymer fine particle is preferably from 0.01 to 20 μm, more preferably from 0.05 to 2.0 μm, most preferably from 0.1 to 1.0 μm. If the average particle size is excessively large, bad resolution results, whereas if it is too small, the aging stability changes for the worse.

The microcapsule for use in the present invention contains therein a compound having a heat-reactive functional group. Examples of the compound having a heat-reactive functional group include compounds having at least one functional group selected from a polymerizable unsaturated group, a hydroxyl group, a carboxyl group, a carboxylate group, an acid anhydride, an amino group, an epoxy group, and an isocyanate group or a block form thereof.

The compound having a polymerizable unsaturated is preferably a compound having at least one, preferably two or more, ethylenic unsaturated double bond, for example, an acryloyl group, a methacryloyl group, a vinyl group and an allyl group. Such compounds are widely known in this industrial field and can be used in the present invention without any particular limitation. These compounds have a chemical form such as monomer, prepolymer, namely dimer, trimer or oligomer, or a mixture or copolymer thereof.

Examples thereof include unsaturated carboxylic acids (e.g., acrylic acid, methacrylic acid, itaconic acid, crotonic acid, isocrotonic acid, maleic acid) and esters or amides thereof. Among these, preferred are esters of an unsaturated carboxylic acid with an aliphatic polyhydric alcohol, and amides of an unsaturated carboxylic acid with an aliphatic polyhydric amine. Also, an addition reaction product of a monofunctional or polyfunctional isocyanate or epoxy, or a dehydration condensation reaction product of a monofunctional or polyfunctional carboxylic acid, with an unsaturated carboxylic acid ester or amide having a nucleophilic substituent such as hydroxyl group, amino group or mercapto group, is suitably used. Furthermore, an addition reaction product of an unsaturated carboxylic acid ester or amide having an electrophilic substituent such as isocyanato group or epoxy group with a monofunctional or polyfunctional alcohol, amine or thiol, or a substitution reaction product of an unsaturated carboxylic acid ester or amide having a releasable substituent such as halogen group or tosyloxy group with a monofunctional or polyfunctional alcohol, amine or thiol, is also suitably used. Other than these, compounds resulting from replacing the unsaturated carboxylic acid by an unsaturated phosphonic acid or chloromethylstyrene can also be used.

Specific examples of the polymerizable compound, which is an ester of an aliphatic polyhydric alcohol compound with an unsaturated carboxylic acid, include the followings. Specific examples of the acrylic acid ester include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane diacrylate, trimethylolpropane triacrylate, trimethylolpropane tris-(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tris(acryloyloxyethyl) isocyanurate and polyester acrylate oligomer.

Specific examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane.

Specific examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Specific examples of the crotonic acid ester include ethylene glycol dicrotonate, tetramethylene glycol dicrotonate, pentaerythritol dicrotonate and sorbitol tetradicrotonate. Specific examples of the isocrotonic acid ester include ethylene glycol diisocrotonate, pentaerythritol diisocrotonate and sorbitol tetraisocrotonate. Specific examples of the maleic acid ester include ethylene glycol dimaleate, triethylene glycol dimaleate, pentaerythritol dimaleate and sorbitol tetramaleate.

Examples of other esters include aliphatic alcohol-base esters described in JP-B-46-27926, JP-B-51-47334 and JP-A-57-196231, those having an aromatic skeleton described in JP-A-59-5240, JP-A-59-5241 and JP-A-2-226149, and those containing an amino group described in JP-A-1-165613.

Specific examples of the amide monomer of an aliphatic polyvalent amine compound with an unsaturated carboxylic acid include methylene bis-acrylamide, methylene bis-methacrylamide, 1,6-hexamethylene bis-acrylamide, 1,6-hexamethylene bis-methacrylamide, diethylenetriamine trisacrylamide, xylylene bis-acrylamide and xylylene bis-methacrylamide. Other preferred examples of the amide-base monomer include those having a cyclohexylene structure described in JP-B-54-21726.

A urethane-base addition polymerizable compound produced using an addition reaction between an isocyanate and a hydroxyl group is also suitably used and specific examples thereof include urethane compounds having two or more polymerizable unsaturated groups within one molecule obtained by adding an unsaturated monomer containing a hydroxyl group represented by the following formula (II) to a polyisocyanate compound having two or more isocyanate groups within one molecule, described in JP-B-48-41708.

$$CH_2{=}C(R^1)COOCH_2CH(R^2)OH \quad (II)$$

wherein $R^1$ and $R^2$ each represents H or $CH_3$.

Also, urethane acrylates described in JP-A-51-37193, JP-B-2-32293 and JP-B-2-16765, and urethane compounds having an ethylene oxide-base skeleton described in JP-B-58-49860, JP-B-56-17654, JP-B-62-39417 and JP-B-62-39418 may be suitably used.

Furthermore, radical polymerizable compounds having an amino structure or a sulfide structure within the molecule described in JP-A-63-277653, JP-A-63-260909 and JP-A-1-105238 may also be suitably used.

Other suitable examples include polyfunctional acrylates and methacrylates such as polyester acrylates and epoxy acrylates obtained by reacting an epoxy resin with a (meth) acrylic acid, described in JP-A-48-64183, JP-B-49-43191 and JP-B-52-30490. Specific unsaturated compounds described in JP-B-46-43946, JP-B-1-40337 and JP-B-1-40336, and vinylphosphonic acid-base compounds described in JP-A-2-25493 may also be suitably used. In some cases, the compounds containing a perfluoroalkyl group described in JP-A-61-22048 may be suitably used. Also, those described as a photocurable monomer or oligomer in *Nippon Secchaku Kyokai Shi* (*Journal of Japan Adhesion Society*), Vol. 20, No. 7, pp. 300–308 (1984) can be suitably used.

Suitable examples of the epoxy compound include glycerin polyglycidyl ether, polyethylene glycol diglycidyl ether, polypropylene diglycidyl ether, trimethylolpropane polyglycidyl ether, sorbitol polyglycidyl ether, and polyglycidyl ether of bisphenols, polyphenols or a hydrogenation product thereof.

Suitable examples of the isocyanate compound include tolylene diisocyanate, diphenylmethane diisocyanate, polymethylene polyphenyl polyisocyanate, xylylene diisocyanate, naphthalene diisocyanate, cyclohexane phenylene diisocyanate, isophorone diisocyanate, hexamethylene diisocyanate, cyclohexyl diisocyanate, and compounds resulting from blocking these isocyanate compounds with an alcohol or an amine.

Suitable examples of the amine compound include ethylenediamine, diethylenetriamine, triethylenetetramine, hexamethylenediamine, propylenediamine and polyethyleneimine.

Suitable examples of the compound having a hydroxyl group include compounds having a terminal methylol group, polyhydric alcohols such as trimethylolpropane and pentaerythritol, bisphenol and polyphenols.

Preferred examples of the compound having a carboxyl group include aromatic polyvalent carboxylic acids such as pyromellitic acid, trimellitic acid and phthalic acid, and aliphatic polyvalent carboxylic acids such as adipic acid.

Other than these, suitable examples of the compound having a hydroxyl group or a carboxyl group include the compounds known as a binder for existing PS plates, described in JP-B-54-19773, JP-B-55-34929 and JP-B-57-43890.

Suitable examples of the acid anhydride include pyromellitic anhydride and benzophenone tetracarboxylic anhydride.

Suitable examples of the copolymer of an ethylenic unsaturated compound include copolymer of allyl methacrylate, such as allyl methacrylate/methacrylic acid copolymer, allyl methacrylate/ethyl methacrylate copolymer, and allyl methacrylate/butyl methacrylate copolymer.

Suitable examples of the diazo resin include hexafluorophosphate and aromatic sulfonate of diazodiphenylamine-formalin diphenylamine.formalin condensed resin The method for the encapsulation may be a known method. Examples of the method for producing a microcapsule include a method using coacervation described in U.S. Pat. Nos. 2,800,457 and 2,800,458, a method using interfacial polymerization described in British Patent 990,443, U.S. Pat. No. 3,287,154, JP-B-38-19574, JP-B-42-446 and JP-B-42-771, a method using polymer precipitation described in U.S. Pat. Nos. 3,418,250 and 3,660,304, a method using an isocyanate polyol wall material described in U.S. Pat. No. 3,796,669, a method using an isocyanate wall material described in U.S. Pat. No. 3,914,511, a method using a urea-formaldehyde or urea-formaldehyde-resorcinol wall material described in U.S. Pat. Nos. 4,001,140, 4,087,376 and 4,089,802, a method using a wall material such as melamine-formaldehyde resin or hydroxy cellulose described in U.S. Pat. No. 4,025,455, an in situ method using monomer polymerization described in JP-B-36-9163 and JP-A-51-9079, a spray drying method described in British Patent 930,422 and U.S. Pat. No. 3,111,407, and an electrolytic dispersion cooling method described in British Patents 952,807 and 967,074. However, the present invention is not limited thereto.

The microcapsule wall for use in the present invention preferably has a three-dimensional crosslink and has properties of swelling by a solvent. In this viewpoint, the wall material of the microcapsule is preferably polyurea, polyurethane, polyester, polycarbonate, polyamide or a mixture thereof, more preferably polyurea or polyurethane. The compound having a heat-reactive functional group may be introduced into the microcapsule wall.

The average particle size of the microcapsule is preferably from 0.01 to 20 $\mu$m, more preferably from 0.05 to 2.0 $\mu$m, still more preferably from 0.10 to 1.0 $\mu$m. If the average particle size is excessively large, bad resolution results, whereas if it is too small, the aging stability changes for the worse.

These microcapsules may combine with each other by heat or may not combine. It may suffice if the content of microcapsule, bled out to the capsule surface or from the microcapsule or impregnated into the microcapsule wall, causes a chemical reaction by heat. The content may react with a hydrophilic resin added or a low molecular compound added. Also, it may be possible to produce two or more kinds of microcapsules having different functional groups which thermally react with each other, and react the microcapsules with each other. Accordingly, although the microcapsules are preferably fused and combined by heat in view of image formation, this is not essential.

The amount of the heat-fusible polymer fine particle, the polymer fine particle having a heat-reactive functional group or the microcapsule added to the image-recording layer is, in terms of solid content, preferably 50% or more, more preferably 60% or more, based on the solid content in the image-recording layer. Within this range, good image formation can be attained and good printing durability can be obtained.

In order to elevate the sensitivity, the image-recording layer for use in the present invention may contain a light-to-heat converting agent having a function of converting light into heat. The light-to-heat converting agent may be sufficient if it is a substance capable of absorbing light at 700 nm or more. Various pigments and dyes can be used.

The kind of pigment includes black pigment, brown pigment, red pigment, violet pigment, blue pigment, green pigment, fluorescent pigment, metal powder pigment and polymer bond pigment. Specific examples of the pigment which can be used include insoluble azo pigments, azo lake pigments, condensed azo pigments, chelate azo pigments, phthalocyanine-base pigments, anthraquinone-base pigments, perylene- and perynone-base pigments, thioindigo-base pigments, quinacridone-base pigments, dioxazine-base pigments, isoindolinone-base pigments, quinophthalone-base pigments, dyed lake pigments, azine pigments, nitroso pigments, nitro pigments, natural pigments, fluorescent pigments, inorganic pigments and carbon black. Among these, carbon black is preferred as a pigment capable of absorbing an infrared ray.

These pigments may or may not be surface-treated before use. For the surface treatment, a known method such as a method of coating a hydrophilic or lipophilic resin on the surface, a method of attaching a surfactant, and a method of bonding a reactive substance (for example, silica sol, alumina sol, silane coupling agent, epoxy compound or isocyanate compound) to the pigment surface, may be used.

In the case of adding the pigment to a hydrophilic layer like the image-recording layer for use in the present invention, carbon black surface-coated with a hydrophilic resin or silica sol is preferred because the dispersion with a water-soluble or hydrophilic resin is facilitated and at the same time, the hydrophilic property is not impaired.

The particle size of the pigment is preferably from 0.01 to 1 μm, more preferably from 0.01 to 0.5 μm. For dispersing the pigment, a known dispersion technique for use in the production of ink or toner may be used.

As the dye, commercially available dyes and known dyes described in publications (for example, *Senryo Binran* (*Handbook of Dyes*), compiled by Yuki Gosei Kagaku Kyokai (1970), "Kinsekigai Kyushu Shikiso (Near Infrared Absorbing Dyes)" of *Kagaku Kogyo* (*Chemical Industry*), pp. 45–51 (May, 1986), and 90 *Nen Dai Kinosei Shikiso no Kaihatsu to Shijo Doko* (*Development and Movement on Market of Functional Dyes in* 90*s*), Chap. 2, Item 2.3, CMC (1990)) or patents may be used. Specific preferred examples thereof include infrared absorbing dyes such as azo dye, metal complex salt azo dye, pyrazolone azo dye, anthraquinone dye, phthalocyanine dye, carbonium dye, quinoneimine dye, polymethine dye and cyanine dye.

Examples thereof include cyanine dyes described in JP-A-58-125246, JP-A-59-84356, JP-A-60-78787, JP-A-58-173696, JP-A-58-194595, JP-A-59-216146, British Patent 434,875 and U.S. Pat. No. 4,973,572, cyanine dyes and azomethine dyes described in U.S. Pat. No. 4,756,993, methine dyes described in JP-A-58-181690, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, phthalocyanine compounds described in JP-A-11-235883 and various dyes described in JP-A-10-268512.

As the dye, the near infrared absorbing sensitizers described in U.S. Pat. No. 5,156,938 may also be suitably used. Also, substituted arylbenzo(thio)pyrylium salts described in U.S. Pat. No. 3,881,924, trimethinethiapyrylium salts described in JP-A-57-142645, pyrylium-base compounds described in JP-A-58-181051, JP-A-58-220143, JP-A-59-41363, JP-A-59-84248, JP-59-84249, JP-A-59-146063, JP-A-59-146061, JP-B-5-13514 and JP-B-5-19702, pentamethinethiopyrylium salts described in U.S. Pat. No. 4,283,475, and Epolight III-178, Epolight III-130, Epolight and III-125 produced by Epolin may be suitably used.

Among these, dyes having a water-soluble group are preferred as the dye added to the image-recording layer. Specific examples of the structural formula thereof are set forth below.

(IR-1)

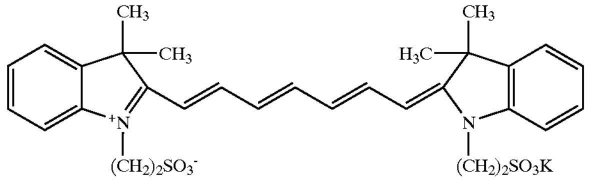

(IR-2)

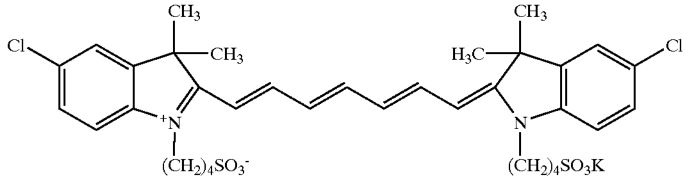

(IR-3)

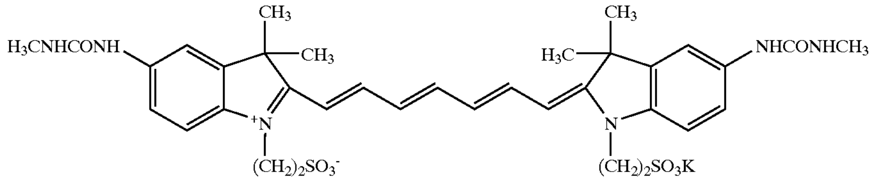

(IR-4)

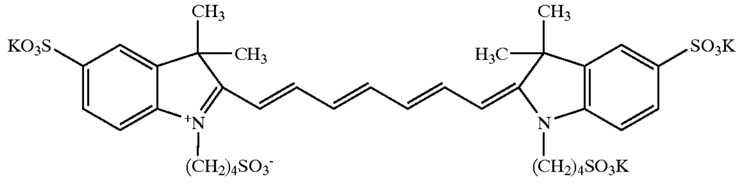

-continued
(IR-5)
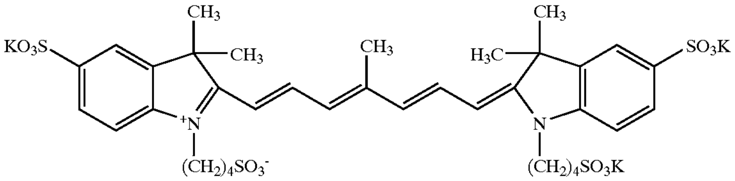
(IR-6)
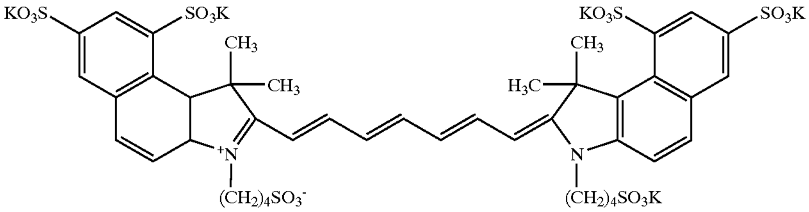
(IR-7)
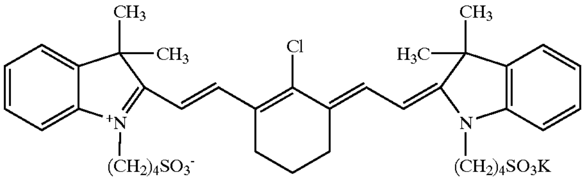
(IR-8)
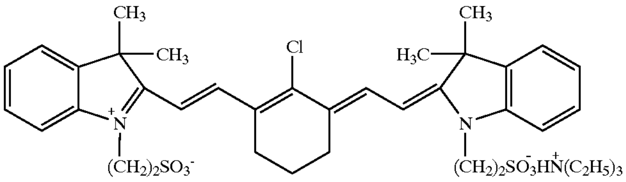
(IR-9)
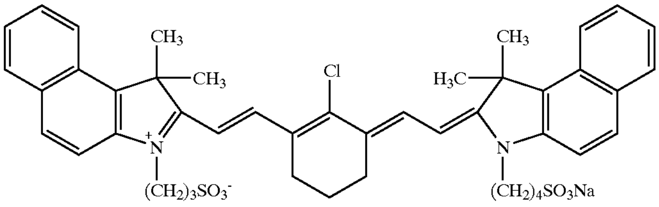
(IR-10)
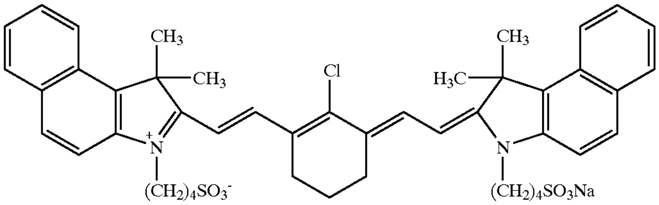
(IR-11)
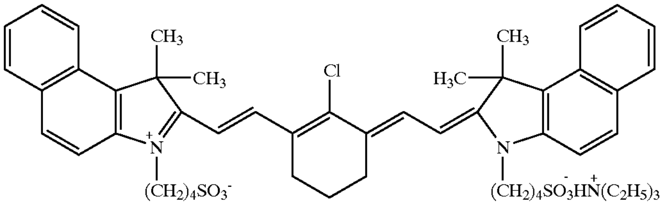

In the case of adding a light-to-heat converting agent to a lipophilic substance such as polymer fine particle or inside the microcapsule, the above-described infrared absorbing pigment or dye may be used but is preferably higher in the lipophilicity. Suitable examples thereof include the following dyes.
(IR-21)
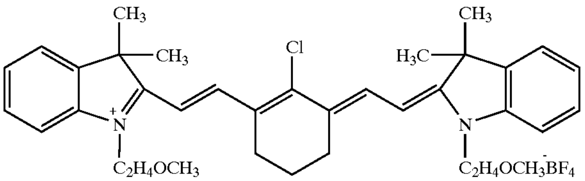
(IR-22)
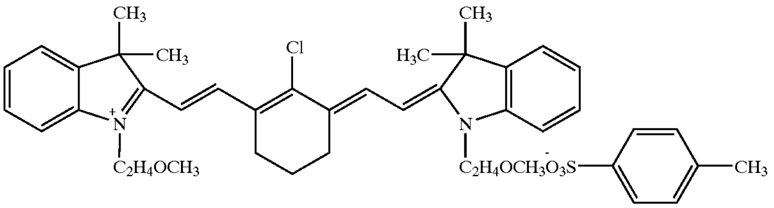
(IR-23)
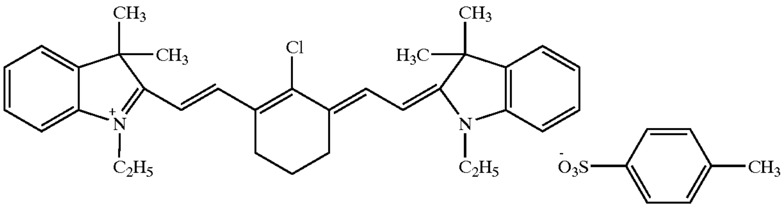
(IR-24)
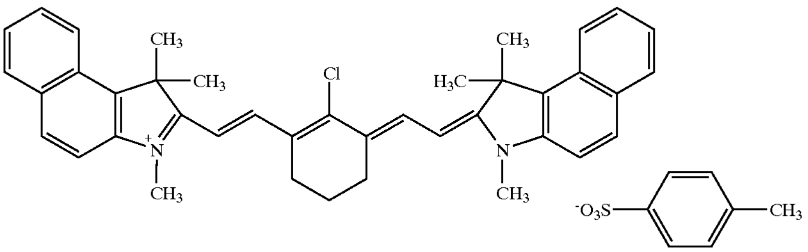
(IR-25)
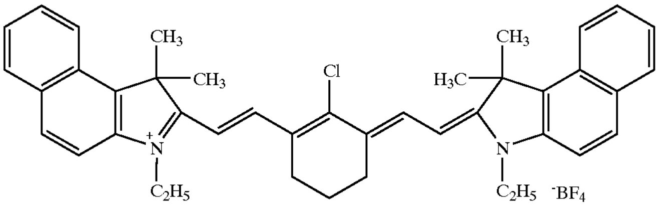
(IR-26)
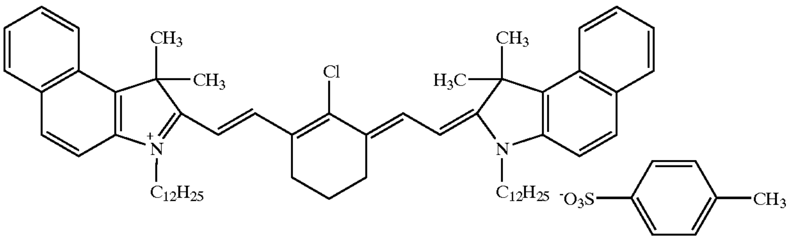

-continued (IR-27)

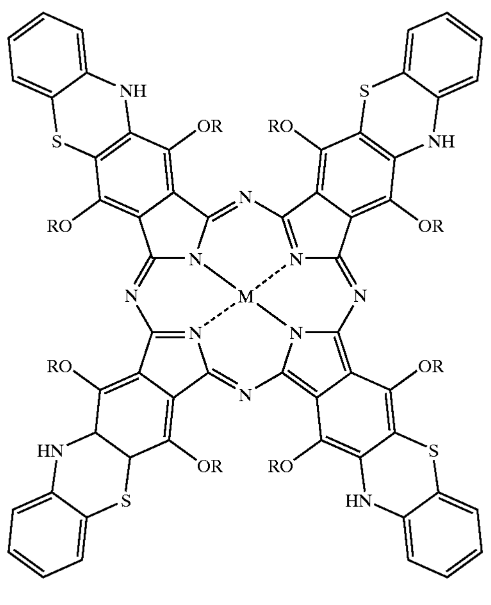

M = VO, R = i-$C_5H_{11}$ (IR-28)

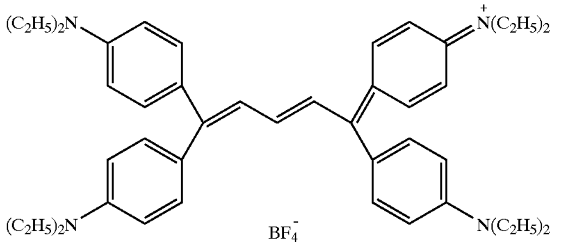

The ratio of the light-to-heat converting agent added to the image-recording layer is preferably from 0.1 to 50 wt %, more preferably from 3 to 25 wt %, to the solid content in the image-receiving layer. Within this range, good sensitivity can be obtained without impairing the film strength of the image-recording layer.

In the image-receiving layer for use in the present invention, a hydrophilic resin may be added. By adding a hydrophilic resin, not only good on-press developability can be attained but also the film strength of the image-recording layer itself can be improved.

The hydrophilic resin is preferably a resin having a hydrophilic group such as hydroxyl group, hydroxyethyl group, hydroxypropyl group, amino group, aminoethyl group, aminopropyl group, carboxyl group, carboxylate group, sulfo group, sulfonate group or phosphoric acid group.

Specific examples of the hydrophilic resin include gum arabic, casein, gelatin, starch derivatives, carboxymethyl cellulose and sodium salt thereof, cellulose acetate, sodium alginate, vinyl acetate-maleic acid copolymers, styrene-maleic acid copolymers, polyacrylic acids and salts thereof, polymethacrylic acids and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having a hydrolysis degree of at least 60%, preferably at least 80%, polyvinylformal, polyvinylbutyral, polyvinylpyrrolidone, homopolymers and copolymers of acrylamide, homopolymers and copolymers of methacrylamide, and homopolymers and copolymers of N-methylolacrylamide.

The amount of the hydrophilic resin added to the image-recording layer is preferably from 5 to 40%, more preferably from 10 to 30%, based on the solid content in the image-recording layer. Within this range, good on-press developability and sufficiently high film strength can be obtained.

In the image-recording layer for use in the present invention, various compounds other than those described above may further be added, if desired. For example, in order to more improve the printing durability, a polyfunctional monomer may be added to the image-recording layer. Examples of the polyfunctional monomer which can be used include those described as examples of the monomer contained in the microcapsule. Among these monomers, particularly preferred is trimethylolpropane acrylate.

The image-recording layer for use in the present invention may contain a crosslinking agent, if desired. Suitable examples of the crosslinking agent include low molecular compounds having a methylol group, such as melamine-formaldehyde resin, hydantoin-formaldehyde resin, thiourea-formaldehyde resin and benzoguanamine-formaldehyde resin.

The image-recording layer for use in the present invention may contain a compound which generates an acid or a radical by heat, and a dye which discolors by an acid or a radical, so that after image exposure, the image area and the non-image area can be distinguished from each other.

Examples of the compound which generates an acid or a radical by heat include diallyl iodonium salts and triallyl phosphonium salts described in U.S. Pat. Nos. 3,729,313, 4,058,400, 4,058,401, 4,460,154 and 4,921,827, and halomethyl-1,3,5-triazine compounds and halomethyl-oxadiazole compounds described in U.S. Pat. Nos. 3,987,037, 4,476,215, 4,826,753, 4,619,998, 4,696,888, 4,772,534, 4,189,323, 4,837,128, 5,364,734 and 4,212,970.

As for the dye which discolors by an acid or a radical, various dyes of, for example, diphenylmethane type, triphenylmethane type, thiazine type, oxazine type, xanthene type, anthraquinone type, iminoquinone type, azo type and azomethine type may be effectively used.

Specific examples thereof include dyes such as Brilliant Green, Ethyl Violet, Methyl Green, Crystal Violet, Basic Fuchsine, Methyl Violet 2B, Quinaldine Red, Rose Bengale, Methanyl Yellow, Thymolsulfophthalein, Xylenol Blue, Methyl Orange, Para Methyl Red, Congo Red, Benzopurpurine 4B, α-Naphthyl Red, Nile Blue 2B, Nile Blue A, Methyl Violet, Malachite Green, Para Fuchsine, Victoria Pure Blue BOH [produced by Hodogaya Chemical Co., Ltd.], Oil Blue #603 [produced by Orient Chemical Industry Co., Ltd.], Oil Pink #312 [produced by Orient Chemical Industry Co., Ltd.], Oil Red 5B [produced by Orient Chemical Industry Co., Ltd.], Oil Scarlet #308 [produced by Orient Chemical Industry Co., Ltd.], Oil Red OG [produced by Orient Chemical Industry Co., Ltd.], Oil Red RR [produced by Orient Chemical Industry Co., Ltd.], Oil Green #502 [produced by Orient Chemical Industry Co., Ltd.], Spiron Red BEH Special [produced by Hodogaya Chemical Co., Ltd.], m-Cresol Purple, Cresol Red, Rhodamine B, Rhodamine 6G, Sulforhodamine B, Auramine, 4-p-diethylaminophenyl-iminonaphthoquinone, 2-carboxyanilino-4-p-diethylamino-phenyliminonaphthoquinone, 2-carbostearylamino-4-p-dihydroxyethylaminophenyliminonaphthoquinone, 1-phenyl-3-methyl-4-p-diethylaminophenylimino-5-pyrazolone and 1-β-naphthyl-4-p-diethylaminophenylimino-5-pyrazolone, and leuco dyes such as p,p',p"-hexamethyltriaminotriphenyl-methane (Leuco Crystal Violet) and Pergascript Blue SRB [produced by Ciba Geigy].

The amounts added of the compound which generates an acid or a radical, and the dye which discolors by an acid or a radical each is suitably from 0.01 to 10% based on the solid content of the image-recording layer.

In the present invention, in the case of using an ethylenic unsaturated compound, a slight amount of a thermopolymerization inhibitor is preferably added so as to inhibit unnecessary thermopolymerization during preparation or storage of the coating solution for the image-recording layer. Suitable examples of the thermopolymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol) and N-nitroso-N-phenylhydroxylamine aluminum salt. The amount of the thermopolymerization inhibitor added is preferably from about 0.01% to 5% based on the weight of the entire composition.

If desired, a higher fatty acid or a derivative thereof, such as behenic acid or behenic acid amide, may be added and allowed to localize on the surface of the image-recording layer in the process of drying after the coating so as to prevent polymerization inhibition by oxygen. The amount added of the higher fatty acid or a derivative thereof is preferably from about 0.1% to about 10% based on the solid content of the image-recording layer.

The image-recording layer of the present invention may contain an inorganic fine particle and suitable examples of the inorganic fine particle include silica, alumina, magnesium oxide, titanium oxide, magnesium carbonate, calcium alginate and a mixture thereof. This inorganic fine particle may be used for strengthening the film or for strengthening the interface adhesion by surface roughening, even if it does not have light-to-heat converting property.

The average particle size of the inorganic fine particle is preferably from 5 nm to 10 μm, more preferably from 10 nm to 1 μm. With the particle size in this range, the inorganic particle can be stably dispersed in the hydrophilic resin together with the resin fine particle or the metal fine particle as a light-to-heat converting agent, so that the image-recording layer can maintain sufficiently high film strength and the non-image area formed can be difficult of staining at printing and have excellent hydrophilicity.

Such an inorganic fine particle is easily available on the market as a colloidal silica dispersion or the like. The amount of the inorganic fine particle contained in the image-recording layer is preferably from 1.0 to 70%, more preferably from 5.0 to 50%, based on the entire solid content of the image-recording layer.

In the image-recording layer for use in the present invention, a plasticizer can be added, if desired, so as to impart flexibility or the like to the coating. Examples thereof include polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate.

In the case of adding the microcapsule to the image-recording layer, a solvent which dissolves the material contained inside the microcapsule and with which the wall material swells can be added to the microcapsule dispersion medium. By such a solvent, the compound having a heat-reactive functional group contained inside the microcapsule is accelerated to diffuse outside the microcapsule.

Such a solvent varies depending on the microcapsule dispersion medium, the wall material and wall thickness of the microcapsule, and the material contained inside the microcapsule, however, can be easily selected from many commercially available solvents. For example, in the case of a water-dispersible microcapsule comprising a cross-linked polyurea or polyurethane wall, the solvent is preferably an alcohol, an ether, an acetal, an ester, a ketone, a polyhydric alcohol, an amide, an amine or a fatty acid.

Specific examples of the solvent include methanol, ethanol, t-butanol, n-propanol, tetrahydrofuran, methyl lactate, ethyl lactate, methyl ethyl ketone, propylene glycol monomethyl ether, ethylene glycol diethyl ether, ethylene glycol monomethyl ether, γ-butyrolactone, N,N-dimethylformamide and N,N-dimethylacetamide, however, the present invention is not limited thereto. These solvents may be used in combination of two or more thereof.

Also, a solvent which does not dissolve in the microcapsule dispersion solution but when mixed with the above-described solvent, dissolves in the microcapsule dispersion solution may be used. The amount added thereof varies depending on the combination of materials, however, if the amount added is less than the optimal amount, insufficient image formation results, whereas if it exceeds the optimal amount, the stability of dispersion solution deteriorates. Usually, the amount added is effectively from 5 to 95%, preferably from 10 to 90%, more preferably from 15 to 85%, based on the coating solution.

In the case of using the polymer fine particle having a heat-reactive functional group or the microcapsule, a compound capable of initiating or accelerating the reaction thereof may be added, if desired, to the image-recording layer of the present invention. The compound capable of initiating or accelerating the reaction includes a compound which generates a radical or a cation by heat. Examples thereof include a lophine dimer, a trihalomethyl compound, a peroxide, an azo compound, an onium salt including diazonium salt and diphenyl iodonium salt, an acyl phosphine and an imidosulfonate.

This compound is added in the range from 1 to 20%, preferably from 3 to 10%, based on the solid content of the image-recording layer. Within this range, good reaction initiating or accelerating effect can be obtained without impairing the on-press developability.

For forming the image-recording layer of the present invention, necessary components described above are dissolved in a solvent to prepare a coating solution and the coating solution is coated on the image-recording layer. Examples of the solvent which can be used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water, however, the present invention is not limited thereto. These solvents are used individually or in combination. The solid content concentration of the coating solution is preferably from 1 to 50%.

The coated amount (solid content) of the image-recording layer on the substrate, obtained after the coating and drying, varies depending on use end but in general, is preferably from 0.5 to 5.0 $g/m^2$. If the coated amount is less than this range, high apparent sensitivity may be obtained but the image-recording layer of performing the image-recording function is decreased in the film properties. For coating the coating solution, various methods may be used. Examples thereof include bar coater coating, rotary coating, spray coating, curtain coating, dip coating, air knife coating, blade coating and roll coating.

In the coating solution for the image-recording layer for use in the present invention, a surfactant such as fluorine-containing surfactant described in JP-A-62-170950 may be added so as to attain good coatability. The amount of the surfactant added is preferably from 0.01 to 1%, more preferably from 0.05 to 0.5%, based on the entire solid content of the image-recording layer.

3. Image-Recording Layer of the Third Embodiment

The image-recording layer for use in the present invention contains a self water-dispersible rein fine particle of undergoing combination by heat. Examples of the self water-dispersible resin fine particle include a resin fine particle obtained by dispersing a starting material resin having a lipophilic resin moiety and a hydrophilic group within the molecule in water by the phase inversion emulsification method described in JP-A-3-221137 or JP-A-5-66600 without using an emulsifier or a protective colloid.

Examples of the hydrophilic group within the starting material resin molecule used in the phase inversion emulsification method include a carboxylic acid group, a sulfonic acid group, a phosphoric acid group, a hydroxyl group, an amide group, a sulfonamide group and an amino group. Specific examples of the monomer having a hydrophilic group include acrylic acid, methacrylic acid, crotonic acid, itaconic acid, maleic acid, fumaric acid, monobutyl itaconate, monobutyl maleate, acid phosphoxyethyl methacrylate, acid phosphoxypropyl methacrylate, 3-chloro-2-acrylamido-2-methylpropanesulfonic acid, 2-sulfoethyl methacrylate, acrylamide, N-vinylpyrrolidone, N-vinylimidazole and hydroxyethyl acrylate.

Examples of the lipophilic resin moiety within the starting material resin molecule used in the phase inversion emulsification method include a polymer moiety obtained by polymerizing or copolymerizing a polymerizable monomer of the following (A) to (J).

(A) Acrylic Acid Esters

Examples of this monomer group include methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 2-hydroxyethyl acrylate, 4-hydroxybutyl acrylate, o-, m- or p-hydroxyphenyl acrylate, glycidyl acrylate and N,N-dimethylaminoethyl acrylate.

(B) Methacrylic Acid Esters

Examples of this monomer group include methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 2-hydroxyethyl methacrylate, 4-hydroxybutyl methacrylate, o-, m- or p-hydroxyphenyl methacrylate, glycidyl methacrylate and N,N-dimethylaminoethyl methacrylate.

(C) Substituted Acrylamides and Substituted Methacrylamides

Examples of this monomer group include N-methylolacrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide and N-ethyl-N-phenylmethacrylamide, N-(4-hydroxyphenyl)acrylamide and N-(4-hydroxyphenyl)methacrylamide.

(D) Vinyl Ethers

Examples of this monomer group include ethyl vinyl ether, 2-chloroethyl vinyl ether, hydroxyethyl vinyl ether, propyl vinyl ether, butyl vinyl ether, octyl vinyl ether and phenyl vinyl ether.

(E) Vinyl Esters

Examples of this monomer group include vinyl acetate, vinyl chloroacetate, vinyl butyrate and vinyl benzoate.

(F) Styrenes

Examples of this monomer group include styrene, methylstyrene, t-butylstyrene, chloromethylstyrene, o-hydroxystyrene, m-hydroxystyrene and p-hydroxystyrene.

(G) Vinyl Ketones

Examples of this monomer group include methyl vinyl ketone, ethyl vinyl ketone, propyl vinyl ketone and phenyl vinyl ketone.

(H) Olefins

Examples of this monomer group include ethylene, propylene, isobutylene, butadiene and isoprene.

(I) N-Containing Monomers

Examples of this monomer group include N-vinylcarbazole, acrylonitrile and methacrylonitrile.

(J) Unsaturated Sulfonamide

Examples of this monomer group include acrylamides such as N-(o-aminosulfonylphenyl)acrylamide, N-(m-aminosulfonylphenyl)acrylamide, N-(p-aminosulfonylphenyl)acrylamide, N-[1-(3-aminosulfonyl)naphthyl]acrylamide and N-(2-aminosulfonylethyl)acrylamide, methacrylamides such as N-(o-aminosulfonylphenyl)methacrylamide, N-(m-aminosulfonylphenyl)methacrylamide, N-(p-aminosulfonylphenyl)methacrylamide, N-[1-(3-aminosulfonyl)naphthyl]methacrylamide and N-(2-aminosulfonylethyl)methacrylamide, acrylic acid esters such as o-aminosulfonylphenyl acrylate, m-aminosulfonylphenyl acrylate, p-aminosulfonylphenyl acrylate and 1-(3-aminosulfonylphenylnaphthyl) acrylate, and methacrylic acid esters such as o-aminosulfonylphenyl methacrylate, m-aminosulfonylphenyl methacrylate, p-aminosulfonylphenyl methacrylate and 1-(3-aminosulfonylphenylnaphthyl) methacrylate.

Depending on the case, the lipophilic resin moiety within the starting material resin molecule used for the phase inversion emulsification method may be a copolymer of a polymerizable monomer described above with a polymerizable unsaturated group-containing oligomer. Examples of the polymerizable unsaturated group-containing oligomer include vinyl-modified polyester, vinyl-modified polyurethane, vinyl-modified epoxy resin and vinyl-modified phenol resin. Specific examples thereof include those where a polymerizable unsaturated bond (vinyl group) is introduced by the polycondensation or addition of various compounds such as maleic anhydride, fumaric acid, tetrahydrophthalic anhydride, endomethylene tetrahydromaleic anhydride, α-terpinene maleic anhydride adduct, and monoallyl ether, pentaerythritol diallyl ether or allyl glycidyl ether of triol.

Examples of the vinyl-modified polyurethane include those obtained by the addition polymerization of diisocyanate with various polyols such as glycerin monoallyl ether and butadiene polyol containing 2-bond. The vinyl bond may also be introduced by the addition reaction or the like of a urethane having an isocyanate group at the terminal with a hydroxyl group-containing polymerizable monomer. Furthermore, an acid component may also be introduced into polyurethane by adding a dimethylolpropionic acid or the like as the polyol component.

Examples of the vinyl-modified epoxy resin include those obtained by reacting a terminal epoxy group of an epoxy resin with a carboxyl group of an acrylic or methacrylic acid.

Examples of the vinyl-modified phenol resin include those obtained by reacting a hydroxyl group of a phenol resin with a (meth)acrylic acid halide or a glycidyl (meth) acrylate.

Furthermore, an oligomer of polymerizable monomers having a polymerizable vinyl group, where a glycidyl group-containing polymerizable monomer is added to a carboxyl group-containing vinyl copolymer, may be obtained. The polymerizable monomer used here is selected from those described above, however, insofar as the oligomer is an oligomer having a polymerizable vinyl group, the kind and the method are not limited to those described above.

By copolymerizing at least one member selected from these monomers and polymerizable unsaturated group-containing oligomers with the above-described monomer having a hydrophilic group, a starting material resin for the self water-dispersible resin fine particle according to the phase inversion emulsification method is obtained. This starting material resin preferably has a weight average molecular weight of 500 to 500,000 and a number average molecular weight of 200 to 60,000.

The starting material resin of the self water-dispersible resin fine particle may further have a heat-reactive functional group. Examples of the heat-reactive functional group include an ethylenic unsaturated group of undergoing a polymerization reaction (for example, an acryloyl group, a methacryloyl group, a vinyl group and an allyl group), an epoxy group of undergoing an addition reaction, and an isocyanate group or a block form thereof.

The introduction of the heat-reactive functional group has an effect of increasing the strength of the image area after exposure and improving the printing durability. The introduction of the heat-reactive functional group may be performed by a polymer reaction described, for example, in WO96-34316.

Other than those, suitable examples of the self water-dispersible resin fine particle for use in the present invention include resin fine particles obtained by the phase inversion emulsification of a urethane resin having an acidic group described in JP-A-1-287183, an epoxy resin having an acidic group described in JP-A-55-3481, or a polyester resin having an acidic group.

The introduction of an acid group into polyester may be performed by a known method. For example, when a dibasic acid such as phthalic acid is used in excess, a polyester having a carboxyl group at the terminal is obtained. Or, when a trimellitic anhydride is used, a polyester having an acid group in the main chain is obtained.

The coagulation temperature of the self water-dispersible resin fine particle is preferably 70° C. or more and in view of aging stability, more preferably 100° C. or more.

The amount of the self water-dispersible resin fine particle added to the image-recording layer is preferably 50% or more, more preferably 60% or more, based on the solid content of the image-recording layer. Within this range, good image formation can be attained and good printing durability can be obtained.

The self water-dispersible resin fine particle for use in the present invention may contain a hydrophobic organic low molecular compound inside the fine particle, so that when fused, diffused and bled out due to heat generated upon light irradiation, the activity of rendering the vicinity hydrophobic (lipophilic) can be elevated. Examples of the organic low molecular compound include printing ink components, plasticizers, aliphatic or aromatic hydrocarbons having a high boiling point, carboxylic acid, alcohols, esters, ethers, amines and derivatives thereof.

Specific examples thereof include oils and fats such as linseed oil, soybean oil, poppy oil and safflower oil, plasticizers such as tributyl phosphate, tricresyl phosphate, dibutyl phthalate, dibutyl laurate and dioctyl phthalate, fine particle dispersion of waxes such as carnauba wax, castor wax, microcrystalline wax, paraffin wax, shellac wax, palm wax and beeswax, or metal salts of long-chain aliphatic acid, such as low molecular weight polyethylene, silver behenate, calcium stearate and magnesium palmitate, n-nonane, n-decane, n-hexadecane, octadecane, eicosane, caproic acid, capric acid, stearic acid, oleic acid, dodecyl alcohol, octyl alcohol, n-octadecyl alcohol, 2-octanol, lauryl alcohol, lauryl methyl ether, stearyl methyl ether and stearylamide.

The inclusion of the hydrophobic organic compound inside the self water-dispersible resin fine particle can be attained by adding, at the synthesis of resin fine particle, the hydrophobic organic compound to an organic solvent having dissolved therein the self water-dispersible resin and performing the phase inversion emulsification.

In order to elevate the sensitivity, the image-recording layer for use in the present invention may contain a light-to-heat converting agent having a function of converting light into heat. The light-to-heat converting agent may be sufficient if it is a substance capable of absorbing light at 700 nm or more. Various pigments and dyes can be used. Examples of the pigment which can be used include commercially available pigments and pigments described in *Color Index* (*C.I.*) *Binran* (*C.I. Handbook*), *Saishin Ganryo Binran* (*Handbook of Newest Pigments*), compiled by Nippon Ganryo Gijutsu Kyokai (1977), *Saishin Ganryo Oyo Gijutsu* (*Up-To-Date Pigment Application Technology*), CMC (1986), and *Insatsu Ink Gijutsu* (*Printing Ink Technology*), CMC (1984).

The kind of pigment includes black pigment, brown pigment, red pigment, violet pigment, blue pigment, green pigment, fluorescent pigment, metal powder pigment and polymer bond dye. Specific examples of the pigment which can be used include insoluble azo pigments, azo lake pigments, condensed azo pigments, chelate azo pigments, phthalocyanine-base pigments, anthraquinone-base pigments, perylene- and perynone-base pigments, thioindigo-base pigments, quinacridone-base pigments, dioxazine-base pigments, isoindolinone-base pigments, quinophthalone-base pigments, dyed lake pigments, azine pigments, nitroso pigments, nitro pigments, natural pigments, fluorescent pigments, inorganic pigments and carbon black.

These pigments may or may not be surface-treated before use. For the surface treatment, a method of coating a hydrophilic or lipophilic resin on the surface, a method of attaching a surfactant, and a method of bonding a reactive substance (for example, silica sol, alumina sol, silane coupling agent, epoxy compound or isocyanate compound) to the pigment surface may be used. These surface treatment methods are described in *Kinzoku Sekken no Seishitsu to Oyo* (*Properties and Application of Metal Soap*), Saiwai Shobo, *Insatsu Ink Gijutsu* (*Printing Ink Technology*), CMC (1984), and *Saishin Ganryo Oyo Gijutsu* (*Up-To-Date Pigment Application Technology*), CMC (1986). Among these pigments, those which absorb infrared light are preferred because these are suitable for the use with a laser which emits infrared light. The pigment which absorbs infrared light is preferably carbon black.

As the pigment added to the image-recording layer of the present invention and to the overcoat layer described later, carbon black of which surface is coated with a hydrophilic resin or a silica sol to facilitate the dispersion with a water-soluble or hydrophilic resin and not to impair the hydrophilicity, is useful.

The particle size of the pigment is preferably from 0.01 to 1 $\mu$m, more preferably from 0.01 to 0.5 $\mu$m. For dispersing the pigment, a known dispersion technique for use in the production of ink or toner may be used. Examples of the disperser include ultrasonic disperser, sand mill, attritor, pearl mill, super-mill, ball mill, impeller, disperser, KD mill, colloid mill, dynatron, three-roll mill and pressure kneader. These are described in detail in *Saishin Ganryo Oyo Gijutsu* (*Up-To-Date Pigment Application Technology*), CMC (1986).

As the dye, commercially available dyes and known dyes described in publications (for example, *Senryo Binran* (*Handbook of Dyes*), compiled by Yuki Gosei Kagaku Kyokai (1970), "Kinsekigai Kyushu Shikiso (Near Infrared Absorbing Dyes)" of *Kagaku Kogyo* (*Chemical Industry*), pp. 45–51 (May, 1986), and 90 *Nen Dai Kinosei Shikiso no Kaihatsu to Shijo Doko* (*Development and Movement on Market of Functional Dyes in* 90*s*), Chap. 2, Item 2.3, CMC (1990)) or patents may be used. Specific preferred examples thereof include infrared absorbing dyes such as azo dye, metal complex salt azo dye, pyrazolone azo dye, anthraquinone dye, phthalocyanine dye, carbonium dye, quinoneimine dye, polymethine dye and cyanine dye.

Examples thereof include cyanine dyes described in JP-A-58-125246, JP-A-59-84356, JP-A-60-78787, JP-A-58-173696, JP-A-58-194595, JP-A-59-216146, British Patent 434,875 and U.S. Pat. No. 4,973,572, cyanine dyes and azomethine dyes described in U.S. Pat. No. 4,756,993, methine dyes described in JP-A-58-181690, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, phthalocyanine compounds described in JP-A-11-235883 and various dyes described in JP-A-10-268512.

As the dye, the near infrared absorbing sensitizers described in U.S. Pat. No. 5,156,938 may also be suitably used. Also, substituted arylbenzo(thio)pyrylium salts described in U.S. Pat. No. 3,881,924, trimethinethiapyrylium salts described in JP-A-57-142645, pyrylium-base compounds described in JP-A-58-181051, JP-A-58-220143, JP-A-59-41363, JP-A-59-84248, JP-59-84249, JP-A-59-146063, JP-A-59-146061, JP-B-5-13514 and JP-B-5-19702, pentamethinethiopyrylium salts described in U.S. Pat. No. 4,283,475, and Epolight III-178, Epolight III-130, Epolight and III-125 produced by Epolin may be suitably used.

Among these, dyes having a water-soluble group are preferred as the dye added to the image-recording layer. Specific examples of the structural formula thereof are set forth below.

(IR-1)

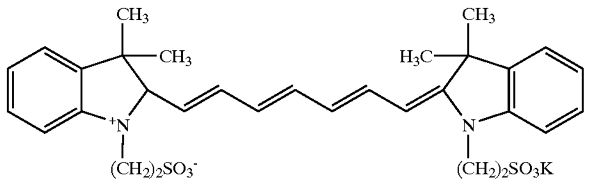

(IR-2)

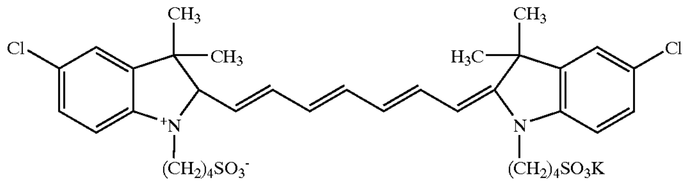

-continued
(IR-3)
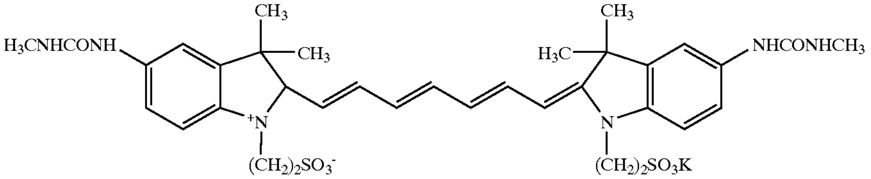
(IR-4)
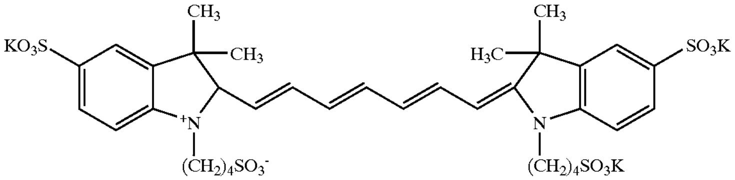
(IR-5)
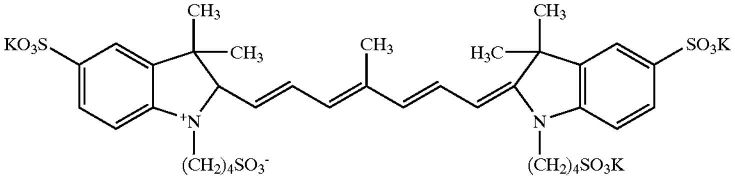
(IR-6)
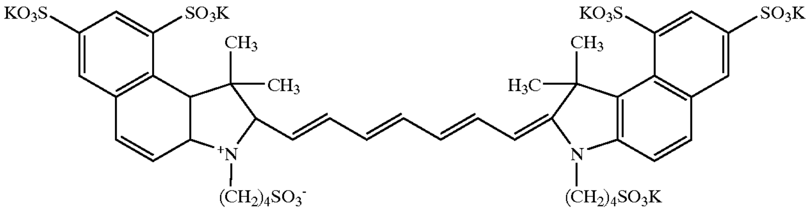
(IR-7)
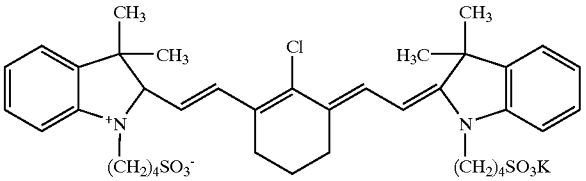
(IR-8)
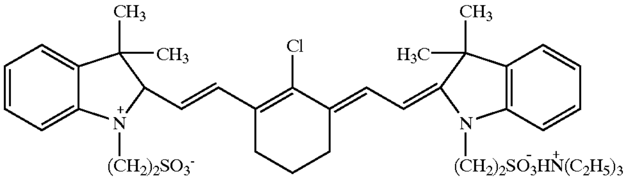
(IR-9)
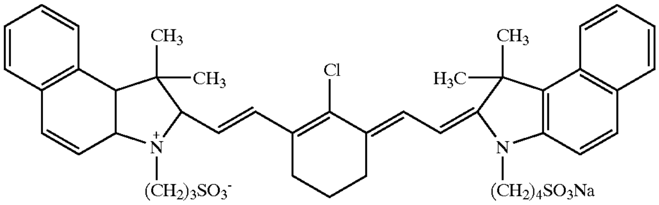
(IR-10)
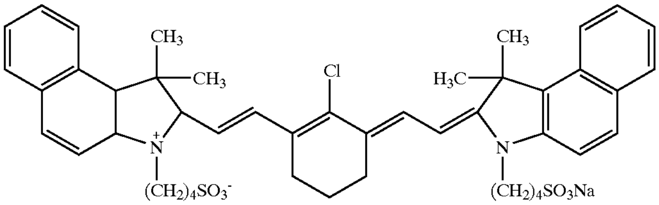

-continued
(IR-11)
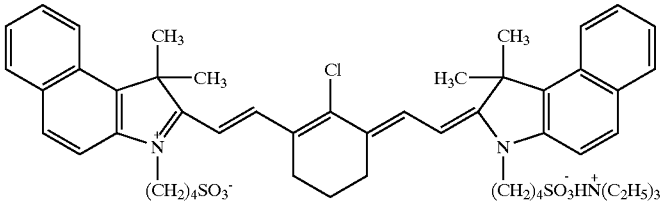
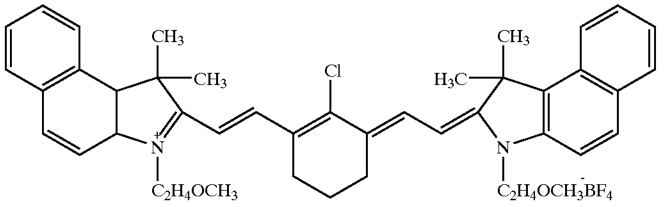
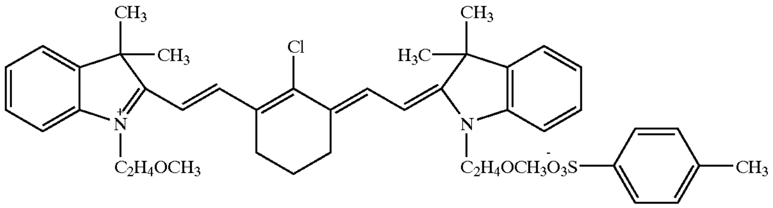
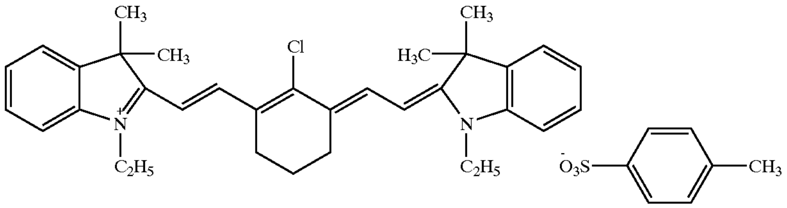
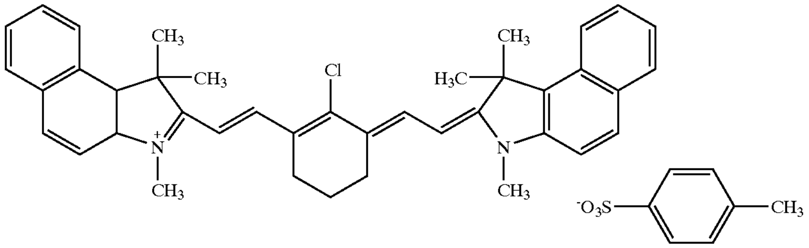
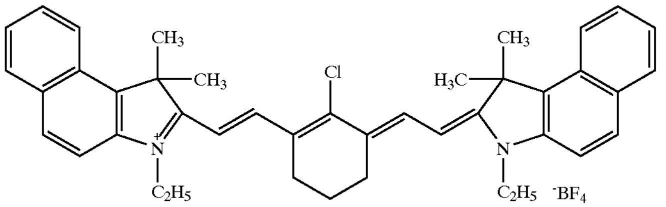
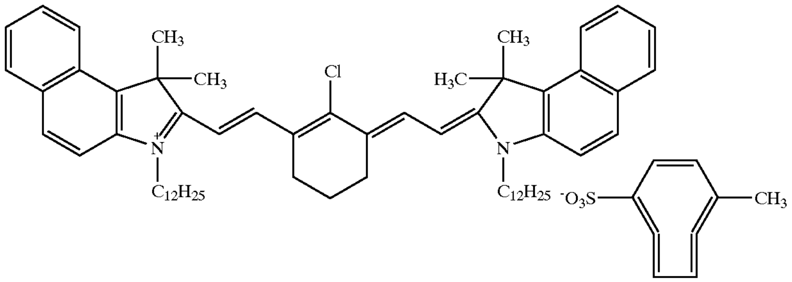

-continued (IR-27)

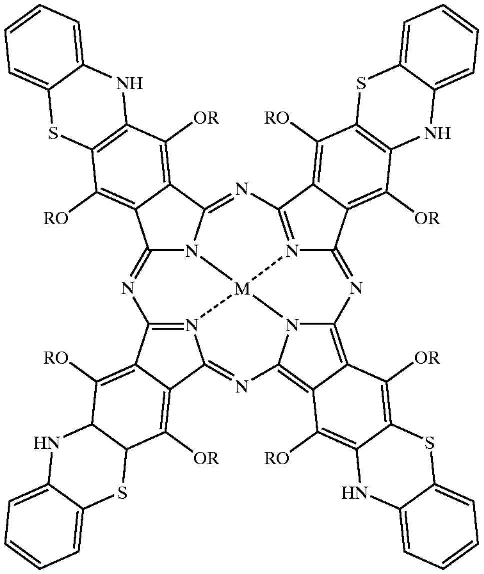

M=VO, R=i-$C_5H_{11}$ (IR-28)

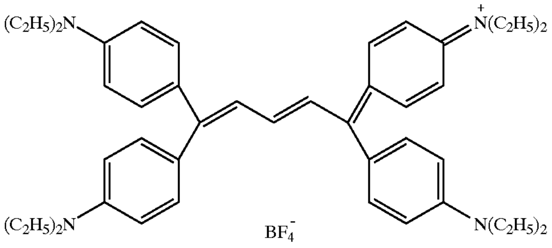

The light-to-heat converting agent may be used in the image-recording layer by incorporating it into the resin fine particle and this is preferred in view of heat efficiency. In this case, the light-to-heat converting agent may be the above-described infrared absorbing pigment or dye but a light-to-heat converting agent having higher lipophilicity is preferred. Suitable examples thereof include the following dyes.

(IR-21)

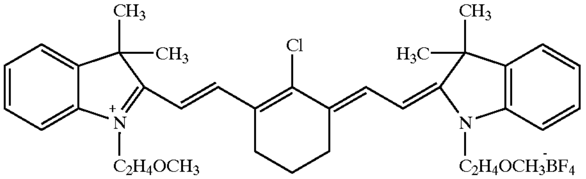

(IR-22)

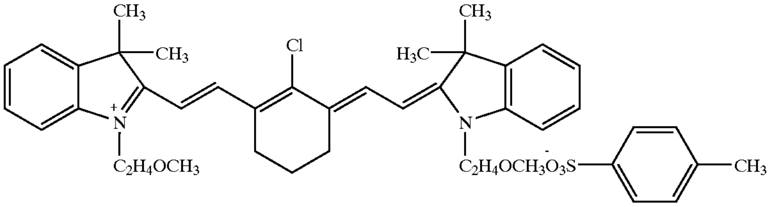

-continued
(IR-23)
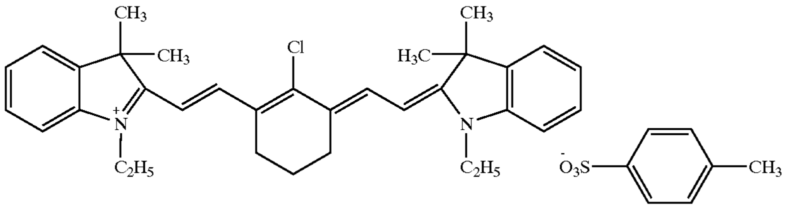
(IR-24)
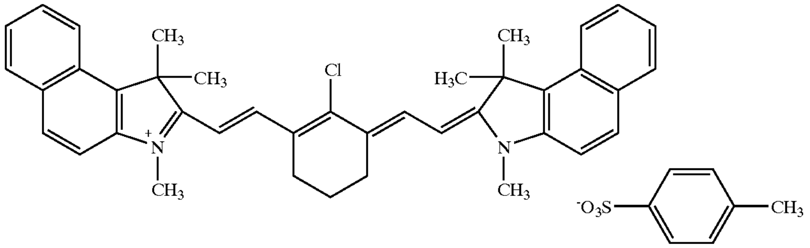
(IR-25)
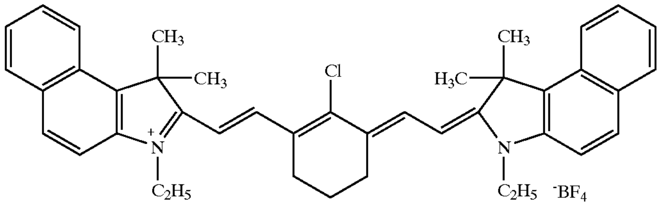
(IR-26)
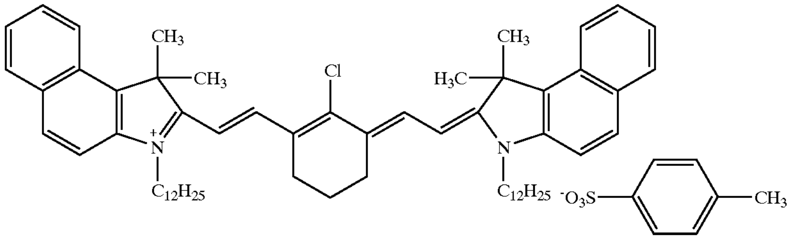
(IR-27)
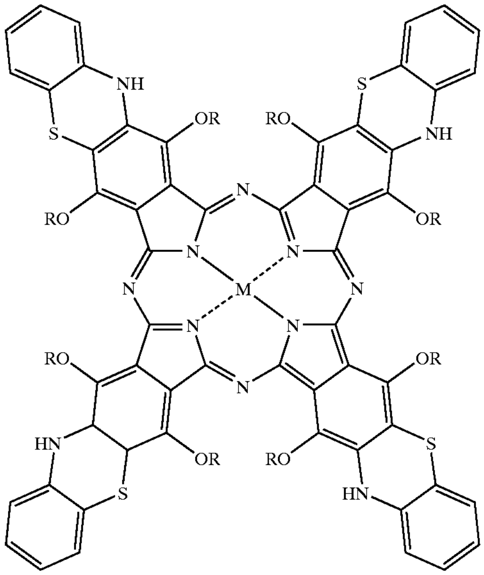
M = VO, R = i-$C_5H_{11}$ -continued

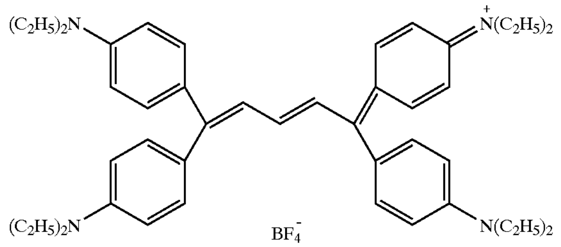

(IR-28)

The ratio of the light-to-heat converting agent added to the image-recording layer is preferably from 0.1 to 50 wt %, more preferably from 3 to 25 wt %, to the solid content in the image-receiving layer. Within this range, good sensitivity can be obtained without impairing the film strength of the image-recording layer.

In the image-receiving layer for use in the present invention, a hydrophilic resin may be added. By adding a hydrophilic resin, not only good on-press developability can be attained but also the film strength of the image-recording layer itself can be improved.

The hydrophilic resin is preferably a resin having a hydrophilic group such as hydroxyl group, hydroxyethyl group, hydroxypropyl group, amino group, aminoethyl group, aminopropyl group, carboxyl group, carboxylate group, sulfo group, sulfonate group or phosphoric acid group.

Specific examples of the hydrophilic resin include gum arabic, casein, gelatin, starch derivatives, carboxymethyl cellulose and sodium salt thereof, cellulose acetate, sodium alginate, vinyl acetate-maleic acid copolymers, styrene-maleic acid copolymers, polyacrylic acids and salts thereof, polymethacrylic acids and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having a hydrolysis degree of at least 60%, preferably at least 80%, polyvinylformal, polyvinylbutyral, polyvinylpyrrolidone, homopolymers and copolymers of acrylamide, homopolymers and copolymers of methacrylamide, and homopolymers and copolymers of N-methylolacrylamide.

The amount of the hydrophilic resin added to the image-recording layer is preferably from 5 to 40%, more preferably from 10 to 30%, based on the solid content in the image-recording layer. Within this range, good on-press developability and sufficiently high film strength can be obtained.

In the image-recording layer for use in the present invention, various compounds other than those described above may further be added, if desired. For example, in order to more improve the printing durability, a polyfunctional monomer may be added to the image-recording layer. Examples of the polyfunctional monomer which can be used include polyfunctional monomers commercially available as the monomer for photopolymerizable composition. Among these monomers, particularly preferred is trimethylolpropane acrylate.

The image-recording layer for use in the present invention may contain a crosslinking agent, if desired. Suitable examples of the crosslinking agent include low molecular compounds having a methylol group, such as melamine-formaldehyde resin, hydantoin-formaldehyde resin, thiourea-formaldehyde resin and benzoguanamine-formaldehyde resin.

The image-recording layer for use in the present invention may contain a compound which generates an acid or a radical by heat, and a dye which discolors by an acid or a radical, so that after image exposure, the image area and the non-image area can be distinguished from each other.

Examples of the compound which generates an acid or a radical by heat include diallyl iodonium salts and triallyl phosphonium salts described in U.S. Pat. Nos. 3,729,313, 4,058,400, 4,058,401, 4,460,154 and 4,921,827, and halomethyl-1,3,5-triazine compounds and halomethyl-oxadiazole compounds described in U.S. Pat. Nos. 3,987,037, 4,476,215, 4,826,753, 4,619,998, 4,696,888, 4,772,534, 4,189,323, 4,837,128, 5,364,734 and 4,212,970.

As for the dye which discolors by an acid or a radical, various dyes of, for example, diphenylmethane type, triphenylmethane type, thiazine type, oxazine type, xanthene type, anthraquinone type, iminoquinone type, azo type and azomethine type may be effectively used.

Specific examples thereof include dyes such as Brilliant Green, Ethyl Violet, Methyl Green, Crystal Violet, Basic Fuchsine, Methyl Violet 2B, Quinaldine Red, Rose Bengale, Methanyl Yellow, Thymolsulfophthalein, Xylenol Blue, Methyl Orange, Para Methyl Red, Congo Red, Benzopurpurine 4B, α-Naphthyl Red, Nile Blue 2B, Nile Blue A, Methyl Violet, Malachite Green, Para Fuchsine, Victoria Pure Blue BOH [produced by Hodogaya Chemical Co., Ltd.], Oil Blue #603 [produced by Orient Chemical Industry Co., Ltd.], Oil Pink #312 [produced by Orient Chemical Industry Co., Ltd.], Oil Red SB [produced by Orient Chemical Industry Co., Ltd.], Oil Scarlet #308 [produced by Orient Chemical Industry Co., Ltd.], Oil Red OG [produced by Orient Chemical Industry Co., Ltd.], Oil Red RR [produced by Orient Chemical Industry Co., Ltd.], Oil Green #502 [produced by Orient Chemical Industry Co., Ltd.], Spiron Red BEH Special [produced by Hodogaya Chemical Co., Ltd.], m-Cresol Purple, Cresol Red, Rhodamine B. Rhodamine 6G, Sulforhodamine B, Auramine, 4-p-diethylaminophenyliminonaphthoquinone, 2-carboxyanilino-4-p-diethylaminophenyliminonaphthoquinone, 2-carbostearylamino-4-p-dihydroxyethylaminophenyliminonaphthoquinone, 1-phenyl-3-methyl-4-p-diethylaminophenylimino-5-pyrazolone and 1-β-naphthyl-4-p-diethylaminophenylimino-5-pyrazolone, and leuco dyes such as p,p',p"-hexamethyltriaminotriphenylmethane (Leuco Crystal Violet) and Pergascript Blue SRB [produced by Ciba Geigy].

The amounts added of the compound which generates an acid or a radical, and the dye which discolors by an acid or a radical each is suitably from 0.01 to 10% based on the solid content of the image-recording layer.

In the present invention, in the case of using an ethylenic unsaturated group as the heat-reactive group or using a polyfunctional monomer in the image-recording layer, a slight amount of a thermopolymerization inhibitor is preferably added so as to inhibit unnecessary thermopolymerization during preparation or storage of the coating solution for the image-recording layer. Suitable examples of the thermopolymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol) and N-nitroso-N-phenylhydroxylamine aluminum salt. The amount of the thermopolymerization inhibitor added is preferably from about 0.01% to 5% based on the weight of the entire composition.

If desired, a higher fatty acid or a derivative thereof, such as behenic acid or behenic acid amide, may be added and allowed to localize on the surface of the image-recording layer in the process of drying after the coating so as to prevent polymerization inhibition by oxygen. The amount added of the higher fatty acid or a derivative thereof is preferably from about 0.1% to about 10% based on the solid content of the image-recording layer.

The image-recording layer of the present invention may contain an inorganic fine particle and suitable examples of the inorganic fine particle include silica, alumina, magnesium oxide, titanium oxide, magnesium carbonate, calcium alginate and a mixture thereof. This inorganic fine particle may be used for strengthening the film or for strengthening the interface adhesion by surface roughening, even if it does not have light-to-heat converting property.

The average particle size of the inorganic fine particle is preferably from 5 nm to 10 μm, more preferably from 10 nm to 1 μm. With the particle size in this range, the inorganic particle can be stably dispersed in the hydrophilic resin together with the resin fine particle or the metal fine particle as a light-to-heat converting agent, so that the image-recording layer can maintain sufficiently high film strength and the non-image area formed can be difficult of staining at printing and have excellent hydrophilicity.

Such an inorganic fine particle is easily available on the market as a colloidal silica dispersion or the like. The amount of the inorganic fine particle contained in the image-recording layer is preferably from 1.0 to 70%, more preferably from 5.0 to 50%, based on the entire solid content of the image-recording layer.

In the image-recording layer for use in the present invention, a plasticizer can be added, if desired, so as to impart flexibility or the like to the coating. Examples thereof include polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate.

In order to improve the on-press developability, the image-recording layer for use in the present invention may contain a polyhydric alcohol, if desired, such as glycerin, ethylene glycol, diethylene glycol, triethylene glycol, tetraethylene glycol, propylene glycol, dipropylene glycol, tripropylene glycol, tetrapropylene glycol, butylene glycol, dibutylene glycol, tributylene glycol, tetrabutylene glycol, pentylene glycol, dipentylene glycol, tripentylene glycol and tetrapentylene glycol.

In the case of using the resin fine particle having a heat-reactive group, a compound capable of initiating or accelerating the reaction thereof may be added, if desired, to the image-recording layer of the present invention. The compound capable of initiating or accelerating the reaction includes a compound which generates a radical or a cation by heat. Examples thereof include a lophine dimer, a trihalomethyl compound, a peroxide, an azo compound, an onium salt including diazonium salt and diphenyl iodonium salt, an acyl phosphine and an imidosulfonate.

This compound is added in the range from 1 to 20%, preferably from 3 to 10%, based on the solid content of the image-recording layer. Within this range, good reaction initiating or accelerating effect can be obtained without impairing the on-press developability.

For forming the image-recording layer of the present invention, necessary components described above are dissolved in a solvent to prepare a coating solution and the coating solution is coated on the image-recording layer. Examples of the solvent which can be used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water, however, the present invention is not limited thereto. These solvents are used individually or in combination. The solid content concentration of the coating solution is preferably from 1 to 50%.

The coated amount (solid content) of the image-recording layer on the substrate, obtained after the coating and drying, varies depending on use end but in general, is preferably from 0.5 to 5.0 $g/m^2$. If the coated amount is less than this range, high apparent sensitivity may be obtained but the image-recording layer of performing the image-recording function is decreased in the film properties. For coating the coating solution, various methods may be used. Examples thereof include bar coater coating, rotary coating, spray coating, curtain coating, dip coating, air knife coating, blade coating and roll coating.

In the coating solution for the image-recording layer for use in the present invention, a surfactant such as fluorine-containing surfactant described in JP-A-62-170950 may be added so as to attain good coatability. The amount of the surfactant added is preferably from 0.01 to 1%, more preferably from 0.05 to 0.5%, based on the entire solid content of the image-recording layer.

[Overcoat Layer]

The lithographic printing plate precursor of the first embodiment of present invention has an overcoat layer containing a water-soluble resin on the image-recording layer. By this overcoat layer, the image-recording layer can be prevented from ablation at the exposure.

The water-soluble resin for use in the overcoat layer of the present invention provides, when coated and dried, a coating having a film-forming ability. Specific examples thereof include a polyvinyl acetate (having, however, a hydrolysis ratio of 65% or more), homopolymers and copolymers of acrylic acid, and alkali metal salts and amine salts thereof, homopolymers and copolymers of methacrylic acid, and alkali metal salts and amine salts thereof, polyhydroxyethyl acrylates, homopolymers and copolymers of N-vinylpyrrolidone, polyvinyl methyl ethers, vinyl methyl ether/maleic anhydride copolymers, homopolymers and copolymers of 2-acrylamide-2-methyl-1-propanesulfonic acid, and alkali metal salts and amine salts thereof, gum arabic, cellulose derivatives (e.g., carboxymethyl cellulose, carboxyethyl cellulose, methyl cellulose) and modified products thereof, white dextrin, pullulan and enzymolysis etherified dextrin. According to the purpose, these resins can be used in combination of two or more thereof.

The overcoat layer may contain at least one fine polymer selected from a hydrophobic polymer fine particle of undergoing combination by heat and a microcapsule. By containing such a fine particle, the impression capability is more improved.

As for the hydrophobic polymer fine particle of undergoing combination by heat for use in the overcoat layer of the present invention, the above-described hydrophobic polymer fine particles suitably used for the image-recording layer may also be suitably used.

The microcapsule suitable for the overcoat layer of the present invention is preferably a microcapsule containing therein a compound having a heat-reactive functional group. Suitable examples of the heat-reactive functional group include those described above as suitable heat-reactive functional groups for the hydrophobic polymer fine particle used in the image-recording layer of the present invention.

Examples of the compound having the heat-reactive functional group include compounds having at least one functional group selected from a polymerizable unsaturated group, a hydroxyl group, a carboxyl group, a carboxylate group, an acid anhydride, an amino group, an epoxy group, and an isocyanate group or a block form thereof.

The compound having a polymerizable unsaturated is preferably a compound having at least one, preferably two or more, ethylenic unsaturated double bond, for example, an acryloyl group, a methacryloyl group, a vinyl group and an allyl group. Such compounds are widely known in this industrial field and can be used in the present invention without any particular limitation. These compounds have a chemical form such as monomer, prepolymer, namely dimer, trimer or oligomer, or a mixture or copolymer thereof.

Examples thereof include unsaturated carboxylic acids (e.g., acrylic acid, methacrylic acid, itaconic acid, crotonic acid, isocrotonic acid, maleic acid) and esters or amides thereof. Among these, preferred are esters of an unsaturated carboxylic acid with an aliphatic polyhydric alcohol, and amides of an unsaturated carboxylic acid with an aliphatic polyhydric amine. Also, an addition reaction product of a monofunctional or polyfunctional isocyanate or epoxy, or a dehydration condensation reaction product of a monofunctional or polyfunctional carboxylic acid, with an unsaturated carboxylic acid ester or amide having a nucleophilic substituent such as hydroxyl group, amino group or mercapto group, is suitably used. Furthermore, an addition reaction product of an unsaturated carboxylic acid ester or amide having an electrophilic substituent such as isocyanato group or epoxy group with a monofunctional or polyfunctional alcohol, amine or thiol, or a substitution reaction product of an unsaturated carboxylic acid ester or amide having a releasable substituent such as halogen group or tosyloxy group with a monofunctional or polyfunctional alcohol, amine or thiol, is also suitably used. Other than these, compounds resulting from replacing the unsaturated carboxylic acid by an unsaturated phosphonic acid or chloromethylstyrene can also be used.

Specific examples of the polymerizable compound, which is an ester of an aliphatic polyhydric alcohol compound with an unsaturated carboxylic acid, include the followings. Specific examples of the acrylic acid ester include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane diacrylate, trimethylolpropane triacrylate, trimethylolpropane tris-(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tris(acryloyloxyethyl) isocyanurate and polyester acrylate oligomer.

Specific examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane.

Specific examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Specific examples of the crotonic acid ester include ethylene glycol dicrotonate, tetramethylene glycol dicrotonate, pentaerythritol dicrotonate and sorbitol tetradicrotonate. Specific examples of the isocrotonic acid ester include ethylene glycol diisocrotonate, pentaerythritol diisocrotonate and sorbitol tetraisocrotonate. Specific examples of the maleic acid ester include ethylene glycol dimaleate, triethylene glycol dimaleate, pentaerythritol dimaleate and sorbitol tetramaleate.

Examples of other esters include aliphatic alcohol-base esters described in JP-B-46-27926, JP-B-51-47334 and JP-A-57-196231, those having an aromatic skeleton described in JP-A-59-5240, JP-A-59-5241 and JP-A-2-226149, and those containing an amino group described in JP-A-1-165613.

Specific examples of the amide monomer of an aliphatic polyvalent amine compound with an unsaturated carboxylic acid include methylene bis-acrylamide, methylene bis-methacrylamide, 1,6-hexamethylene bis-acrylamide, 1,6-hexamethylene bis-methacrylamide, diethylenetriamine tris-acrylamide, xylylene bis-acrylamide and xylylene bis-methacrylamide. Other preferred examples of the amide-base monomer include those having a cyclohexylene structure described in JP-B-54-21726.

A urethane-base addition polymerizable compound produced using an addition reaction between an isocyanate and a hydroxyl group is also suitably used and specific examples thereof include urethane compounds having two or more polymerizable unsaturated groups within one molecule obtained by adding an unsaturated monomer containing a hydroxyl group represented by the following formula (II) to a polyisocyanate compound having two or more isocyanate groups within one molecule, described in JP-B-48-41708.

$$CH_2{=}C(R^1)COOCH_2CH(R^2)OH \quad \text{(II)}$$

wherein $R^1$ and $R^2$ each represents H or $CH_3$.

Also, urethane acrylates described in JP-A-51-37193, JP-B-2-32293 and JP-B-2-16765, and urethane compounds having an ethylene oxide-base skeleton described in JP-B-58-49860, JP-B-56-17654, JP-B-62-39417 and JP-B-62-39418 may be suitably used.

Furthermore, radical polymerizable compounds having an amino structure or a sulfide structure within the molecule described in JP-A-63-277653, JP-A-63-260909 and JP-A-1-105238 may also be suitably used.

Other suitable examples include polyfunctional acrylates and methacrylates such as polyester acrylates and epoxy acrylates obtained by reacting an epoxy resin with a (meth) acrylic acid, described in JP-A-48-64183, JP-B-49-43191 and JP-B-52-30490. Specific unsaturated compounds described in JP-B-46-43946, JP-B-1-40337 and JP-B-1-40336, and vinylphosphonic acid-base compounds described in JP-A-2-25493 may also be suitably used. In some cases, the compounds containing a perfluoroalkyl group described in JP-A-61-22048 may be suitably used. Also, those described as a photocurable monomer or oligomer in *Nippon Secchaku Kyokai Shi* (*Journal of Japan Adhesion Society*), Vol. 20, No. 7, pp. 300–308 (1984) can be suitably used.

Suitable examples of the epoxy compound include glycerin polyglycidyl ether, polyethylene glycol diglycidyl ether, polypropylene diglycidyl ether, trimethylolpropane polyglycidyl ether, sorbitol polyglycidyl ether, and polyglycidyl ether of bisphenols, polyphenols or a hydrogenation product thereof.

Suitable examples of the isocyanate compound include tolylene diisocyanate, diphenylmethane diisocyanate, polymethylene polyphenyl polyisocyanate, xylylene diisocyanate, naphthalene diisocyanate, cyclohexane phenylene diisocyanate, isophorone diisocyanate, hexamethylene diisocyanate, cyclohexyl diisocyanate, and compounds resulting from blocking these isocyanate compounds with an alcohol or an amine.

Suitable examples of the amine compound include ethylenediamine, diethylenetriamine, triethylenetetramine, hexamethylenediamine, propylenediamine and polyethyleneimine.

Suitable examples of the compound having a hydroxyl group include compounds having a terminal methylol group, polyhydric alcohols such as trimethylolpropane and pentaerythritol, bisphenol and polyphenols.

Preferred examples of the compound having a carboxyl group include aromatic polyvalent carboxylic acids such as pyromellitic acid, trimellitic acid and phthalic acid, and aliphatic polyvalent carboxylic acids such as adipic acid.

Other than these, suitable examples of the compound having a hydroxyl group or a carboxyl group include the compounds known as a binder for existing PS plates, described in JP-B-54-19773, JP-B-55-34929 and JP-B-57-43890.

Suitable examples of the acid anhydride include pyromellitic anhydride and benzophenone tetracarboxylic anhydride.

Suitable examples of the copolymer of an ethylenic unsaturated compound include copolymer of allyl methacrylate, such as allyl methacrylate/methacrylic acid copolymer, allyl methacrylate/ethyl methacrylate copolymer, and allyl methacrylate/butyl methacrylate copolymer.

Suitable examples of the diazo resin include hexafluorophosphate and aromatic sulfonate of diazodiphenylamine-.formalin condensed resin The method for the encapsulation may be a known method. Examples of the method for producing a microcapsule include a method using coacervation described in U.S. Pat. Nos. 2,800,457 and 2,800,458, a method using interfacial polymerization described in British Patent 990,443, U.S. Pat. No. 3,287,154, JP-B-38-19574, JP-B-42-446 and JP-B-42-771, a method using polymer precipitation described in U.S. Pat. Nos. 3,418,250 and 3,660,304, a method using an isocyanate polyol wall material described in U.S. Pat. No. 3,796,669, a method using an isocyanate wall material described in U.S. Pat. No. 3,914,511, a method using a urea-formaldehyde or urea-formaldehyde-resorcinol wall material described in U.S. Pat. Nos. 4,001,140, 4,087,376 and 4,089,802, a method using a wall material such as melamine-formaldehyde resin or hydroxy cellulose described in U.S. Pat. No. 4,025,455, an in situ method using monomer polymerization described in JP-B-36-9163 and JP-A-51-9079, a spray drying method described in British Patent 930,422 and U.S. Pat. No. 3,111,407, and an electrolytic dispersion cooling method described in British Patents 952,807 and 967,074. However, the present invention is not limited thereto.

The microcapsule wall for use in the present invention preferably has a three-dimensional crosslink and has properties of swelling by a solvent. In this viewpoint, the wall material of the microcapsule is preferably polyurea, polyurethane, polyester, polycarbonate, polyamide or a mixture thereof, more preferably polyurea or polyurethane. The compound having a heat-reactive functional group may be introduced into the microcapsule wall.

The average particle size of the microcapsule is preferably from 0.01 to 20 $\mu$m, more preferably from 0.05 to 2.0 $\mu$m, still more preferably from 0.10 to 1.0 $\mu$m. If the average particle size is excessively large, bad resolution results, whereas if it is too small, the aging stability changes for the worse.

These microcapsules may combine with each other by heat or may not combine. It may suffice if the content of microcapsule, bled out to the capsule surface or from the microcapsule or impregnated into the microcapsule wall, causes a chemical reaction by heat. The content may react with a hydrophilic resin added or a low molecular compound added. Also, it may be possible to produce two or more kinds of microcapsules having different functional groups which thermally react with each other, and react the microcapsules with each other. Accordingly, although the microcapsules are preferably fused and combined by heat in view of image formation, this is not essential.

The amount of the hydrophobic polymer fine particle and/or microcapsule added to the overcoat layer is, in view of more improving the printing durability, preferably 50% or more, more preferably 60% or more, based on the solid content of the overcoat layer.

The overcoat layer for use in the present invention may contain a light-to-heat converting agent. Suitable examples of the light-to-heat converting agent include the light-to-heat converting agents which can be used in the image-recording layer. Among these, dyes having a water-soluble group are preferred. Specific examples thereof include Light-to-Heat Converting Agents IR-1 to IR-11 shown above, however, the present invention is not limited thereto.

In the present invention, the optical density of the overcoat layer at the exposure wavelength is preferably lower than the optical density of the image-recording layer at the same wavelength. Under this optical density condition, good image formation of the image-recording layer can be attained.

For the purpose of ensuring uniform coating, the overcoat layer may contain, in the case of coating of an aqueous solution, a nonionic surfactant such as polyoxyethylenenonylphenyl ether and polyoxyethylenedodecyl ether.

The dry coated amount of the overcoat layer is preferably from 0.1 to 2.0 g/m$^2$. Within this range, the ablation can be satisfactorily prevented without impairing the on-press developability.

In the lithographic printing plate precursor of the second and third embodiments of present invention, a water-soluble overcoat layer may be provided on the image-recording layer so as to prevent the surface of the image-recording layer from staining, for example, like fingerprint due to a lipophilic substance during storage or handling. The water-soluble overcoat layer for use in the present invention is a layer which can be easily removed at the printing, and contains a resin selected from water-soluble organic polymer compounds.

The water-soluble organic polymer compound used here provides, when coated and dried, a coating having a film-forming ability. Specific examples thereof include polyvinyl acetate (having, however, a hydrolysis ratio of 65% or more), acrylic acid homopolymer or copolymer and alkali metal salt or amine salt thereof, methacrylic acid homopolymer of copolymer and alkali metal salt or amine salt thereof, acrylamide homopolymer or copolymer, polyhydroxyethyl acrylate, N-vinylpyrrolidone homopolymer of copolymer, polyvinyl methyl ether, polyvinyl methyl ether/maleic anhydride copolymer, 2-acrylamido-2-methyl-1-propanesulfonic acid homopolymer or copolymer and alkali metal salt or amine salt thereof, gum arabic, cellulose derivative (e.g., carboxymethyl cellulose, carboxyethyl cellulose, methyl cellulose) and modified product thereof, white dextrin, pullulan and enzymolysis etherified dextrin. According to the purpose, these resins can be used in combination of two or more thereof.

The overcoat layer may contain the above-described light-to-heat converting agent. In particular, an infrared absorbing dye having a water-soluble group is suitably used. Furthermore, the overcoat layer may contain, in the case of coating as an aqueous solution, a nonionic surfactant such as polyoxyethylenenonylphenyl ether and polyoxyethylene-dodecyl ether, so as to ensure uniformity of the coating.

The overcoat layer preferably has a dry coated amount of 0.1 to 2.0 g/m$^2$. Within this range, the image-recording layer surface can be successfully prevented from fingerprint staining or the like by a lipophilic substance without impairing the on-press developability.

[Plate-Making and Printing]

On the lithographic printing plate precursor of the present invention, an image is formed by heat. To speak specifically, direct imagewise recording by a thermal recording head or the like, scan exposure by an infrared laser, high-illuminance flash exposure by a xenon discharge lamp, infrared lamp exposure or the like is used, however, exposure by a semiconductor laser of radiating an infrared ray at a wavelength of 700 to 1,200 nm or a solid high-output infrared laser such as YAG laser is preferred.

After the image exposure, the lithographic printing plate precursor of the present invention can be fixed on a press without passing through any more treatment and used for printing by a normal procedure using ink and fountain solution. Also, as described in Japanese Patent No. 2938398, the lithographic printing plate precursor may be exposed by a laser mounted on a press after fixing the plate to the plate cylinder of the press and then subjected to on-press development by applying fountain solution and/or ink. The lithographic printing plate precursor may also be developed using water or an appropriate aqueous solution as the developer and then used for printing.

EXAMPLES

The present invention is described in greater detail below by referring to Examples, however, the present invention is not limited thereto.

Production Example of Aluminum Substrate

Aluminum substrates for use in the lithographic printing plate precursors of Examples were manufactured using a 0.24 mm-thick JIS 1050 aluminum plate by performing a pretreatment, a surface-roughening treatment, a hydrophilic film formation treatment and if desired, an after-treatment in this order. The surface-roughening treatment was performed by any one of the following treatments A to I. The hydrophilic film formation treatment and the after-treatment were performed by the methods described in respective Production Examples of Substrate.

<Surface-Roughening Treatments A, B and C>

An aluminum plate was dipped in an aqueous 1% sodium hydroxide solution kept at 50° C. to perform the dissolution treatment until the dissolved amount reached 2 g/m$^2$. After water washing, the aluminum substrate was dipped in an aqueous solution having the same composition as the electrolytic solution used later in an electrochemical surface-roughening treatment for 10 seconds, thereby performing the neutralization treatment, and then washed with water.

Then, this aluminum substrate material was subjected to an electrochemical surface-roughening treatment in parts with an intervention of dormant time, at a current density of 50 A/dm$^2$ using a sine wave alternating current. The composition of electrolytic solution, the quantity of treating electricity per once, the frequency of electrolysis treatment, and the dormant time are shown in Table 1. After the electrochemical surface-roughening treatment, the aluminum substrate material was dipped in an aqueous 1% sodium hydroxide solution kept at 50° C. to perform the alkali dissolution treatment until the dissolved amount reached 2 g/m$^2$, followed by washing with water, and then dipped in an aqueous 10% sulfuric acid solution kept at 25° C. for 10 seconds to perform the neutralization treatment, followed by washing with water.

TABLE 1

| | Treatment Conditions of Surface-Roughening Treatments A, B and C | | | | |
|---|---|---|---|---|---|
| | Composition of Electrolytic Solution | | Quantity of | Frequency | |
| Kind of Surface-Roughening Treatment | Hydro-chloric Acid (g/liter ) | Acetic Acid (g/liter) | Treating Electricity per Once (C/dm$^2$) | of Electrolysis Treatment (times) | Dormant Time (sec) |
| A | 10 | 0 | 80 | 6 | 1.0 |
| B | 10 | 0 | 40 | 12 | 4.0 |
| C | 10 | 20 | 100 | 2 | 0.8 |

<Surface-Roughening Treatment D>

An aluminum plate was dipped in an aqueous 10% sodium hydroxide solution at 50° C. for 20 seconds to perform the degreasing and etching, followed by washing with running water, and then subjected to a neutralization treatment using an aqueous 25% sulfuric acid solution for 20 seconds, followed by washing with water. Thereafter, the aluminum plate was subjected to an electrochemical surface-roughening treatment at 20° C. using an aqueous 1% hydrochloric acid solution (containing 0.5% of aluminum ion) and using a trapezoidal rectangular wave where the time (TP) until the current value reached the peak from 0 was 2 msec, the frequency was 60 Hz and the duty ratio was 1:1, such that the average current density at the time of aluminum anode as a counter electrode of the carbon electrode was 27 A/dm$^2$ (the ratio of the current density at the aluminum anode time to the current density at the cathode time: 1:0.95) and the average quantity of electricity at the aluminum anode time was 350 C/$dm^2$. Subsequently, the aluminum plate was subjected to an etching treatment by spraying an aqueous solution containing 26% of sodium hydroxide and 6.5% aluminum ion at a liquid temperature of 45° C. such that the total etched amount including smut was 0.7 g/$m^2$, and then to a desmutting treatment by spraying an aqueous 25% nitric acid solution (containing 0.3% aluminum ion) at 60° C. for 10 seconds.

<Surface-Roughening Treatment E>

An aluminum plate surface was roughened using a nylon brush having a bristle diameter of 0.72 mm and a bristle length of 80 mm and a water suspension of pumice stones having an average particle size of about 15 to 35 $\mu$m, and then thoroughly washed with water. Thereafter, the aluminum plate was etched by dipping it in an aqueous 10% sodium hydroxide solution at 70° C. for 30 seconds, washed with running water, neutralized by washing it with an aqueous 20% nitric acid solution, and washed with water. The thus mechanically surface-roughened aluminum plate was further subjected to the following electrochemical surface-roughening treatment.

In an aqueous hydrochloric acid solution prepared by adding aluminum chloride to hydrochloric acid to have a hydrochloric acid concentration of 7.5 g/liter and an aluminum ion concentration of 5 g/liter, an alternating current was applied to the mechanically surface-roughened aluminum plate at a liquid temperature of 35° C. using a radial cell shown in FIG. 1, thereby performing an a.c. electrolysis. The alternating current used was a sine wave generated by controlling the current and voltage of a commercial alternating current having a frequency of 60 Hz using an induction voltage regulator and a transformer. The total quantity of electricity at the aluminum plate anode time was 50 C/$dm^2$ and the Qc/Qa in one cycle of the alternating current was 0.95.

In order to keep constant the concentrations of hydrochloric acid and aluminum ion in the aqueous hydrochloric acid solution, the relationship of temperature, electric conductivity and ultrasonic wave propagation rate with concentrations of hydrochloric acid and aluminum ion was determined, concentrated hydrochloric acid having a concentration of 35% and water were added from a circulation tank to the inside of the electrolytic cell body to adjust the temperature, electric conductivity and ultrasonic wave propagation rate of the aqueous hydrochloric acid solution each to a predetermined value, and excess aqueous hydrochloric acid solution was overflowed. Thereafter, the aluminum plate was subjected to an etching treatment using an alkali solution containing 5% of sodium hydroxide and 0.5% of aluminum ion at a liquid temperature of 45° C. as the treating solution, such that the dissolved amount on the surface-roughened surface of the aluminum plate was 0.1 g/$m^2$ and the dissolved amount on the opposite surface was 0.05 g/$m^2$.

On both surfaces of the aluminum plate after the etching treatment, an aqueous sulfuric acid solution containing 300 g/liter of sulfuric acid and 5 g/liter of aluminum ion was sprayed at a liquid temperature of 50° C., thereby performing a desmutting treatment.

<Surface-Roughening Treatment F>

After the surface-roughening treatment A, an electrochemical surface-roughening treatment was further performed in the following aqueous nitric acid solution.

In an aqueous 1% nitric acid solution (containing 0.5% of aluminum ion), an electrochemical surface-roughening treatment was performed at 50° C. using a radial cell shown in FIG. 1 and using a trapezoidal rectangular wave where the time (TP) until the current value reached the peak from 0 was 2 msec, the frequency was 60 Hz and the duty ratio was 1:1, such that the average current density at the time of aluminum anode as a counter electrode of the carbon electrode was 27 A/$dm^2$ (the ratio of the current density at the aluminum anode time to the current density at the cathode time: 1:0.95) and the average quantity of electricity at the aluminum anode time was 350 C/$dm^2$. Subsequently, the aluminum plate was subjected to an etching treatment by spraying an aqueous solution containing 26% of sodium hydroxide and 6.5% aluminum ion at a liquid temperature of 45° C. such that the total etched amount including smut was 0.2 g/$m^2$, and then to a desmutting treatment by spraying an aqueous 25% nitric acid solution (containing 0.3% aluminum ion) at 60° C. for 10 seconds.

<Surface-Roughening Treatment G>

The electrochemical surface-roughening treatment and subsequent treatments of the surface-roughening treatment E were omitted and this treatment was designated as surface-roughening treatment G (mechanical surface-roughening, alkali etching, neutralization and water washing).

<Surface-Roughening Treatment H>

A dissolution treatment was performed by dipping an aluminum plate in an aqueous 1% sodium hydroxide solution kept at 50° C., such that the dissolved amount was 2 g/$m^2$. After washing with water, the aluminum plate was subjected to a neutralization treatment by dipping it in an aqueous solution having the same composition as the electrolytic solution used in the subsequent electrochemical surface-roughening treatment, for 10 seconds and then washed with water.

Thereafter, this aluminum substrate material was subjected to an electrochemical surface-roughening treatment in an aqueous 1% nitric acid solution (containing 0.5% of aluminum ion) at a current density of 50 A/$dm^2$ using a sine wave alternating current by providing a dormant time of 0.5 seconds per once with a quantity of electricity of 250 C/$dm^2$ per once and 500 C/$dm^2$ in total, and then washed with water. After the electrochemical surface-roughening treatment, the aluminum substrate material was subjected to an alkali dissolution treatment by dipping it in an aqueous 1% sodium hydroxide solution kept at 0° C. until the dissolved amount reached 5 g/$m^2$, followed by washing with water, and then to a neutralization treatment by dipping it in an aqueous 10% sulfuric acid solution kept at 25° C. for 10 seconds, followed by washing with water.

<Surface-Roughening Treatment I>

A surface-roughening treatment was performed in the same manner as the surface-roughening treatment H except that the alkali dissolution treatment after the electrochemical surface-roughening treatment was not performed.

Production of Substrates 1 to 6:

Substrates after the surface-roughening treatments A to F each was subjected to an anodization treatment for 20 seconds using an anodization apparatus at a sulfuric acid concentration of 170 g/liter (containing 0.5% of aluminum ion), a liquid temperature of 40° C. and a current density of 30 A/$dm^2$ and then washed with water. Thereafter, each substrate was dipped in an aqueous sodium hydroxide solution at a liquid temperature of 30° C. and a pH of 13 for 70 seconds and then washed with water. Furthermore, the substrate was dipped in a 1% aqueous solution of colloidal silica (Snowtex ST-N produced by Nissan Chemical Industries, Ltd., particle size: about 20 nm) at 70° C. for 14 seconds and then washed with water. Subsequently, each substrate was dipped in 2.5% No. 3 sodium silicate at 70° C. for 14 seconds and then washed with water to produce Substrates 1 to 6.

Production of Substrate 7:

An aluminum plate subjected to the surface-roughening treatment E was anodized for 2 minutes in a solution containing 50 g/liter of oxalic acid at 30° C. and a current density of 12 $A/dm^2$ and then washed with water to produce an anodic oxide film of 4 $g/m^2$. Thereafter, the aluminum plate was dipped in an aqueous sodium hydroxide solution at a pH of 13 and a liquid temperature of 50° C. for 2 minutes and then washed with water. Subsequently, the aluminum plate was dipped in 2.5% No. 3 sodium silicate at 70° C. for 14 seconds and then washed with water to produce Substrate 7.

Production of Substrate 8:

An aluminum plate subjected to the surface-roughening treatment E was anodized for 70 seconds in a solution having a sulfuric acid concentration of 170 g/liter (containing 0.5% of aluminum ion) at a liquid temperature 30° C. and a current density of 5 $A/dm^2$ and then washed with water. Thereafter, the aluminum plate was dipped in an aqueous sodium hydroxide solution at a pH of 13 and a liquid temperature of 30° C. for 30 seconds and then washed with water. Subsequently, a treatment with sodium silicate was performed in the same manner as in Production Example 7 to produce Substrate 8.

Production of Substrates 9 to 13:

Substrates 9 to 13 were produced in the same manner as in Production Example 5 except that the anodization treatment time in Production Example 5 using a substrate subjected to the surface-roughening treatment E was changed to 12 seconds, 16 seconds, 24 seconds, 44 seconds and 90 seconds, respectively.

Production of Substrate 14:

Substrate 14 was produced in the same manner as in Production Example 5 of Substrate except for not performing the dipping treatment in an aqueous colloidal silica solution.

Production of Substrate 15:

A substrate after the surface-roughening treatment E was subjected to an anodization treatment using an electrolytic solution having a sulfuric acid concentration of 100 g/liter and an aluminum ion concentration of 5 g/liter at a liquid temperature of 51° C. and a current density of 30 $A/dm^2$ and then washed with water to produce an anodic oxide film of 2 $g/m^2$. Thereafter, the substrate was anodized using an electrolytic solution having a sulfuric acid concentration of 170 g/liter and an aluminum ion concentration of 5 g/liter at a liquid temperature of 40° C. and a current density of 30 $A/dm^2$ by controlling such that the total amount of anodic oxide film became 4.0 $g/m^2$, and then washed with water to produce an anodic oxide film. Subsequently, the substrate was dipped in an aqueous 2.5% No. 3 sodium silicate solution at a liquid temperature of 70° C. for 14 seconds and then washed with water to produce Substrate 15.

Production of Substrate 16:

A substrate after the surface-roughening treatment E was subjected. to an anodization treatment using an electrolytic solution having a sulfuric acid concentration of 170 g/liter and an aluminum ion concentration of 5 g/liter at a liquid temperature of 43° C. and a current density of 30 $A/dm^2$ and then washed with water to produce an anodic oxide film of 2 $g/m^2$. Thereafter, the substrate was anodized using an electrolytic solution having a phosphoric acid concentration of 120 g/liter and an aluminum ion concentration of 5 g/liter at a liquid concentration of 40° C. and a current density of 18 $A/dm^2$ and then washed with water. Subsequently, the substrate was dipped in an aqueous 2.5% No. 3 sodium silicate solution at a liquid temperature of 70° C. for 14 seconds and then washed with water to produce Substrate 16.

Production of Comparative Substrate (Comparisons 1 to 3)

Comparative Substrates 1 to 3 were produced in the same manner as in Production Example 14 except for using substrates subjected to the surface-roughening treatments G, H and I, respectively, in place of the surface-roughened substrate of Production Example 14.

Production of Comparative Substrate (Comparison 4)

Comparative Substrate 4 was produced in the same manner as in Production Example 7 except for changing the sodium hydroxide treatment time of Production Example 7 to 3 minutes.

Production of Comparative Substrate (Comparison 5)

A substrate subjected to the surface-roughening treatment A was anodized using an electrolytic solution having a sulfuric acid concentration of 200 g/liter and an aluminum ion concentration of 5 g/liter at a liquid temperature of 45° C., a voltage of about 10 V and a current density of 1.5 $A/dm^2$ for about 300 hours to produce an anodic oxide film of 3 $g/m^2$ and then washed with water. Thereafter, the substrate was treated with an aqueous solution containing 20 g/liter of sodium hydrogencarbonate at a liquid temperature of 40° C. for 30 seconds, then rinsed with water at about 20° C. for 120 seconds and dried. The obtained substrate was dipped in an aqueous 5% citric acid solution for 60 seconds, washed with water and dried at 40° C. to produce Comparative Substrate 5.

The aluminum substrates obtained in these Production Examples were determined on the surface-roughened shape, physical properties of the hydrophilic film and the like and the results are shown in Table 2. Each physical property value was measured by the following method. The measurement of density was performed by the method described above.

<Method for Measuring Average Opening Size of Large Wave, Average Opening Size of Small Pit, and Ratio of Average Depth of Small Pit to Average Opening Size of Small Pit>

These values each was measured by taking an SEM photograph of the aluminum substrate surface. In the measurement of the average opening size $d_2$ ($\mu$m) of large wave, an SEM photograph at a magnification of 1,000 was taken, waves having a clearly distinguishable contour were individually measured on the long diameter and the short diameter, the average thereof was used as an opening size of wave, and the sum of opening sizes of large waves measured in the SEM photograph was divided by the number of large waves measured, that is, 50. SEM used was T-20 manufactured by JEOL Ltd.

The average opening size $d_1$ ($\mu$m) of small pits was measured using an SEM photograph at a magnification of 30,000, in the same manner as the opening size of large wave. SEM used here was S-900 manufactured by Hitachi Ltd.

The ratio $h/d_1$ of the average depth h ($\mu$m) of small pit to the average opening size $d_1$ ($\mu$m) of small pit was measured using an SEM photograph at a magnification of 30,000 of the cross section and the average of 50 portions measured was used.

<Method for Measuring Heat Conductivity in Film Thickness Direction of Hydrophilic Film>

In addition to Aluminum Substrates 1 to 16 of the present invention and Comparative Substrates 1 to 5, aluminum substrates different from these substrates only in the thickness of the hydrophilic film were produced, where two kinds of substrates were produced for each case. The aluminum substrates different only in the film thickness were produced in the same manner as the aluminum substrates of Production Examples except for setting the anodization time to 0.5 times and 2 times.

Thereafter, three kinds of aluminum substrates different only in the film thickness were subjected to the measurement by the apparatus shown in FIG. 2 and the heat conductivity in the film thickness direction of the hydrophilic film was calculated according to equation (1). The measurement was performed at five different points on the sample and the average thereof was used.

The film thickness of the hydrophilic film was determined by observing the cross section of the hydrophilic film using SEM T-20 manufactured by JEOL Ltd. and actually measuring the film thickness at 50 portions, and the average thereof was used.

<Method for Measuring Pore Size of Micropore of Anodic Oxide Film>

As the pore size of micropore of the anodic oxide film, the pore size in the surface layer and the pore size at the position in the depth of 0.4 μm from the surface layer were measured. The anodic oxide film surface in the case of surface layer pore size or the anodized aluminum substrate in the case of pore size at 0.4 μm from the surface layer was bent and the side surface (usually, broken section) of the cracked portion generated upon bending was observed using a super-high resolution SEM (Hitachi S-900). The observation was performed at a relatively low acceleration voltage of 12 V and a magnification of 150,000 without applying a vapor deposition treatment or the like for imparting electric conducting property. For either pore size, an average of the measured values of randomly extracted 50 pores was used. The error in the standard deviation was ±10% or less in either case.

<Method for Measuring Porosity>

The porosity of the anodic oxide film was determined by the following formula:

$$\text{Porosity (\%)}=\{1-(\text{density of oxide film}/3.98)\}\times 100$$

In this formula, 3.98 is the density (g/cm$^3$) of aluminum oxide according to *Kagaku Binran* (*Handbook of Chemistry*).

TABLE 2

Production Conditions and Properties of Aluminum Substrate

| | | | | | | Anodization | | | | | Pore Size (μm) | | |
|---|---|---|---|---|---|---|---|---|---|---|---|---|---|
| Substrate No | Surface-Roughening Treatment | Electrochemical Surface-Roughening Electrolytic Solution | Large Wave (μm) | Size of Small Pit (μm) | Depth/Pit Size Ratio | Electrolytic Solution | Amount of Film (g/m$^2$) | Heat Conductivity (W/mK) | Density (kg/m$^2$) | Porosity (%) | Surface Layer | 0.4 μm from Surface Layer | Sealing |
| 1 | A | hydrochloric acid | 4.8 | 0.6 | 0.15 | sulfuric acid | 5.0 | 0.4 | 2000 | 50 | 0 | 30 | done |
| 2 | B | hydrochloric acid | 3.5 | 0.6 | 0.18 | sulfuric acid | 5.0 | 0.4 | 2000 | 50 | 0 | 30 | done |
| 3 | C | hydrochloric acid + acetic acid | 5.0 | 0.8 | 0.20 | sulfuric acid | 5.0 | 0.4 | 2000 | 50 | 0 | 30 | done |
| 4 | D | hydrochloric acid | 4.5 | 0.3 | 0.25 | sulfuric acid | 5.0 | 0.4 | 2000 | 50 | 0 | 30 | done |
| 5 | E | hydrochloric acid | 17 | 0.05 | 0.20 | sulfuric acid | 5.0 | 0.4 | 2000 | 50 | 0 | 30 | done |
| 6 | F | hydrochloric acid → nitric acid | 4.8 | 2.8 | 0.50 | sulfuric acid | 5.0 | 0.4 | 2000 | 50 | 0 | 30 | done |
| 7 | E | hydrochloric acid | 17 | 0.05 | 0.20 | oxalic acid | 4.0 | 0.05 | 1050 | 70 | 40 | 50 | none |
| 8 | E | hydrochloric acid | 17 | 0.05 | 0.20 | sulfuric acid | 4.0 | 0.5 | 3150 | 20 | 20 | 20 | none |
| 9 | E | hydrochloric acid | 17 | 0.05 | 0.20 | sulfuric acid | 3.2 | 0.4 | 2000 | 50 | 0 | 24 | done |
| 10 | E | hydrochloric acid | 17 | 0.05 | 0.20 | sulfuric acid | 4.0 | 0.4 | 2000 | 50 | 0 | 27 | done |
| 11 | E | hydrochloric acid | 17 | 0.05 | 0.20 | sulfuric acid | 6.0 | 0.4 | 2000 | 50 | 0 | 32 | done |
| 12 | E | hydrochloric acid | 17 | 0.05 | 0.20 | sulfuric acid | 10.0 | 0.4 | 1800 | 55 | 0 | 35 | done |
| 13 | E | hydrochloric acid | 17 | 0.05 | 0.20 | sulfuric acid | 20.0 | 0.4 | 1600 | 60 | 0 | 38 | done |
| 14 | E | hydrochloric acid | 17 | 0.05 | 0.20 | sulfuric acid | 5.0 | 0.4 | 2000 | 50 | 20 | 30 | none |
| 15 | E | hydrochloric acid | 17 | 0.05 | 0.20 | sulfuric acid → sulfuric acid | 4.0 | 0.4 | 3000 | 25 | 10 | 20 | none |
| 16 | E | hydrochloric acid | 17 | 0.05 | 0.20 | sulfuric acid → phosphoric acid | 4.0 | 0.3 | 2500 | 40 | 15 | 200 | none |

TABLE 2-continued

Production Conditions and Properties of Aluminum Substrate

| Substrate No | Surface-Roughening Treatment | Electrochemical Surface-Roughening Electrolytic Solution | Large Wave (μm) | Size of Small Pit (μm) | Depth/Pit Size Ratio | Anodization Electrolytic Solution | Amount of Film (g/m²) | Heat Conductivity (W/mK) | Density (kg/m²) | Porosity (%) | Pore Size (μm) Surface Layer | Pore Size (μm) 0.4 μm from Surface Layer | Sealing |
|---|---|---|---|---|---|---|---|---|---|---|---|---|---|
| Comparison 1 | G | none | 17 | none | none | sulfuric acid | 4.0 | 0.4 | 2000 | 50 | 30 | 30 | none |
| Comparison 2 | H | nitric acid | none | 3.4 | 0.18 | sulfuric acid | 4.0 | 0.4 | 2000 | 50 | 30 | 30 | none |
| Comparison 3 | I | nitric acid | none | 2.1 | 0.60 | sulfuric acid | 4.0 | 0.4 | 2000 | 50 | 30 | 30 | none |
| Comparison 4 | E | hydrochloric acid | 17 | 0.1 | 0.20 | sulfuric acid | 4.0 | 0.03 | 800 | 80 | 50 | 60 | none |
| Comparison 5 | A | hydrochloric acid | 4.8 | 0.6 | 0.15 | sulfuric acid | 3.0 | 0.7 | 3400 | 15 | 7 | 10 | none |

Production Examples of Fine Particle

<Production of Polymer Fine Particle>

A stirrer, a thermometer, a dropping funnel, a nitrogen inlet tube and a reflux condenser were equipped with a 1,000 ml-volume four-neck flask and while introducing a nitrogen gas and thereby performing deoxidation, 350 ml of distilled water was added and heated until the inner temperature reached 80° C. Thereto, 1.5 g of 3.0 g sodium dodecylsulfate was added as a dispersant, 0.45 g of ammonium persulfate was further added as an initiator, and a mixture of 45.0 g of glycidyl methacrylate and 45.0 g of styrene was added dropwise through a dropping funnel over about 1 hour. After the completion of dropwise addition, the reaction was continued for 5 hours and then, unreacted monomers were removed by water vapor distillation. Thereafter, the reactant was cooled and adjusted to a pH of 6 with aqueous ammonia. Finally, pure water was added to have a non-volatile content of 15%, thereby obtaining a water dispersion of high molecular polymer fine particle. The particle size distribution of this high molecular polymer fine particle had a maximum value at the particle size of 60 nm.

The particle size distribution was determined by taking an electron microphotograph of polymer fine particles, measuring the particle diameter of 5,000 fine particles in total on the photograph, dividing the measured particle size values into 50 from the maximum to 0 by a logarithmic scale and plotting the appearance frequency of each particle size. In the case of a non-spherical particle, the particle size of a spherical particle having the same particle area as the particle area on the photograph was used as the particle size.

<Production of Microcapsule>

In 90 g of ethyl acetate, 30 g of an adduct of trimethylolpropane and xylylene diisocyanate (D-110N produced by Takeda Chemical Industries, Ltd.), 30 g of Epikote 1001 (produced by Yuka Shell Epoxy), 8 g of a light-to-heat converting agent (IR-26 shown above), 0.5 g of Crystal Violet Lactone and 0.5 g of an anionic surfactant PIONIN A41C (produced by Takemoto Yushi) were dissolved to prepare an oil phase component. Separately, 180 g of a 4% aqueous solution of PVA205 (produced by Kuraray Co., Ltd.) was prepared as an aqueous phase component. The oil phase component and the aqueous phase component were emulsified by a homogenizer at 10,000 rpm. Thereto, 120 g of water was added and the solution was stirred at room temperature for 30 minutes and further at 40° C. for 3 hours. The thus-obtained microcapsule solution had a solid content concentration of 18% and the average particle size was 200 nm.

Examples 1 to 4 and Comparative Examples 1 to 4

On the aluminum substrate as Substrate No. 1 in Table 2, Coating Solutions 1 and 2 for Image-recording layer were bar-coated as shown in Table 3 and then dried in an oven at 70° C. for 60 seconds to produce an image-recording layer having a dry coated amount of 0.6 g/m$^2$.

| (Coating Solution 1 for Image-recording layer) | |
|---|---|
| Polymer fine particle (as solid content) | 5.0 g |
| Light-to-heat converting agent (IR-11 shown above) | 1.0 g |
| Pentaerythritol tetraacrylate | 1.0 g |
| Methanol | 16.0 g |
| Water | 24.0 g |

| (Coating Solution 2 for Image-recording layer) | |
|---|---|
| Polymer fine particle (as solid content) | 5.0 g |
| Light-to-heat converting agent (IR-11 shown above) | 1.0 g |
| Pentaerythritol tetraacrylate | 0.2 g |
| Polyacrylic acid (weight average molecular weight: 25,000) | 0.8 g |
| Methanol | 16.0 g |
| Water | 24.0 g |

On the thus-produced image-recording layer, Coating Solutions 1 to 4 for Overcoat Layer were bar-coated in combination as shown in Table 3 and then dried in an oven at 60° C. for 120 seconds. The dry coated amount of the overcoat layer was 0.3 g/m$^2$.

| (Coating Solution 2 for Overcoat Layer) | |
|---|---|
| Carboxymethyl cellulose (weight average molecular weight: 20,000) | 5.0 g |
| Water | 50.0 g |

| (Coating Solution 2 for Overcoat Layer) | |
|---|---|
| Polymer fine particle (as solid content) | 4.0 g |
| Polyacrylic acid (weight average molecular weight: 25,000) | 1.0 g |

-continued

| | |
|---|---|
| Light-to-heat converting agent (IR-11 shown above) | 0.1 g |
| Water | 50.0 g |
| (Coating Solution 3 for Overcoat Layer) | |
| Microcapsule (as solid content) | 4.0 g |
| Polyacrylic acid (weight average molecular weight: 25,000) | 1.0 g |
| Light-to-heat converting agent (IR-11 shown above) | 0.1 g |
| Water | 50.0 g |
| (Coating Solution 4 for Overcoat Layer) | |
| Microcapsule (as solid content) | 4.0 g |
| Polyacrylic acid (weight average molecular weight: 25,000) | 1.0 g |
| Light-to-heat converting agent (IR-11 shown above) | 1.5 g |
| Water | 50.0 g |

The thus-obtained lithographic printing plate precursor was exposed by Trendsetter 3244VFS manufactured by CREO Corporation having mounted thereon a water cooling-type 40 W infrared semiconductor laser, under such conditions that the output was 9 W, the outer drum rotation number was 105 rpm, the plate surface energy was 200 $mJ/cm^2$ and the resolution was 2,400 dpi. Thereafter, without passing through a processing, the plate was fixed on a cylinder of a press SOR-M manufactured by Heidelberg and after supplying a fountain solution, used for printing by supplying an ink. Any printing plate precursor exhibited good on-press developability. The presence or absence of ablation determined by the observation of the plate surface after exposure and the number of sheets printed are shown in Table 3.

TABLE 3

Examples 1 to 4 and Comparative Examples 1 to 4

| | Coating Solution Used | | | |
|---|---|---|---|---|
| | Image-recording layer | Overcoat Layer | Generation of Ablation | Number of Sheets Printed |
| Example 1 | 1 | 1 | none | 34,000 |
| Example 2 | 1 | 2 | none | 55,000 |
| Example 3 | 1 | 3 | none | 60,000 |
| Example 4 | 1 | 4 | none | 37,000 |
| Comparative Example 1 | 1 | none | generated | 30,000 |
| Comparative Example 2 | 2 | 1 | none | 10,000 |
| Comparative Example 3 | 2 | 2 | none | 15,000 |
| Comparative Example 4 | 2 | 3 | none | 15,000 |

It is seen from these results that the printing plate precursor using a lipophilic image-recording layer not containing a hydrophilic binder resin has higher printing durability than the printing plate precursor using an image-recording layer containing a hydrophilic binder resin; when an overcoat layer containing fine particle is used, the printing durability is more elevated; and the overcoat layer prevents the generation of ablation and also prevents the reduction of printing durability, which is presumed resultant from the image destruction by ablation.

Examples 5 to 20

Lithographic printing plate precursors were produced in the same manner as in Example 1 except for using the substrate shown in Table 4 in place of the aluminum substrate of Example 1. Thereafter, the exposure and printing were performed in the same manner as in Examples 1. As a result, any printing plate precursor exhibited good on-press developability and a good printed matter free of staining was obtained. The number of sheets for on-press development, the number of sheets printed and the number of sheets for cleaning after standing are shown in Table 4.

Here, the number of sheets for on-press development is a number of printing sheets required until complete on-press development was attained and shows the facility of on-press development. The number of sheets for cleaning after standing is a number of printing sheets required until a good printed matter free of staining could be obtained when the press was stopped, the printing plate fixed on the plate cylinder was left standing at it is at room temperature for 1 hour and then, printing was restarted, and shows the difficulty of staining of the printing plate.

TABLE 4

Results of Examples 5 to 20

| | Substrate Used | Number of Sheets Printed | Number of Sheets for On-Press Development | Number of Sheets for Cleaning after Standing |
|---|---|---|---|---|
| Example 5 | 1 | 34,000 | 20 | 22 |
| Example 6 | 2 | 32,000 | 18 | 22 |
| Example 7 | 3 | 30,000 | 20 | 26 |
| Example 8 | 4 | 30,000 | 17 | 27 |
| Example 9 | 5 | 41,000 | 15 | 27 |
| Example 10 | 6 | 25,000 | 22 | 33 |
| Example 11 | 7 | 54,000 | 30 | 45 |
| Example 12 | 8 | 22,000 | 24 | 35 |
| Example 13 | 9 | 35,000 | 19 | 27 |
| Example 14 | 10 | 40,000 | 14 | 33 |
| Example 15 | 11 | 40,000 | 22 | 28 |
| Example 16 | 12 | 45,000 | 17 | 35 |
| Example 17 | 13 | 55,000 | 20 | 27 |
| Example 18 | 14 | 40,000 | 16 | 44 |
| Example 19 | 15 | 37,000 | 16 | 25 |
| Example 20 | 16 | 35,000 | 20 | 30 |

It is seen from these results that the lithographic printing plate of the present invention has good on-press developability, high impression capacity and good difficulty of staining. In all of Examples 5 to 20, ablation was not generated at exposure.

Production Example of Fine Particle

Production Example 2-1

Heat-Fusible Polymer Fine Particle (2-1)

A stirrer, a thermometer, a dropping funnel, a nitrogen inlet tube and a reflux condenser were equipped with a 1,000 ml-volume four-neck flask and while introducing a nitrogen gas and thereby performing deoxidation, 350 ml of distilled water was added and heated until the inner temperature reached 80° C. Thereto, 1.0 g of sodium dodecylsulfate and 1.5 g of polyvinyl alcohol (KL05 produced by Nippon Synthetic Chemical Industry Co., Ltd.) were added as dispersants, 0.45 g of ammonium persulfate was further added as an initiator, and 90 g of styrene was added dropwise by a dropping funnel over about 1 hour. After the completion of dropwise addition, the reaction was continued for 5 hours and then, unreacted monomer was removed by water vapor distillation. Thereafter, the reactant was cooled and adjusted to a pH of 6 with aqueous ammonia. Finally, pure water was added to have a non-volatile content of 15 wt %, thereby obtaining a water dispersion of Heat-Fusible Polymer Fine Particle (2-1). The particle size distribution of Heat-Fusible Polymer Fine Particle (2-1) had a maximum value at the particle size of 220 nm.

The particle size distribution was determined by taking an electron microphotograph of polymer fine particles, measuring the particle diameter of 5,000 fine particles in total on the photograph, dividing the measured particle size values into 50 from the maximum to 0 by a logarithmic scale and plotting the appearance frequency of each particle size. In the case of a non-spherical particle, the particle size of a spherical particle having the same particle area as the particle area on the photograph was used as the particle size.

Production Example 2-2

Heat-Fusible Polymer Fine Particle (2-2)

Heat-Fusible Polymer Fine Particle (2-2) was produced in the same manner as in Production Example 2-1 except for replacing 90.0 g of styrene by 60 g of styrene, 25 g of butyl acrylate and 5 g of methacrylic acid and changing the amount of sodium dodecyl sulfate added to 3.0 g. The particle size distribution of Heat-Fusible Polymer Fine Particle (2—2) had a maximum value at the particle size of 50 nm.

Production Example 2-3

Heat-Fusible Polymer Fine Particle (2-3)

In 18.0 g of ethyl acetate, 7.0 g of cresol resin (meta/para ratio: 60/40) having a weight average molecular weight of 5,000, 1.5 g of light-to-heat converting agent (IR-24 shown above) and 0.1 g of an anionic surfactant PIONIN A-41C (produced by Takemoto Yushi) were dissolved to prepare an oil phase component. Separately, a solution was prepared by adding 9.6 g of pure water to 25.4 g of a 4% aqueous solution of polyvinyl alcohol (PVA205 produced by Kuraray Co., Ltd.) and used as an aqueous phase component. The oil phase component and the aqueous phase component were emulsified by a homogenizer at 15,000 rpm. Thereto, 20 g of water was added and the resulting solution was stirred at room temperature for 30 minutes and further at 40° C. for 3 hours to evaporate ethyl acetate. The thus-obtained solution had a solid content concentration of 15.0% and the particle size had a maximum value at 200 nm.

Production Example 2-4

Polymer Fine Particle Having Heat-Reactive Functional Group

A polymer fine particle having a heat-reactive functional group was obtained in the same manner except for replacing 90.0 g of styrene of Production Example 2-1 by 45.0 g of glycidyl methacrylate and 45.0 g of styrene. The solid content concentration was 15.0% and the particle size had a maximum value at 80 nm.

Production Example 2-5

Microcapsule (2-1)

In 90 g of ethyl acetate, 30 g of an adduct of trimethylolpropane and xylylene diisocyanate (D-110N produced by Takeda Chemical Industries, Ltd.), 30 g of Epikote 1001 (produced by Yuka Shell Epoxy), 8 g of a light-to-heat converting agent (IR-26 shown above), 0.5 g of Crystal Violet Lactone and 0.5 g of an anionic surfactant PIONIN A41C (produced by Takemoto Yushi) were dissolved to prepare an oil phase component. Separately, 180 g of a 4% aqueous solution of PVA205 (produced by Kuraray Co., Ltd.) was prepared as an aqueous phase component. The oil phase component and the aqueous phase component were emulsified by a homogenizer at 10,000 rpm. Thereto, 120 g of water was added and the solution was stirred at room temperature for 30 minutes and further at 40° C. for 3 hours. The thus-obtained microcapsule solution had a solid content concentration of 18% and the average particle size was 200 nm.

Production Example 2-6

Microcapsule (2-2)

A water dispersion of Microcapsule (2—2) was obtained in the same manner except for using 25 g of hydroquinone-bis(2-hydroxyethyl) ether and 5 g of bisphenol A in place of Epikote 1001 of Production Example 2-5. This microcapsule solution had a solid content concentration of 18% and the average particle size was 200 nm.

Examples 2-1 to 2-16 and Comparative Examples 2-1 to 2-5

On the aluminum substrate obtained in Production Example, Coating Solution 2-1 for Image-Recording Layer containing polymer fine particles different in the particle size distribution was coated and then dried in an oven at 70° C. for 120 seconds to produce a lithographic printing plate precursor having a dry coated amount of 0.8 g/m$^2$. The aluminum substrate used in each Example is shown in Table 2-3.

(Coating Solution 2-1 for Image-Recording Layer)

| | |
|---|---|
| Heat-Fusible Polymer Fine Particle (2-1) | 5.0 g (as solid content) |
| Heat-Fusible Polymer Fine Particle (2-2) | 5.0 g (as solid content) |
| Light-to-heat converting agent (IR-10 shown above) | 1.0 g |
| Polyacrylic acid (weight average molecular weight) | 1.0 g |
| Water | 50.0 g |

The thus-obtained lithographic printing plate precursor was exposed by Trendsetter 3244VFS manufactured by CREO Corporation having mounted thereon a water cooling-type 40 W infrared semiconductor laser, under such conditions that the output was 9 W, the outer drum rotation number was 105 rpm, the plate surface energy was 200 mJ/cm$^2$ and the resolution was 2,400 dpi. Thereafter, without passing through a processing, the plate was fixed on a plate cylinder of a press SOR-M manufactured by Heidelberg and after supplying a fountain solution, used for printing by supplying an ink. As a result, on-press development could be performed without any problem and a good printed matter free of staining could be obtained. The results in printing using each printing plate are shown in Table 2-3.

TABLE 2-3

Printing Results of Examples 2-1 to 2-16 and Comparative Examples 2-1 to 2-5

| | Substrate Used | Number of Sheets Printed | Number of Sheets for On-Press Development | Number of Sheets for Cleaning after Standing |
|---|---|---|---|---|
| Example 2-1 | 1 | 33,000 | 25 | 30 |
| Example 2-2 | 2 | 30,000 | 25 | 30 |
| Example 2-3 | 3 | 30,000 | 25 | 30 |
| Example 2-4 | 4 | 30,000 | 25 | 35 |
| Example 2-5 | 5 | 35,000 | 25 | 30 |
| Example 2-6 | 6 | 30,000 | 25 | 35 |
| Example 2-7 | 7 | 40,000 | 40 | 40 |
| Example 2-8 | 8 | 28,000 | 30 | 35 |
| Example 2-9 | 9 | 30,000 | 25 | 30 |
| Example 2-10 | 10 | 33,000 | 25 | 30 |
| Example 2-11 | 11 | 33,000 | 25 | 30 |
| Example 2-12 | 12 | 40,000 | 25 | 35 |
| Example 2-13 | 13 | 50,000 | 25 | 30 |
| Example 2-14 | 14 | 35,000 | 25 | 35 |
| Example 2-15 | 15 | 33,000 | 30 | 30 |
| Example 2-16 | 16 | 30,000 | 30 | 35 |
| Comparative Example 2-1 | Comparison 1 | 2,000 | 90 | 110 |
| Comparative Example 2-2 | Comparison 2 | 5,000 | 25 | 30 |
| Comparative Example 2-3 | Comparison 3 | 30,000 | 70 | 100 |
| Comparative Example 2-4 | Comparison 4 | 40,000 | 80 | 130 |
| Comparative Example 2-5 | Comparison 5 | 2,000 | 25 | 35 |

In the Table, the number of sheets for on-press development is a number of printing sheets required until complete on-press development was attained and shows the facility of on-press development. The number of sheets for cleaning after standing is a number of printing sheets required until a good printed matter free of staining could be obtained when the press was stopped, the printing plate fixed on the plate cylinder was left standing at it is at room temperature for 1 hour and then, printing was restarted, and shows the difficulty of staining of the printing plate.

Examples 2-17 to 2-32 and Comparative Example 2-6 to 2-10

Lithographic printing plate precursors were produced by performing the coating and drying in the same manner as in Examples 2-1 to 2-16 and Comparative Examples 2-1 to 2-5 except for using Coating Solution 2-2 for Image-Recording Layer shown below in place of Coating Solution 2-1 for Image-Recording Layer used in Examples 2-1 to 2-16 and Comparative Examples 2-1 to 2-5. The exposure and printing were also performed in the same manner and the results are shown in Table 2-4.

| (Coating Solution 2-2 for Image-Recording Layer) | |
|---|---|
| Heat-Fusible Polymer Fine Particle (2-2) | 5.0 g (as solid content) |
| Heat-Fusible Polymer Fine Particle (2-3) | 5.0 g (as solid content) |
| Polyacrylic acid (weight average molecular weight) | 1.0 g |
| Water | 50.0 g |

TABLE 2-4

Printing Results of Examples 2-27 to 2-32 and Comparative Examples 2-6 to 2-10

| | Substrate Used | Number of Sheets Printed | Number of Sheets for On-Press Development | Number of Sheets for Cleaning after Standing |
|---|---|---|---|---|
| Example 2-17 | 1 | 25,000 | 30 | 40 |
| Example 2-18 | 2 | 25,000 | 30 | 40 |
| Example 2-19 | 3 | 25,000 | 30 | 45 |
| Example 2-20 | 4 | 25,000 | 35 | 45 |
| Example 2-21 | 5 | 35,000 | 30 | 45 |
| Example 2-22 | 6 | 22,000 | 30 | 40 |
| Example 2-23 | 7 | 40,000 | 35 | 65 |
| Example 2-24 | 8 | 20,000 | 35 | 50 |
| Example 2-25 | 9 | 27,000 | 30 | 45 |
| Example 2-26 | 10 | 30,000 | 30 | 45 |
| Example 2-27 | 11 | 30,000 | 30 | 45 |
| Example 2-28 | 12 | 32,000 | 30 | 40 |
| Example 2-29 | 13 | 35,000 | 30 | 40 |
| Example 2-30 | 14 | 30,000 | 30 | 40 |
| Example 2-31 | 15 | 28,000 | 35 | 45 |
| Example 2-32 | 16 | 25,000 | 30 | 45 |
| Comparative Example 2-6 | Comparison 1 | 2,000 | 100 | 160 |
| Comparative Example 2-7 | Comparison 2 | 3,000 | 30 | 40 |
| Comparative Example 2-8 | Comparison 3 | 18,000 | 80 | 80 |
| Comparative Example 2-9 | Comparison 4 | 25,000 | 120 | 120 |
| Comparative Example 2-10 | Comparison 5 | 2,000 | 30 | 50 |

Examples 2-33 to 2-48 and Comparative Examples 2-11 to 2-15

Lithographic printing plate precursors were produced by performing the coating and drying in the same manner as in Examples 2-1 to 2-16 and Comparative Examples 2-1 to 2-5 except for using Coating Solution 2-3 for Image-Recording Layer shown below in place of Coating Solution 2-1 for Image-Recording Layer used in Examples 2-1 to 2-16 and Comparative Examples 2-1 to 2-5. The exposure and printing were also performed in the same manner and the results are shown in Table 2-5.

| (Coating Solution 2-3 for Image-Recording Layer) | |
|---|---|
| Heat-Fusible Polymer Fine Particle (2-2) | 5.0 g (as solid content) |
| Polymer fine particle having heat-reactive group | 5.0 g (as solid content) |
| Light-to-heat converting agent (IR-10 shown above) | 1.0 g |
| Polyacrylic acid (weight average molecular weight) | 1.0 g |
| Water | 50.0 g |

TABLE 2-5

Printing Results of Examples 2-33 to 2-48 and Comparative Examples 2-11 to 2-15

| | Substrate Used | Number of Sheets Printed | Number of Sheets for On-Press Development | Number of Sheets for Cleaning after Standing |
|---|---|---|---|---|
| Example 2-33 | 1 | 40,000 | 25 | 30 |
| Example 2-34 | 2 | 40,000 | 25 | 30 |
| Example 2-35 | 3 | 40,000 | 25 | 30 |
| Example 2-36 | 4 | 40,000 | 25 | 30 |
| Example 2-37 | 5 | 50,000 | 25 | 30 |
| Example 2-38 | 6 | 35,000 | 25 | 30 |
| Example 2-39 | 7 | 65,000 | 35 | 45 |
| Example 2-40 | 8 | 30,000 | 30 | 40 |
| Example 2-41 | 9 | 40,000 | 25 | 30 |
| Example 2-42 | 10 | 50,000 | 25 | 30 |
| Example 2-43 | 11 | 50,000 | 25 | 35 |
| Example 2-44 | 12 | 60,000 | 25 | 35 |
| Example 2-45 | 13 | 60,000 | 25 | 35 |
| Example 2-46 | 14 | 50,000 | 25 | 40 |
| Example 2-47 | 15 | 40,000 | 25 | 30 |
| Example 2-48 | 16 | 40,000 | 25 | 35 |
| Comparative Example 2-11 | Comparison 1 | 4,000 | 90 | 100 |
| Comparative Example 2-12 | Comparison 2 | 5,000 | 30 | 40 |
| Comparative Example 2-13 | Comparison 3 | 25,000 | 60 | 70 |
| Comparative Example 2-14 | Comparison 4 | 30,000 | 90 | 70 |
| Comparative Example 2-15 | Comparison 5 | 5,000 | 25 | 40 |

Examples 2-49 to 2-64 and Comparative Examples 2-16 to 2-20

Lithographic printing plate precursors were produced by performing the coating and drying in the same manner as in Examples 2-1 to 2-16 and Comparative Examples 2-1 to 2-5 except for using Coating Solution 2-4 for Image-Recording Layer shown below in place of Coating Solution 2-1 for Image-Recording Layer used in Examples 2-1 to 2-16 and Comparative Examples 2-1 to 2-5. The exposure and printing were also performed in the same manner and the results are shown in Table 2-6.

| (Coating Solution 2-4 for Image-Recording Layer) | |
|---|---|
| Heat-Fusible Polymer Fine Particle (2-2) | 5.0 g (as solid content) |
| Microcapsule (2-1) | 5.0 g (as solid content) |

-continued

| (Coating Solution 2-4 for Image-Recording Layer) | |
|---|---|
| Light-to-heat converting agent (IR-10 shown above) | 1.0 g |
| Polyacrylic acid (weight average molecular weight) | 1.0 g |
| Water | 50.0 g |

TABLE 2-6

Printing Results of Examples 2-49 to 2-64 and Comparative Examples 2-16 to 2-20

| | Substrate Used | Number of Sheets Printed | Number of Sheets for On-Press Development | Number of Sheets for Cleaning after Standing |
|---|---|---|---|---|
| Example 2-49 | 1 | 40,000 | 23 | 25 |
| Example 2-50 | 2 | 40,000 | 23 | 25 |
| Example 2-51 | 3 | 40,000 | 25 | 25 |
| Example 2-52 | 4 | 40,000 | 22 | 25 |
| Example 2-53 | 5 | 55,000 | 25 | 25 |
| Example 2-54 | 6 | 35,000 | 22 | 25 |
| Example 2-55 | 7 | 60,000 | 28 | 40 |
| Example 2-56 | 8 | 25,000 | 26 | 30 |
| Example 2-57 | 9 | 35,000 | 22 | 27 |
| Example 2-58 | 10 | 45,000 | 20 | 28 |
| Example 2-59 | 11 | 45,000 | 21 | 25 |
| Example 2-60 | 12 | 45,000 | 19 | 27 |
| Example 2-61 | 13 | 60,000 | 20 | 27 |
| Example 2-62 | 14 | 50,000 | 21 | 45 |
| Example 2-63 | 15 | 40,000 | 21 | 30 |
| Example 2-64 | 16 | 40,000 | 19 | 30 |
| Comparative Example 2-16 | Comparison 1 | 2,000 | 90 | 120 |
| Comparative Example 2-17 | Comparison 2 | 5,000 | 20 | 30 |
| Comparative Example 2-18 | Comparison 3 | 40,000 | 50 | 100 |
| Comparative Example 2-19 | Comparison 4 | 45,000 | 85 | 150 |
| Comparative Example 2-20 | Comparison 5 | 2,000 | 25 | 35 |

Examples 2-65 to 2-80 and Comparative Examples 2-21 to 2-25

Lithographic printing plate precursors were produced by performing the coating and drying in the same manner as in Examples 2-1 to 2-16 and Comparative Examples 2-1 to 2-5 except for using Coating Solution 2-5 for Image-Recording Layer shown below in place of Coating Solution 2-1 for Image-Recording Layer used in Examples 2-1 to 2-16 and Comparative Examples 2-1 to 2-5. The exposure and printing were also performed in the same manner and the results are shown in Table 2-7.

| (Coating Solution 2-5 for Image-Recording Layer) | |
|---|---|
| Microcapsule 2-1 | 5.0 g (as solid content) |
| Microcapsule 2-2 | 5.0 g (as solid content) |
| p-Diazodiphenylamine sulfate | 0.2 g |

TABLE 2-7

Printing Results of Examples 2-65 to 2-80 and Comparative Examples 2-21 to 2-25

| | Substrate Used | Number of Sheets Printed | Number of Sheets for On-Press Development | Number of Sheets for Cleaning after Standing |
|---|---|---|---|---|
| Example 2-65 | 1 | 55,000 | 20 | 30 |
| Example 2-66 | 2 | 55,000 | 20 | 35 |
| Example 2-67 | 3 | 55,000 | 20 | 35 |
| Example 2-68 | 4 | 55,000 | 25 | 35 |
| Example 2-69 | 5 | 70,000 | 25 | 35 |
| Example 2-70 | 6 | 50,000 | 25 | 30 |
| Example 2-71 | 7 | 80,000 | 30 | 40 |
| Example 2-72 | 8 | 45,000 | 25 | 35 |
| Example 2-73 | 9 | 55,000 | 20 | 30 |
| Example 2-74 | 10 | 70,000 | 20 | 30 |
| Example 2-75 | 11 | 75,000 | 20 | 30 |
| Example 2-76 | 12 | 80,000 | 20 | 30 |
| Example 2-77 | 13 | 80,000 | 20 | 30 |
| Example 2-78 | 14 | 60,000 | 20 | 40 |
| Example 2-79 | 15 | 55,000 | 25 | 30 |
| Example 2-80 | 16 | 55,000 | 25 | 35 |
| Comparative Example 2-21 | Comparison 1 | 4,000 | 100 | 100 |
| Comparative Example 2-22 | Comparison 2 | 5,000 | 25 | 30 |
| Comparative Example 2-23 | Comparison 3 | 55,000 | 80 | 100 |
| Comparative Example 2-24 | Comparison 4 | 60,000 | 110 | 100 |
| Comparative Example 2-25 | Comparison 5 | 5,000 | 30 | 30 |

Synthesis Examples of Self Water-Dispersible Resin Fine Particle:

Synthesis Example 3-1

Acrylic Resin Fine Particle

Into a 1 liter-volume flask equipped with a stirring unit, a refluxing unit, a thermometer, a dry nitrogen inlet tube and a dropping unit, 400 g of methyl ethyl ketone was charged and heated to 80° C. Thereto, a solution obtained by thoroughly mixing 80 g of styrene, 238.9 g of methyl methacrylate, 24.5 g of methacrylic acid, 56.6 g of butyl acrylate and 8 g of PERBUTYL O (a polymerization initiator, produced by NOF Corporation) was added dropwise over 2 hours. After stirring for 8 hours, 0.5 g of PERBUTYL O was added and the solution was further stirred for 8 hours, as a result, an acrylic resin solution having a dry solid content ratio of 49.5% was obtained. The acid value of the acrylic resin was 39.1 and the number average molecular weight was 20,000. Here, the dry solid content ratio was determined by weighing about 1 part of a sample solution, weighing the sample after drying at 120° C. for 1 hours and calculating the mass ratio therebetween. The number average molecular weight was measured by GPC and shown by a molecular weight in terms of polystyrene. The acid value was determined by weighing a predetermined amount of a sample solution and titrating the sample with a methanol solution of potassium hydroxide having a known concentration.

Then, 100 g of the acrylic resin solution obtained above was neutralized with 2.71 g of triethylamine and thereto, water was added dropwise while stirring. The prepolymer solution was gradually thickened and when about 150 g of water was added dropwise, the viscosity extremely decreased, thereby completing the phase inversion. After further adding 150 g of water, the obtained dispersion solution was heated at 30° C. and the organic solvent and excess water were removed under reduced pressure, as a result, a water dispersion of acrylic resin fine particles having a dry solid content ratio of 33.7% and an average particle size of 0.12 μm was obtained. The particle size was measured by a grain size distribution meter Microtrack UPA-150 of laser doppler system.

Synthesis Example 3-2

Polyester Fine Particle

Into a 2 liter-volume four-neck flask equipped with a stirring unit, a rectifying tube, a dry nitrogen inlet tube and a thermometer, 397.6 g of terephthalic acid, 397.6 g of isophthalic acid, 144.9 g of ethylene glycol and 243.6 g of neopentyl glycol were charged and heated to 160° C. Thereto, 0.5 g of dibutyltin oxide was added and while elevating the temperature to 260° C. over 6 hours, a dehydration reaction was performed. Thereafter, 30 g of xylene was added and while azeotropically removing water at 160° C., stirring was continued for 4 hours. After cooling to room temperature, the reactant was diluted with 500 g of methyl ethyl ketone to obtain a solution of polyester having an acid value of 19.3 and having a carboxyl group at both terminals (dry solid content ratio: 65.5%).

To 100 g of the polyester solution obtained above, 30 g of methyl ethyl ketone was added. The resulting solution was neutralized with 2.36 g of triethylamine and thereto, water was added dropwise while stirring. The prepolymer solution was gradually thickened and when about 150 g of water was added dropwise, the viscosity extremely decreased, thereby completing the phase inversion. After further adding 150 g of water, the obtained dispersion solution was heated at 30° C. and the organic solvent and excess water were removed under reduced pressure, as a result, a water dispersion of polyester fine particles having a dry solid content ratio of 30.0% and an average particle size of 0.30 μm was obtained.

Synthesis Example 3-3

Polyurethane Fine Particle

Into a 1 liter-volume four-neck flask equipped with a stirring unit, a refluxing unit, a dry nitrogen inlet tube and a thermometer, 533 g of BARNOCK DN-980 (polyisocyanate, produced by Dai-Nippon Ink & Chemicals, Inc.), 33.5 g of 2,2-bis(hydroxymethyl)propionic acid, 0.05 g of dibutyltin dilaurate and 300 g of ethyl acetate were charged. The mixture was stirred at 80° C. for 3 hours, as a result, a solution of polyurethane prepolymer having a dry solid content ratio of 50.0% and an NCO (isocyanate group) content of 6.80% was obtained. The NCO content was determined by weighing a predetermined amount of a sample solution, adding a constant amount of an ethyl acetate solution of di-n-butylamine having a known concentration in excess of the isocyanate group measured to allow a reaction to proceed therebetween, and back-titrating the excess di-n-butylamine with an aqueous hydrochloric acid solution having a known concentration.

To 100 g of the polyurethane prepolymer solution obtained above, 30 g of methyl ethyl ketone was added. The resulting solution was neutralized with 3.50 g of triethylamine and thereto, water was added dropwise while stirring. The prepolymer solution was gradually thickened and when about 150 g of water was added dropwise, the viscosity extremely decreased, thereby completing the phase inversion. After further adding 150 g of water, an aqueous solution prepared by dissolving 2.51 g of diethylenetriamine in 50 g of water was gradually added while stirring. The obtained dispersion solution was heated at 30° C. and the organic solvent and excess water were removed under reduced pressure, as a result, a water dispersion of urethane fine particles having an average particle size of 0.78 μm (dry solid content ratio: 33.5%) was obtained. The acid value of the urethane fine particle was 31.2.

Synthesis Example 3-4

Resin Fine Particle Containing Light-to-Heat Converting Agent

In a paint shaker, a blend of 20 g of carbon black, 20 g of styrene acrylic acid resin (styrene/2-ethylhexyl acrylate/acrylic acid (weight ratio: 77/10/13) copolymer, acid value: 100, weight average molecular weight: 40,000), 2 g of oily phthalocyanine dye (IR-26 shown above) and 49 g of methyl ethyl ketone was milled for 4 hours using glass beads having a diameter of 0.2 mm. Thereto, 40 g of methyl ethyl ketone and 40 g of isopropyl alcohol were added and then the contents were taken out to obtain 171 g of a mill base solution. To 171 g of this mill base, 5.3 g (corresponding to a resin neutralization ratio of 100%) of triethanolamine was added and while stirring, a mixed solution of 50 g of glycerin and 120 g of ion exchange water was added dropwise at a rate of 5 ml/min to obtain a water dispersion of light-to-heat converting agent-containing resin fine particles. The obtained water dispersion of resin fine particles was again subjected to a dispersion treatment under a pressure of 1,500 kg/cm$^2$ using a collision-type disperser Nanomizer (manufactured by Nanomizer). To the thus-treated solution, a mixed solution of 80 g of glycerin and 300 g of ion exchange water was added dropwise at a rate of 5 ml/min and then, methyl ethyl ketone and isopropyl alcohol were distilled off using a rotary evaporator to obtain a water dispersion of final resin fine particles. This water dispersion was filtered through a 1.5-μm filter. The resin particles in the obtained dispersion had an average particle size of 0.1 μm and stable dispersion was exhibited over a long period of time without generating agglomerates.

Examples 3-1 to 3-16 and Comparative Examples 3-1 to 3-5

To 36.0 g of a water dispersion of fine particles obtained in Synthesis Example 3-1, 1.0 g of light-to-heat converting agent (IR-11 shown above), 75.0 g of distilled water, 30.0 g of methanol and 0.02 g of Megafac F-177 (produced by Dai-Nippon Ink & Chemicals, Inc.) as a fluorine-containing surfactant were added in this order while stirring. The resulting solution was further stirred at room temperature for 10 minutes to prepare a coating solution.

This coating solution was coated by a wire bar on each of the aluminum substrates (1 to 16) and comparative Substrates (Comparisons 1 to 5) shown in Table 2 and dried at 60° C. for 4 minutes to obtain lithographic printing plate precursors. The dry coated amount was 1.0 g/m$^2$. The thus-obtained lithographic printing plate precursors each was fixed on Trendsetter 3244VFS manufactured by CREO Corporation (a plate setter having mounted thereon a 830 nm semiconductor laser of 40 W) and exposed under the conditions such that the outer drum rotation number was 100 rpm, the plate surface energy was 200 mJ/cm$^2$ and the resolution was 2,400 dpi. The exposed plates each was fixed on a Harris AURELIA press without passing through any more processing and used for printing using a fountain solution comprising an etching solution-containing 10 vol % isopropyl alcohol aqueous solution, and an ink. The results obtained of each plate are shown in Table 3-3.

TABLE 3-3

Printing Results of Examples 3-1 to 3-16 and Comparative Examples 3-1 to 3-5

| | Substrate Used | Number of Sheets Printed | Number of Sheets for On-Press Development | Number of Sheets for Cleaning after Standing |
|---|---|---|---|---|
| Example 3-1 | 1 | 17,000 | 15 | 20 |
| Example 3-2 | 2 | 16,000 | 15 | 20 |
| Example 3-3 | 3 | 15,000 | 20 | 25 |
| Example 3-4 | 4 | 15,000 | 15 | 25 |
| Example 3-5 | 5 | 21,000 | 15 | 25 |
| Example 3-6 | 6 | 13,000 | 20 | 30 |
| Example 3-7 | 7 | 27,000 | 30 | 40 |
| Example 3-8 | 8 | 12,000 | 25 | 30 |
| Example 3-9 | 9 | 17,000 | 20 | 25 |
| Example 3-10 | 10 | 20,000 | 15 | 30 |
| Example 3-11 | 11 | 20,000 | 20 | 25 |
| Example 3-12 | 12 | 22,000 | 15 | 30 |
| Example 3-13 | 13 | 28,000 | 20 | 25 |
| Example 3-14 | 14 | 21,000 | 15 | 40 |
| Example 3-15 | 15 | 19,000 | 15 | 25 |
| Example 3-16 | 16 | 17,000 | 20 | 30 |
| Comparative Example 3-1 | Comparison 1 | 2,000 | 100 | 120 |
| Comparative Example 3-2 | Comparison 2 | 3,000 | 25 | 25 |
| Comparative Example 3-3 | Comparison 3 | 18,000 | 80 | 110 |
| Comparative Example 3-4 | Comparison 4 | 24,000 | 120 | 130 |
| Comparative Example 3-5 | Comparison 5 | 3,000 | 25 | 30 |

In the Table, the number of sheets for on-press development is a number of printing sheets required until complete on-press development was attained and shows the facility of on-press development. The number of sheets for cleaning after standing is a number of printing sheets required until a good printed matter free of staining could be obtained when the press was stopped, the printing plate fixed on the plate cylinder was left standing at it is at room temperature for 1 hour and then, printing was restarted, and shows the difficulty of staining of the printing plate.

Examples 3-17 to 3-32 and Comparative Example 3-6 to 3-10

Lithographic printing plate precursors were produced by preparing a coating solution and performing the coating and drying in the same manner as in Examples 3-1 to 3-16 and Comparative Examples 3-1 to 3-5 except for using the water dispersion of fine particles obtained in Synthesis Example 3-2 in place of the water dispersion of fine particles obtained in Synthesis Example 3-1. The exposure and printing were also performed in the same manner as in Examples 3-1 to 3-16 and Comparative Examples 3-1 to 3-5 and the results are shown in Table 3-4.

TABLE 3-4

Printing Results of Examples 3-17 to 3-32 and Comparative Examples 3-6 to 3-10

| | Substrate Used | Number of Sheets Printed | Number of Sheets for On-Press Development | Number of Sheets for Cleaning after Standing |
|---|---|---|---|---|
| Example 3-17 | 1 | 12,000 | 10 | 20 |
| Example 3-18 | 2 | 11,000 | 15 | 25 |
| Example 3-19 | 3 | 13,000 | 15 | 25 |
| Example 3-20 | 4 | 12,000 | 15 | 30 |
| Example 3-21 | 5 | 15,000 | 10 | 25 |
| Example 3-22 | 6 | 14,000 | 20 | 35 |
| Example 3-23 | 7 | 21,000 | 25 | 40 |
| Example 3-24 | 8 | 13,000 | 25 | 40 |
| Example 3-25 | 9 | 14,000 | 20 | 25 |
| Example 3-26 | 10 | 17,000 | 20 | 30 |
| Example 3-27 | 11 | 16,000 | 20 | 30 |
| Example 3-28 | 12 | 19,000 | 15 | 30 |
| Example 3-29 | 13 | 23,000 | 15 | 25 |
| Example 3-30 | 14 | 15,000 | 10 | 40 |
| Example 3-31 | 15 | 15,000 | 15 | 25 |
| Example 3-32 | 16 | 13,000 | 15 | 25 |
| Comparative Example 3-6 | Comparison 1 | 2,000 | 110 | 110 |
| Comparative Example 3-7 | Comparison 2 | 3,000 | 25 | 25 |
| Comparative Example 3-8 | Comparison 3 | 20,000 | 90 | 120 |
| Comparative Example 3-9 | Comparison 4 | 22,000 | 130 | 130 |
| Comparative Example 3-10 | Comparison 5 | 3,000 | 25 | 35 |

Examples 3-33 to 3-48 and Comparative Examples 3-11 to 3-15

Lithographic printing plate precursors were produced by preparing a coating solution and performing the coating and drying in the same manner as in Examples 3-1 to 3-16 and Comparative Examples 3-1 to 3-5 except for using the water dispersion of fine particles obtained in Synthesis Example 3—3 in place of the water dispersion of fine particles obtained in Synthesis Example 3-1. The exposure and printing were also performed in the same manner as in Examples 3-1 to 3-16 and Comparative Examples 3-1 to 3-5 and the results are shown in Table 3-5.

TABLE 3-5

Printing Results of Examples 3-33 to 3-48 and Comparative Examples 3-11 to 3-15

| | Substrate Used | Number of Sheets Printed | Number of Sheets for On-Press Development | Number of Sheets for Cleaning after Standing |
|---|---|---|---|---|
| Example 3-33 | 1 | 24,000 | 25 | 30 |
| Example 3-34 | 2 | 23,000 | 20 | 35 |
| Example 3-35 | 3 | 23,000 | 22 | 35 |
| Example 3-36 | 4 | 21,000 | 23 | 30 |
| Example 3-37 | 5 | 25,000 | 21 | 30 |
| Example 3-38 | 6 | 17,000 | 20 | 25 |
| Example 3-39 | 7 | 35,000 | 30 | 40 |
| Example 3-40 | 8 | 14,000 | 25 | 36 |
| Example 3-41 | 9 | 23,000 | 20 | 33 |
| Example 3-42 | 10 | 26,000 | 20 | 31 |
| Example 3-43 | 11 | 26,000 | 23 | 30 |
| Example 3-44 | 12 | 30,000 | 20 | 30 |

TABLE 3-5-continued

Printing Results of Examples 3-33 to 3-48 and Comparative Examples 3-11 to 3-15

| | Substrate Used | Number of Sheets Printed | Number of Sheets for On-Press Development | Number of Sheets for Cleaning after Standing |
|---|---|---|---|---|
| Example 3-45 | 13 | 30,000 | 22 | 30 |
| Example 3-46 | 14 | 26,000 | 22 | 35 |
| Example 3-47 | 15 | 20,000 | 22 | 28 |
| Example 3-48 | 16 | 20,000 | 19 | 33 |
| Comparative Example 3-11 | Comparison 1 | 4,000 | 85 | 100 |
| Comparative Example 3-12 | Comparison 2 | 5,000 | 20 | 40 |
| Comparative Example 3-13 | Comparison 3 | 23,000 | 55 | 70 |
| Comparative Example 3-14 | Comparison 4 | 31,000 | 80 | 70 |
| Comparative Example 3-15 | Comparison 5 | 5,000 | 22 | 30 |

Examples 3-49 to 3-64 and Comparative Examples 3-16 to 3-20

Lithographic printing plate precursors were produced by performing the coating and drying in the same manner as in Examples 3-1 to 3-16 and Comparative Examples 3-1 to 3-5 except for using a coating solution obtained by adding 75.0 g of distilled water, 30.0 g of methanol and 0.02 g of Megafac F-177 as a fluorine-containing surfactant in this order while stirring to 36.0 g of the water dispersion of fine particles obtained in Synthesis Example 3-4 and further stirring the solution at room temperature for 10 minutes. The exposure and printing were also performed in the same manner as in Examples 3-1 to 3-16 and Comparative Examples 3-1 to 3-5 and the results are shown in Table 3-6.

TABLE 3-6

Printing Results of Examples 3-49 to 3-64 and Comparative Examples 3-16 to 3-20

| | Substrate Used | Number of Sheets Printed | Number of Sheets for On-Press Development | Number of Sheets for Cleaning after Standing |
|---|---|---|---|---|
| Example 3-49 | 1 | 27,000 | 25 | 35 |
| Example 3-50 | 2 | 27,000 | 20 | 35 |
| Example 3-51 | 3 | 28,000 | 20 | 30 |
| Example 3-52 | 4 | 25,000 | 15 | 30 |
| Example 3-53 | 5 | 30,000 | 20 | 30 |
| Example 3-54 | 6 | 24,000 | 20 | 35 |
| Example 3-55 | 7 | 27,000 | 30 | 43 |
| Example 3-56 | 8 | 29,000 | 30 | 33 |
| Example 3-57 | 9 | 30,000 | 20 | 25 |
| Example 3-58 | 10 | 32,000 | 20 | 27 |
| Example 3-59 | 11 | 35,000 | 25 | 28 |
| Example 3-60 | 12 | 35,000 | 25 | 35 |
| Example 3-61 | 13 | 40,000 | 20 | 35 |
| Example 3-62 | 14 | 31,000 | 20 | 33 |
| Example 3-63 | 15 | 28,000 | 20 | 40 |
| Example 3-64 | 16 | 27,000 | 20 | 33 |
| Comparative Example 3-16 | Comparison 1 | 4,000 | 75 | 100 |
| Comparative Example 3-17 | Comparison 2 | 5,000 | 25 | 35 |
| Comparative Example 3-18 | Comparison 3 | 30,000 | 50 | 85 |

TABLE 3-6-continued

Printing Results of Examples 3-49 to 3-64 and Comparative Examples 3-16 to 3-20

| | Substrate Used | Number of Sheets Printed | Number of Sheets for On-Press Development | Number of Sheets for Cleaning after Standing |
|---|---|---|---|---|
| Comparative Example 3-19 | Comparison 4 | 34,000 | 70 | 85 |
| Comparative Example 3-20 | Comparison 5 | 5,000 | 20 | 35 |

According to the present invention, a heat-sensitive lithographic printing plate precursor having good on-press developability, high sensitivity, high printing durability and good difficulty of staining at printing, such as ink cleaning property, can be provided, which is a lithographic printing plate precursor capable of being fixed, after scan exposure with infrared ray based on digital signals, on a press as it is without passing through a processing and can be used for printing.

This application is based on Japanese Patent application JP 2001-221802, filed Jul. 23, 2001, Japanese Patent application JP 2001-221803, filed Jul. 23, 2001 and Japanese Patent application JP 2001-256331, filed Aug. 27, 2001, the entire content of which is hereby incorporated by reference, the same as if set forth at length.

What is claimed is:

1. A lithographic printing plate precursor comprising an aluminum substrate, an image-recording layer and a hydrophilic film, the aluminum substrate being subjected to an electrochemical surface-roughening treatment in an aqueous solution comprising hydrochloric acid and provided with the hydrophilic film having a heat conductivity of 0.05 to 0.5 W/mK, wherein the image-recording layer comprises at least two fine particles selected from (a) a heat-fusible polymer fine particle, (b) a polymer fine particle having a heat-reactive functional group and (c) a microcapsule containing therein a heat-reactive compound, and at least one of the fine particles undergoes combination by heat to form an image.

2. A lithographic printing plate precursor comprising an aluminum substrate, an image-recording layer and a hydrophilic film, the aluminum substrate being subjected to an electrochemical surface-roughening treatment in an aqueous solution comprising hydrochloric acid and provided with the hydrophilic film having a heat conductivity of 0.05 to 0.5 W/mK, wherein the image-recording layer comprises a self water-dispersible resin fine particle undergoing combination by heat and is writable by an infrared laser exposure.

3. A lithographic printing plate precursor comprising an aluminum substrate, an image-recording layer and a hydrophilic film, the aluminum substrate being subjected to an electrochemical surface-roughening treatment in an aqueous solution comprising hydrochloric acid and provided with the hydrophilic film having a heat conductivity of 0.05 to 0.5 W/mK, said lithographic printing plate precursor further comprising an overcoat layer, wherein the image-recording layer is a lipophilic image-recording layer not comprising a hydrophilic binder resin and comprising a hydrophobic polymer fine particle undergoing combination by heat, a light-to-heat converting agent and a water-insoluble compound having fluidity at 50° C.; and the overcoat layer comprises a water-soluble resin.

4. The lithographic printing plate precursor according to claim 3, wherein the overcoat layer comprises at least one fine particle selected from a hydrophobic polymer fine particle undergoing combination by heat and a microcapsule.

5. The lithographic printing plate precursor according to claim 3, wherein the overcoat layer comprises a light-to-heat converting agent and an optical density of the overcoat layer at the exposure wavelength is lower than an optical density of the image-recording layer at the exposure wavelength.

6. A lithographic printing plate precursor comprising an aluminum substrate, an image-recording layer and a hydrophilic film, the aluminum substrate being subjected to an electrochemical surface-roughening treatment in an aqueous solution comprising hydrochloric acid and provided with the hydrophilic film having at least one of a density of 1,000 to 3,200 kg/m$^3$ and a porosity of 20 to 70%, wherein the image-recording layer comprises at least two fine particles selected from (a) a heat-fusible polymer fine particle, (b) a polymer fine particle having a heat-reactive functional group and (c) a microcapsule containing therein a heat-reactive compound, and at least one of the fine particles undergoes combination by heat to form an image.

7. A lithographic printing plate precursor comprising an aluminum substrate, an image-recording layer and a hydrophilic film, the aluminum substrate being subjected to an electrochemical surface-roughening treatment in an aqueous solution comprising hydrochloric acid and provided with the hydrophilic film having at least one of a density of 1,000 to 3,200 kg/m$^3$ and a porosity of 20 to 70%, wherein the image-recording layer comprises a self water-dispersible resin fine particle undergoing combination by heat and is writable by an infrared laser exposure.

8. A lithographic printing plate precursor comprising an aluminum substrate, an image-recording layer and a hydrophilic film, the aluminum substrate being subjected to an electrochemical surface-roughening treatment in an aqueous solution comprising hydrochloric acid and provided with the hydrophilic film having at least one of a density of 1,000 to 3,200 kg/m$^3$ and a porosity of 20 to 70%, said lithographic printing plate precursor further comprising an overcoat layer, wherein the image-recording layer is a lipophilic image-recording layer not comprising a hydrophilic binder resin and comprising a hydrophobic polymer fine particle undergoing combination by heat, a light-to-heat converting agent and a water-insoluble compound having fluidity at 50° C.; and the overcoat layer comprises a water-soluble resin.

9. The lithographic printing plate precursor according to claim 8, wherein the overcoat layer comprises at least one fine particle selected from a hydrophobic polymer fine particle undergoing combination by heat and a microcapsule.

10. The lithographic printing plate precursor according to claim 8, wherein the overcoat layer comprises a light-to-heat converting agent and an optical density of the overcoat layer at the exposure wavelength is lower than an optical density of the image-recording layer at the exposure wavelength.

11. A lithographic printing plate precursor comprising an aluminum substrate, an image-recording layer and a hydrophilic film, the aluminum substrate having a surface-roughened shape comprising a small pit wherein an average opening size of the small pit is 0.01 to 3 $\mu$m and a ratio of an average depth of the small pit to the average opening size is 0.1 to 0.5, and being provided with the hydrophilic film having a heat conductivity of 0.05 to 0.5 W/mK, wherein the image-recording layer comprises at least two fine particles selected from (a) a heat-fusible polymer fine particle, (b) a polymer fine particle having a heat-reactive functional group and (c) a microcapsule containing therein a heat-reactive compound, and at least one of the fine particles undergoes combination by heat to form an image.

12. A lithographic printing plate precursor comprising an aluminum substrate, an image-recording layer and a hydrophilic film, the aluminum substrate having a surface-roughened shape comprising a small pit wherein an average opening size of the small pit is 0.01 to 3 μm and a ratio of an average depth of the small pit to the average opening size is 0.1 to 0.5, and being provided with the hydrophilic film having a heat conductivity of 0.05 to 0.5 W/mK, wherein the image-recording layer comprises a self water-dispersible resin fine particle undergoing combination by heat and is writable by an infrared laser exposure.

13. A lithographic printing plate precursor comprising an aluminum substrate, an image-recording layer and a hydrophilic film, the aluminum substrate having a surface-roughened shape comprising a small pit wherein an average opening size of the small pit is 0.01 to 3 μm and a ratio of an average depth of the small pit to the average opening size is 0.1 to 0.5. and being provided with the hydrophilic film having a heat conductivity of 0.05 to 0.5 W/mK, said lithographic printing plate precursor further comprising an overcoat layer, wherein the image-recording layer is a lipophilic image-recording layer not comprising a hydrophilic binder resin and comprising a hydrophobic polymer fine particle of undergoing combination by heat, a light-to-heat converting agent and a water-insoluble compound having fluidity at 50° C.; and the overcoat layer comprises a water-soluble resin.

14. The lithographic printing plate precursor according to claim 13, wherein the overcoat layer comprises at least one fine particle selected from a hydrophobic polymer fine particle undergoing combination by heat and a microcapsule.

15. The lithographic printing plate precursor according to claim 13, wherein the overcoat layer comprises a light-to-heat converting agent and an optical density of the overcoat layer at the exposure wavelength is lower than an optical density of the image-recording layer at the exposure wavelength.

16. A lithographic printing plate precursor comprising an aluminum substrate, an image-recording layer and a hydrophilic film, the aluminum substrate having a surface-roughened shape comprising a small pit wherein an average opening size of the small pit is 0.01 to 3 μm and a ratio of an average depth of the small pit to the average opening size is 0.1 to 0.5, and being provided with the hydrophilic film having at least one of a density of 1.000 to 3,200 $kg/m^3$ and a porosity of 20 to 70%, wherein the image-recording layer comprises at least two fine particles selected from (a) a heat-fusible polymer fine particle, (b) a polymer fine particle having a heat-reactive functional group and (c) a microcapsule containing therein a heat-reactive compound, and at least one of the fine particles undergoes combination by heat to form an image.

17. A lithographic printing plate precursor comprising an aluminum substrate, an image-recording layer and a hydrophilic film, the aluminum substrate having a surface-roughened shape comprising a small pit wherein an average opening size of the small pit is 0.01 to 3 μm and a ratio of an average depth of the small pit to the average opening size is 0.1 to 0.5, and being provided with the hydrophilic film having at least one of a density of 1,000 to 3,200 $kg/m^3$ and a porosity of 20 to 70%, wherein the image-recording layer comprises a self water-dispersible resin fine particle undergoing combination by heat and is writable by an infrared laser exposure.

18. A lithographic printing plate precursor comprising an aluminum substrate, an image-recording layer and a hydrophilic film, the aluminum substrate having a surface-roughened shape comprising a small pit wherein an average opening size of the small pit is 0.01 to 3 μm and a ratio of an average depth of the small pit to the average opening size is 0.1 to 0.5, and being provided with the hydrophilic film having at least one of a density of 1,000 to 3,200 $kg/m^3$ and a porosity of 20 to 70%, said lithographic printing plate precursor further comprising an overcoat layer, wherein the image-recording layer is a lipophilic image-recording layer not comprising a hydrophilic binder resin and comprising a hydrophobic polymer fine particle undergoing combination by heat, a light-to-heat converting agent and a water-insoluble compound having fluidity at 50° C.; and the overcoat layer comprises a water-soluble resin.

19. The lithographic printing plate precursor according to claim 18, wherein the overcoat layer comprises at least one fine particle selected from a hydrophobic polymer fine particle undergoing combination by heat and a microcapsule.

20. The lithographic printing plate precursor according to claim 18, wherein the overcoat layer comprises a light-to-heat converting agent and an optical density of the overcoat layer at the exposure wavelength is lower than an optical density of the image-recording layer at the exposure wavelength.

21. A lithographic printing plate precursor comprising an aluminum substrate, a lipophilic image-recording layer and an overcoat layer, the aluminum substrate being subjected to a surface-roughening treatment and having a hydrophilic film, the lipophilic image-recording layer not comprising a hydrophilic binder resin and comprising a hydrophobic polymer fine particle undergoing combination by heat, a light-to-heat converting agent and a water-insoluble compound having fluidity at 50° C., and the overcoat layer comprising a water-soluble resin.

22. The lithographic printing plate precursor according to claim 21, wherein the overcoat layer comprises at least one of a hydrophobic polymer fine particle undergoing combination by heat and a microcapsule.

23. The lithographic printing plate precursor according to claim 21, wherein the overcoat layer comprises a light-to-heat converting agent and an optical density of the overcoat layer at the exposure wavelength is lower than an optical density of the image-recording layer at the exposure wavelength.

* * * * *